United States Patent
Ohno et al.

(10) Patent No.: US 10,065,808 B2
(45) Date of Patent: Sep. 4, 2018

(54) SUPPORT SUPPLY APPARATUS AND METHOD FOR SUPPLYING SUPPORT

(71) Applicant: Semiconductor Energy Laboratory Co., Ltd., Atsugi-shi, Kanagawa-ken (JP)

(72) Inventors: Masakatsu Ohno, Utsunomiya (JP); Kohei Yokoyama, Fujisawa (JP); Satoru Idojiri, Tochigi (JP); Hisao Ikeda, Zama (JP); Yasuhiro Jinbo, Isehara (JP); Hiroki Adachi, Tochigi (JP); Yoshiharu Hirakata, Ebina (JP); Shingo Eguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/219,930

(22) Filed: Jul. 26, 2016

(65) Prior Publication Data

US 2016/0332826 A1    Nov. 17, 2016

Related U.S. Application Data

(63) Continuation of application No. 14/468,808, filed on Aug. 26, 2014, now Pat. No. 9,455,418.

(30) Foreign Application Priority Data

Aug. 30, 2013  (JP) .................................. 2013-179700
Feb. 19, 2014  (JP) .................................. 2014-029405

(51) Int. Cl.
*B32B 38/10*    (2006.01)
*B65G 49/06*    (2006.01)
(Continued)

(52) U.S. Cl.
CPC ............ *B65G 49/068* (2013.01); *B32B 17/06* (2013.01); *B32B 37/025* (2013.01);
(Continued)

(58) Field of Classification Search
CPC . B32B 38/10; B32B 43/006; Y10T 156/1121; Y10T 156/1137;
(Continued)

(56) References Cited

U.S. PATENT DOCUMENTS 3,695,756 A    10/1972  Smith
5,624,525 A     4/1997  Ehara et al.
(Continued)

FOREIGN PATENT DOCUMENTS

CN    001783432 A    6/2006
CN    101335293 A   12/2008
(Continued)

OTHER PUBLICATIONS

Chinese Office Action (Application No. 201410436403.0) dated Dec. 29, 2017.

*Primary Examiner* — Mark A Osele
*Assistant Examiner* — Nickolas Harm
(74) *Attorney, Agent, or Firm* — Robinson Intellectual Property Law Office; Eric J. Robinson

(57) ABSTRACT

An apparatus for supplying a support having a clean surface is provided. Alternatively, an apparatus for manufacturing a stack including a support and a remaining portion of a processed member whose one surface layer is separated is provided. A positioning portion, a slit formation portion, and a peeling portion are included. The positioning portion is provided with a first transfer mechanism of a stacked film including a support and a separator and a table for fixing the stacked film. The slit formation portion is provided with a cutter that can form a slit which does not pass through the (Continued)

separator. The peeling portion is provided with a second transfer mechanism and a peeling mechanism extending the separator and then peeling the separator. In addition, a pretreatment portion activating a support surface is included.

19 Claims, 38 Drawing Sheets

(51) Int. Cl.
| | |
|---|---|
| H01L 51/52 | (2006.01) |
| H01L 51/56 | (2006.01) |
| B32B 17/06 | (2006.01) |
| B32B 37/00 | (2006.01) |
| B32B 43/00 | (2006.01) |
| B65H 3/08 | (2006.01) |
| B65H 3/48 | (2006.01) |
| B65H 16/00 | (2006.01) |
| B65H 35/00 | (2006.01) |
| H01L 27/32 | (2006.01) |
| H01L 21/68 | (2006.01) |
| H01L 21/673 | (2006.01) |
| H01L 21/677 | (2006.01) |

(52) U.S. Cl.
CPC ......... *B32B 43/006* (2013.01); *B65H 3/0816* (2013.01); *B65H 3/48* (2013.01); *B65H 16/00* (2013.01); *B65H 35/0006* (2013.01); *H01L 27/3244* (2013.01); *H01L 51/5237* (2013.01); *H01L 51/56* (2013.01); *B32B 38/10* (2013.01); *B32B 2457/00* (2013.01); *B32B 2457/14* (2013.01); *B32B 2457/20* (2013.01); *B65G 49/069* (2013.01); *B65G 2249/04* (2013.01); *H01L 21/673* (2013.01); *H01L 21/67333* (2013.01); *H01L 21/67715* (2013.01); *H01L 21/68* (2013.01); *H01L 2221/68318* (2013.01); *H01L 2227/323* (2013.01); *Y10T 29/5317* (2015.01); *Y10T 29/53091* (2015.01); *Y10T 156/1121* (2015.01); *Y10T 156/1137* (2015.01); *Y10T 156/1158* (2015.01); *Y10T 156/1184* (2015.01); *Y10T 156/1917* (2015.01); *Y10T 156/1922* (2015.01); *Y10T 156/1939* (2015.01); *Y10T 156/1967* (2015.01)

(58) Field of Classification Search
CPC ......... Y10T 156/1158; Y10T 156/1184; Y10T 156/1917; Y10T 156/1922; Y10T 156/1939; Y10T 156/1967; H01L 21/673; H01L 21/67333; H01L 21/67715; H01L 21/68; H01L 2221/68318
USPC ....... 156/705, 708, 712, 717, 753, 754, 757, 156/762, 930, 931
See application file for complete search history.

(56) References Cited

U.S. PATENT DOCUMENTS

| | | | |
|---|---|---|---|
| 5,807,460 A | 9/1998 | Yamamoto | |
| 5,972,452 A | 10/1999 | Takahashi et al. | |
| 6,030,421 A | 2/2000 | Gauthier et al. | |
| 6,199,738 B1 | 3/2001 | Kondo et al. | |
| 6,332,264 B1 | 12/2001 | Itoh et al. | |
| 6,374,479 B1 | 4/2002 | Sasaki et al. | |
| 6,409,159 B1 | 6/2002 | Asai et al. | |
| 6,556,189 B1 | 4/2003 | Takahata et al. | |
| 6,757,964 B2 | 7/2004 | Sasaki et al. | |
| 6,976,302 B2 | 12/2005 | Itoh et al. | |
| 7,169,636 B2 | 1/2007 | Maruyama et al. | |
| 7,195,988 B2 | 3/2007 | Nemoto et al. | |
| 7,282,380 B2 | 10/2007 | Maruyama et al. | |
| 7,337,819 B2 | 3/2008 | Mizuta | |
| 7,404,919 B2 | 7/2008 | Yokoyama et al. | |
| 7,540,079 B2 | 6/2009 | Okuyama et al. | |
| 7,569,859 B2 | 8/2009 | Maruyama et al. | |
| 7,644,747 B2 | 1/2010 | Ohkawara et al. | |
| 7,674,650 B2 | 3/2010 | Akimoto et al. | |
| 7,709,932 B2 | 5/2010 | Nemoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,040,456 B2 | 10/2011 | Yamazaki et al. | |
| 8,044,411 B2 | 10/2011 | Maruyama et al. | |
| 8,048,690 B2 | 11/2011 | Terada et al. | |
| 8,218,105 B2 | 7/2012 | Yamazaki et al. | |
| 8,237,176 B2 | 8/2012 | Maruyama et al. | |
| 8,274,077 B2 | 9/2012 | Akimoto et al. | |
| 8,466,463 B2 | 6/2013 | Akimoto et al. | |
| 8,482,011 B2 | 7/2013 | Maruyama et al. | |
| 8,561,978 B2 | 10/2013 | Takahashi et al. | |
| 8,629,069 B2 | 1/2014 | Akimoto et al. | |
| 8,634,041 B2 | 1/2014 | Yamazaki et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,975,160 B2 | 3/2015 | Takano | |
| 9,099,562 B2 | 8/2015 | Akimoto et al. | |
| 9,156,206 B2 | 10/2015 | Masuda | |
| 9,214,640 B2 | 12/2015 | Lee et al. | |
| 2002/0007553 A1 | 1/2002 | Itoh et al. | |
| 2002/0053137 A1 | 5/2002 | Sasaki et al. | |
| 2005/0023647 A1 | 2/2005 | Nemoto et al. | |
| 2005/0173072 A1 | 8/2005 | Mizuta | |
| 2005/0214984 A1 | 9/2005 | Maruyama et al. | |
| 2005/0253290 A1 | 11/2005 | Yokoyama et al. | |
| 2006/0038260 A1 | 2/2006 | Nemoto et al. | |
| 2006/0131260 A1 | 6/2006 | Okuyama et al. | |
| 2007/0292997 A1 | 12/2007 | Maruyama et al. | |
| 2008/0146017 A1 | 6/2008 | Kato | |
| 2008/0246190 A1 | 10/2008 | Yokoyama et al. | |
| 2008/0259575 A1 | 10/2008 | Tanimura et al. | |
| 2008/0308805 A1 | 12/2008 | Akimoto et al. | |
| 2010/0096633 A1 | 4/2010 | Hatano et al. | |
| 2010/0197054 A1 | 8/2010 | Yonehara | |
| 2011/0065217 A1 | 3/2011 | Terada et al. | |
| 2011/0104851 A1 | 5/2011 | Akimoto et al. | |
| 2011/1012129 | 5/2011 | Akimotok et al. | |
| 2012/0034407 A1 | 2/2012 | Yamanaka et al. | |
| 2012/0217516 A1 | 8/2012 | Hatano et al. | |
| 2014/0183473 A1 | 7/2014 | Lee et al. | |
| 2014/0287567 A1 | 8/2014 | Yasumotos et al. | |
| 2015/0020979 A1 | 1/2015 | Maeda | |
| 2015/0059986 A1 | 3/2015 | Komatsu et al. | |
| 2015/0059987 A1 | 3/2015 | Kumakura et al. | |
| 2015/0068683 A1 | 3/2015 | Ohno et al. | |
| 2015/0151531 A1 | 6/2015 | Ohno et al. | |
| 2015/0195922 A1 | 7/2015 | Yasuda | |
| 2015/0268357 A1 | 9/2015 | Nitta et al. | |
| 2015/0340513 A1 | 11/2015 | Akimoto et al. | |
| 2015/0367622 A1 | 12/2015 | Adachi et al. | |
| 2016/0093683 A1 | 3/2016 | Lee et al. | |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| JP | 10-059565 A | 3/1998 |
| JP | 10-250929 A | 9/1998 |
| JP | 2001-089019 A | 4/2001 |
| JP | 2002-362779 A | 12/2002 |
| JP | 2009-259690 A | 11/2009 |
| JP | 2010-137992 A | 6/2010 |
| JP | 2012-190794 A | 10/2012 |
| WO | WO-2012/164612 | 12/2012 |

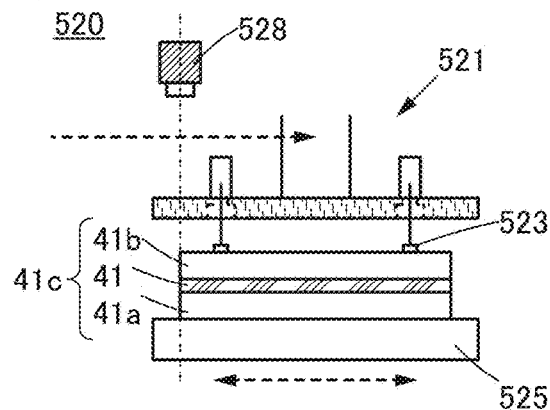
FIG. 2A1
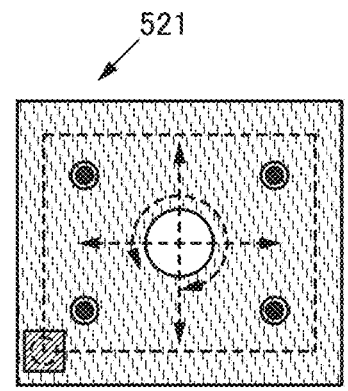
FIG. 2A2
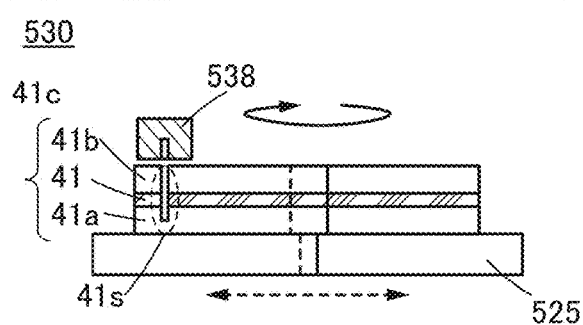
FIG. 2B1
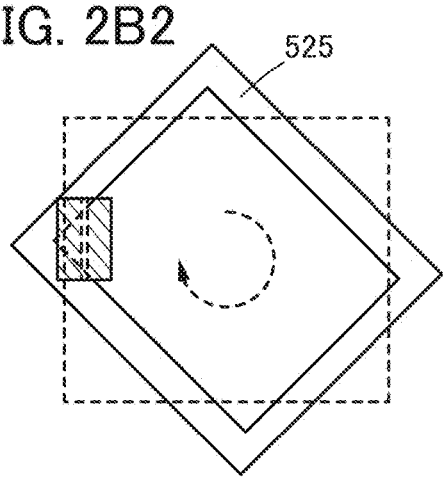
FIG. 2B2
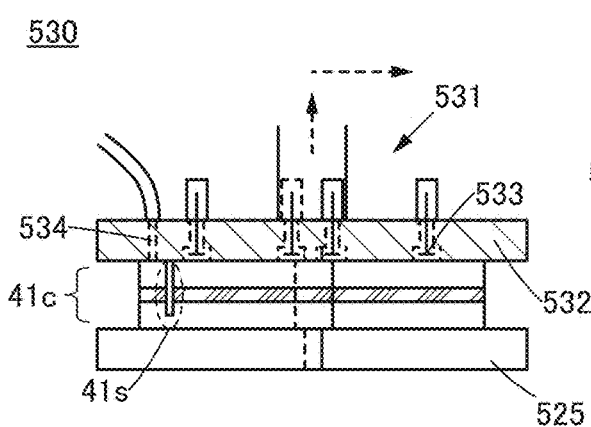
FIG. 2C1
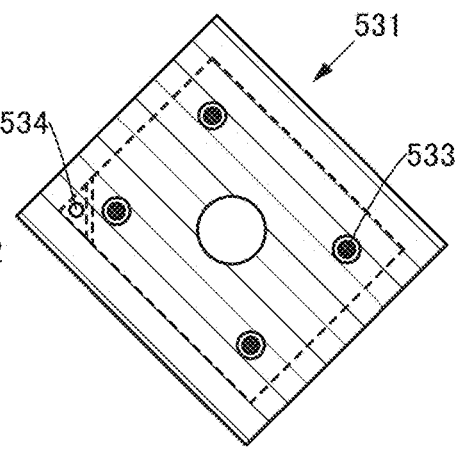
FIG. 2C2

FIG. 4A1 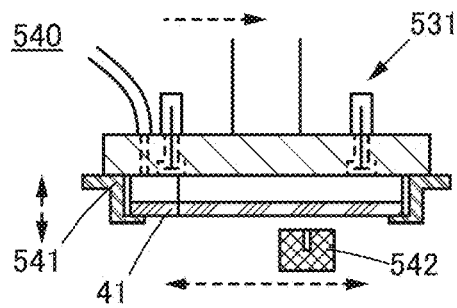
FIG. 4A2 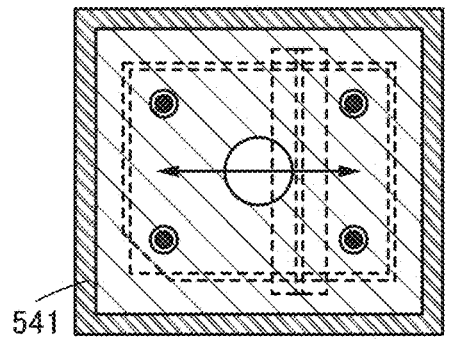
FIG. 4B1 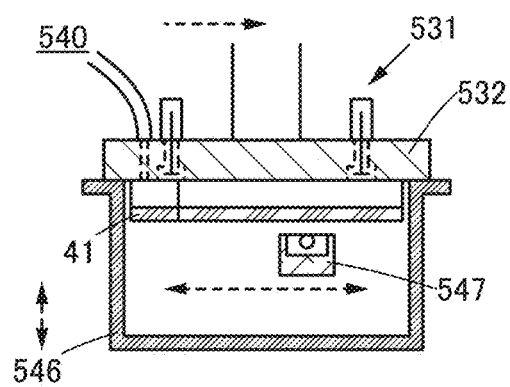
FIG. 4B2 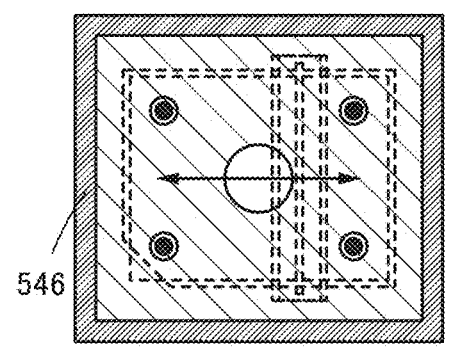
FIG. 4C1 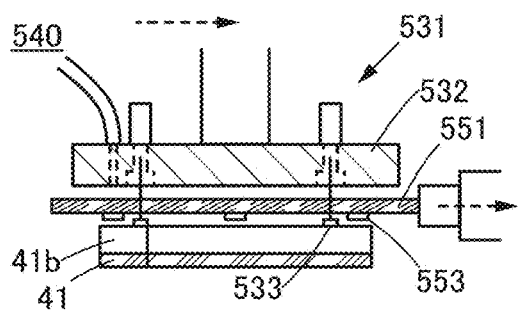
FIG. 4C2 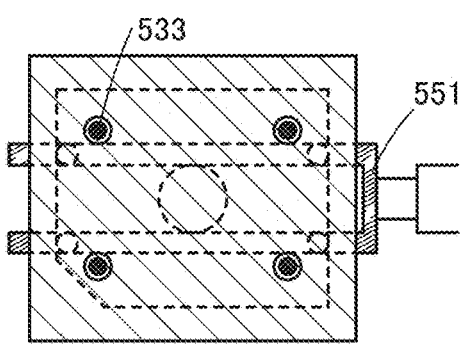
FIG. 4D1 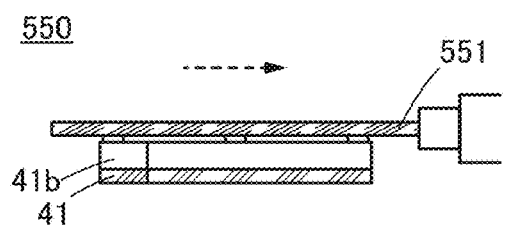
FIG. 4D2 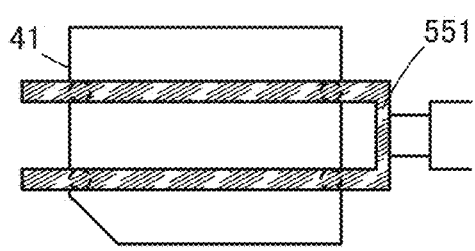

510

510

FIG. 7A1 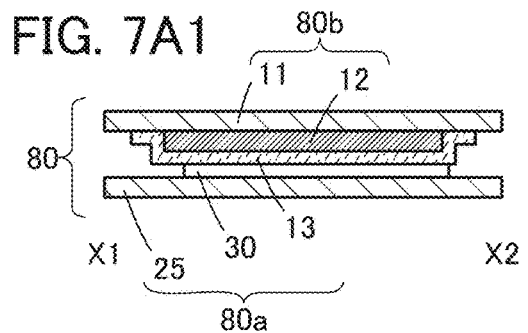
FIG. 7A2 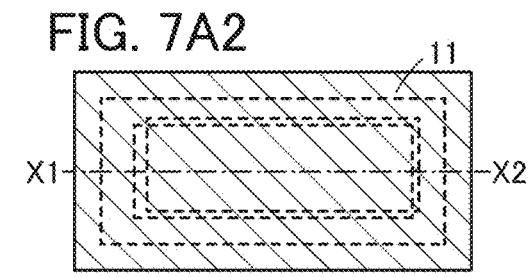
FIG. 7B1 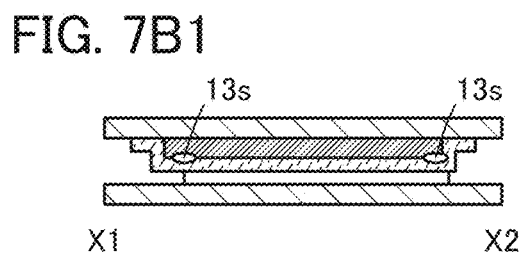
FIG. 7B2 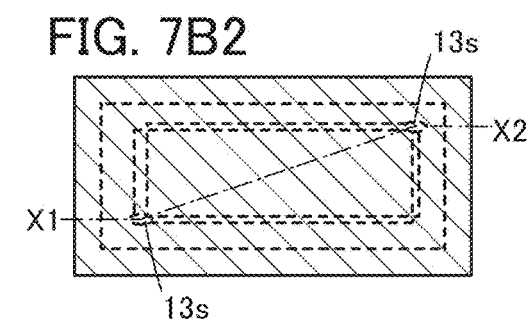

FIG. 7D1 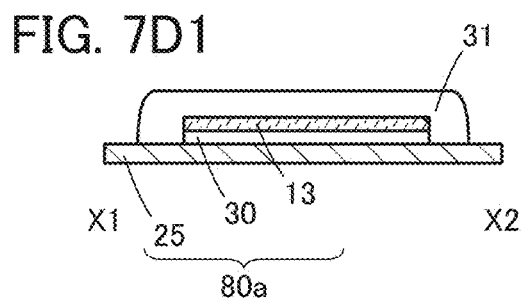
FIG. 7D2 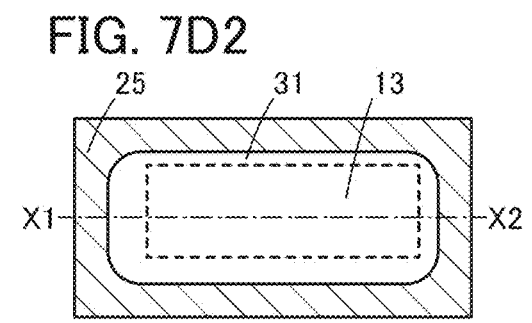
FIG. 7E1 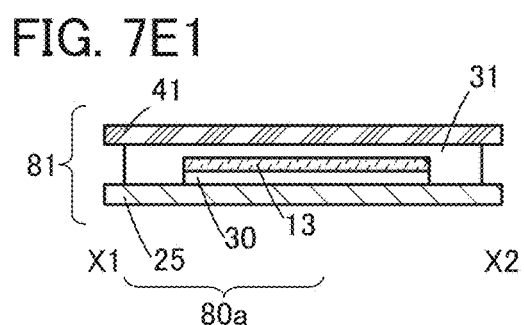
FIG. 7E2 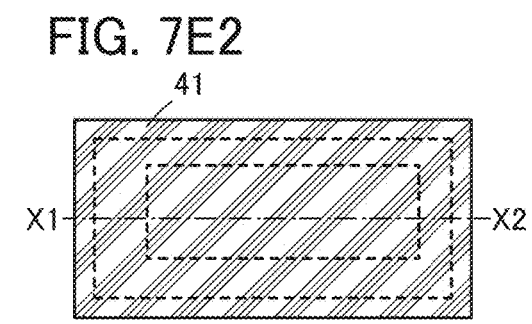

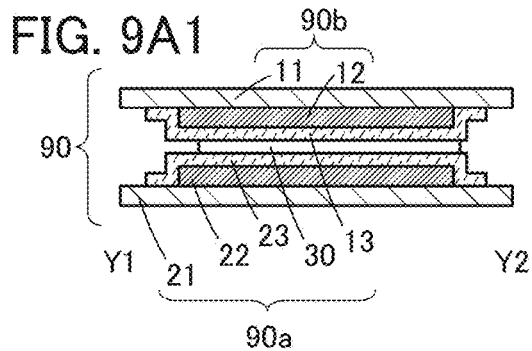
FIG. 9A1
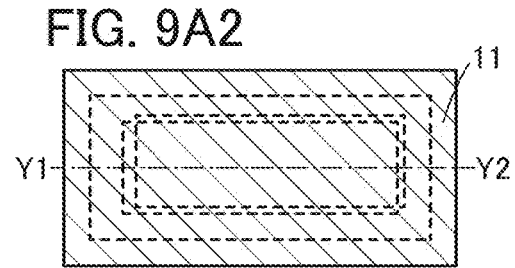
FIG. 9A2
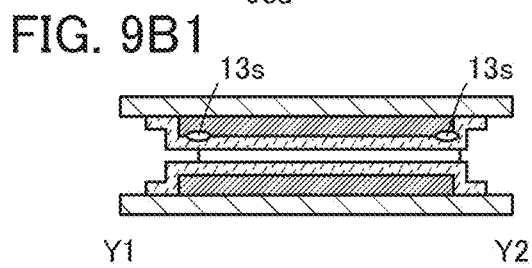
FIG. 9B1
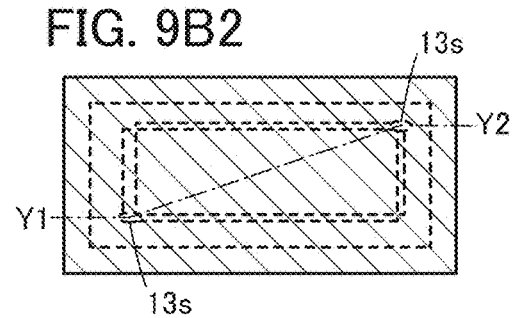
FIG. 9B2
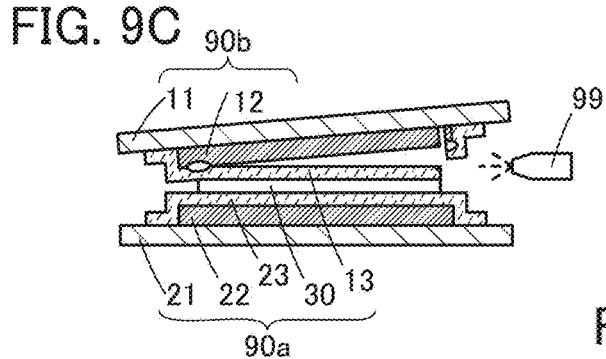
FIG. 9C
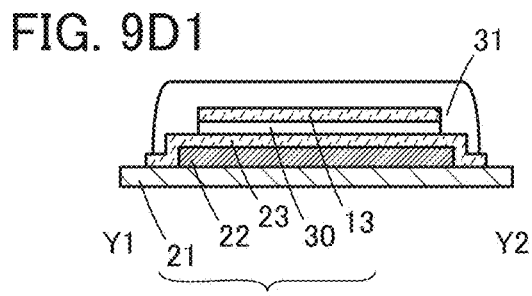
FIG. 9D1
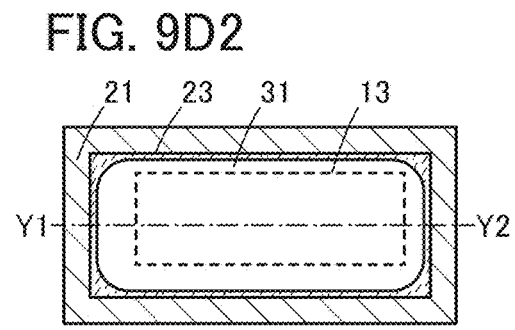
FIG. 9D2
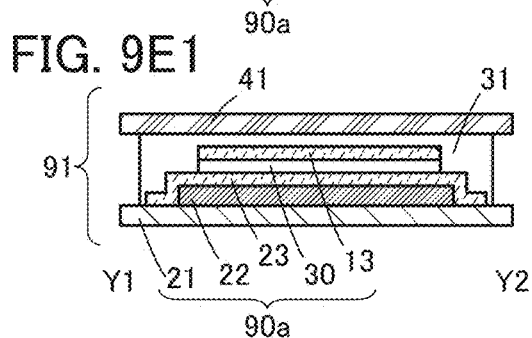
FIG. 9E1
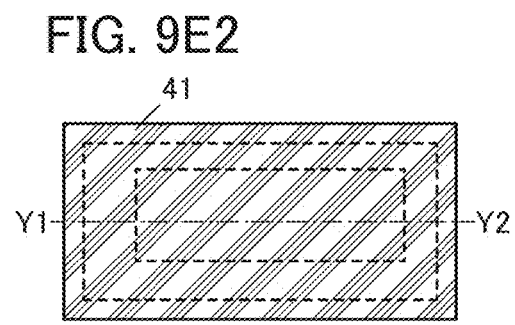
FIG. 9E2

FIG. 10A1
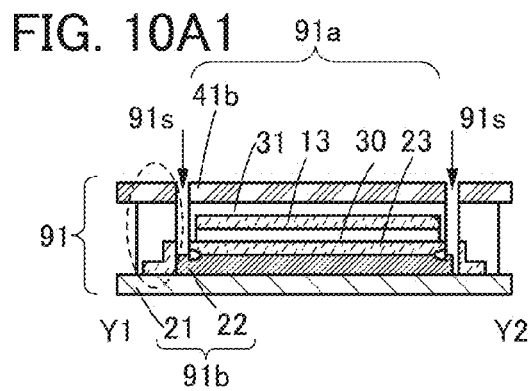
FIG. 10A2
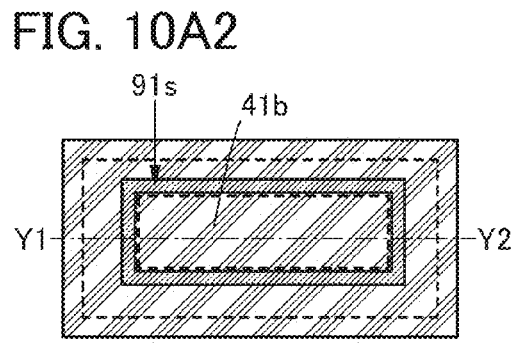
FIG. 10B
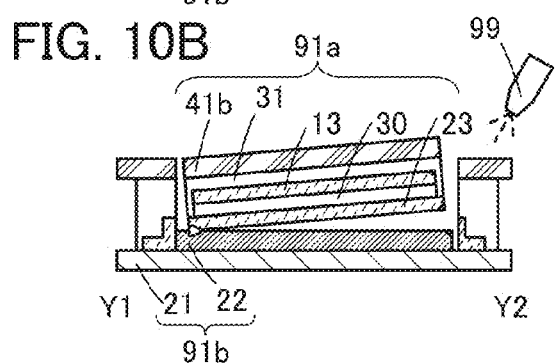
FIG. 10C
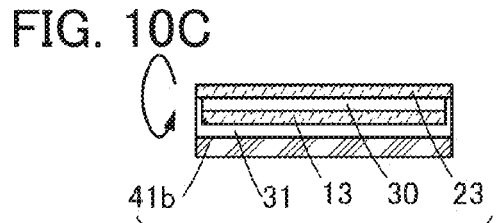
FIG. 10D1
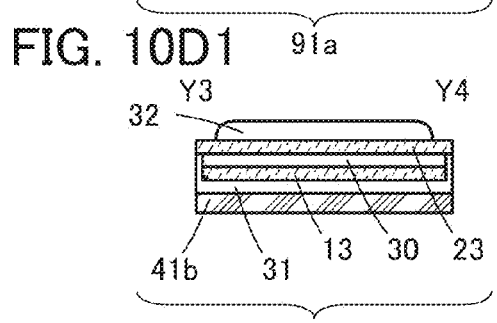
FIG. 10D2
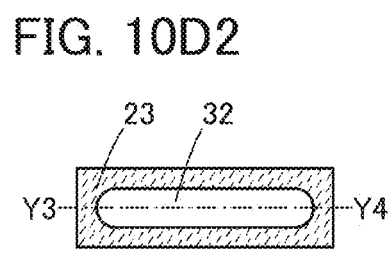
FIG. 10E1
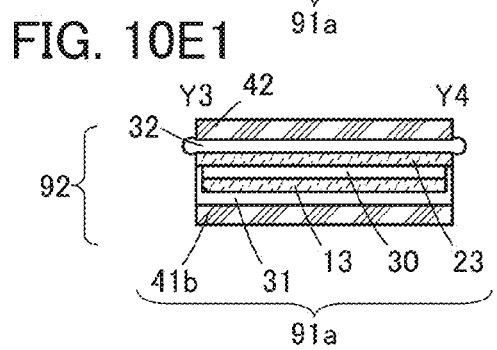
FIG. 10E2
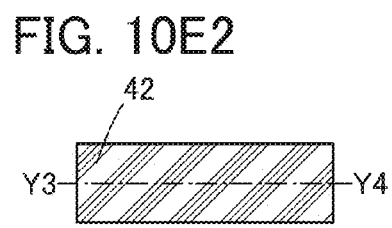

FIG. 12A1
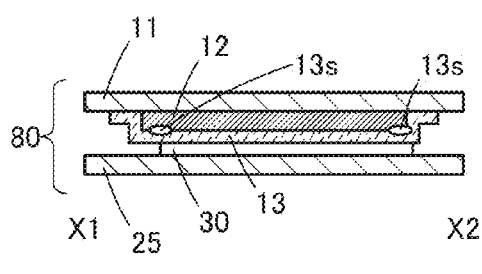
FIG. 12A2
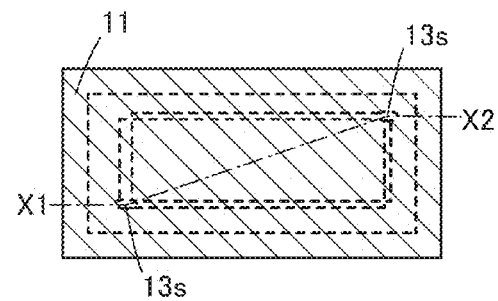
FIG. 12B1
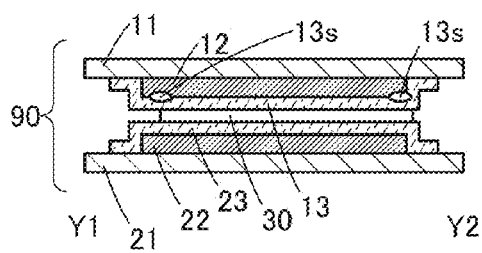
FIG. 12B2
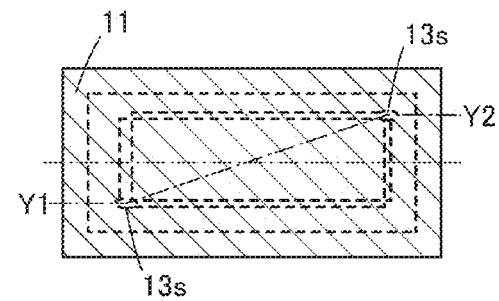

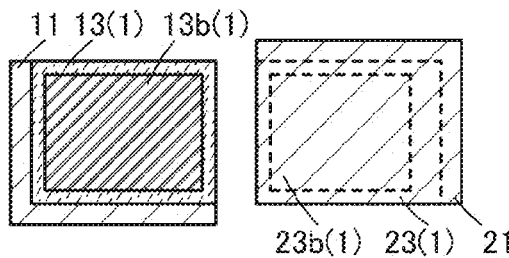
FIG. 33A1
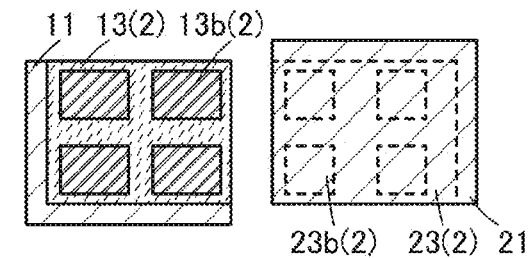
FIG. 33A2
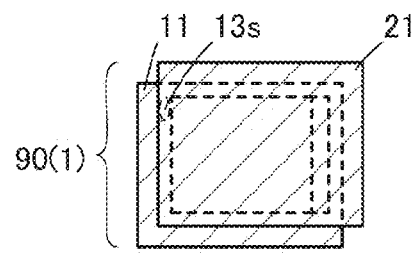
FIG. 33B1
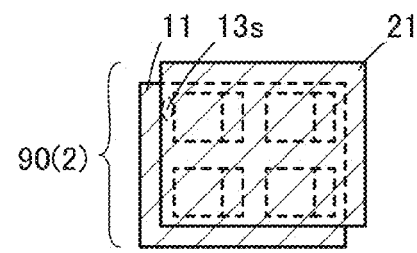
FIG. 33B2
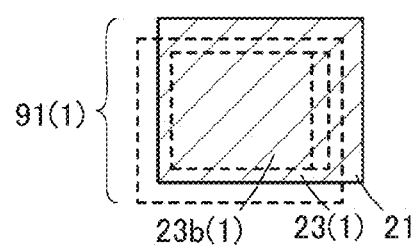
FIG. 33C1
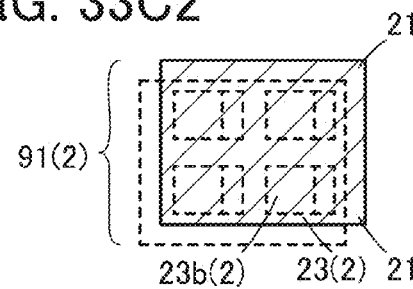
FIG. 33C2
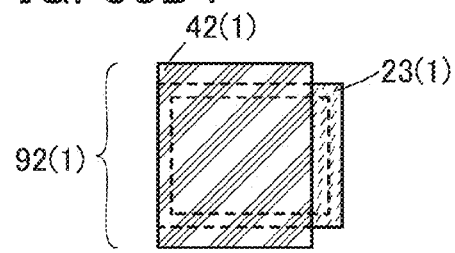
FIG. 33D1
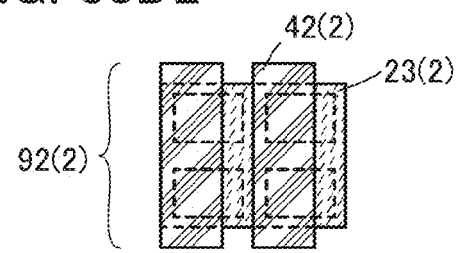
FIG. 33D2

FIG. 34A1
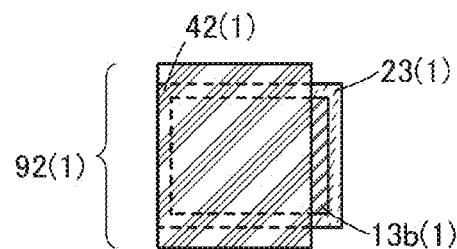
FIG. 34A2
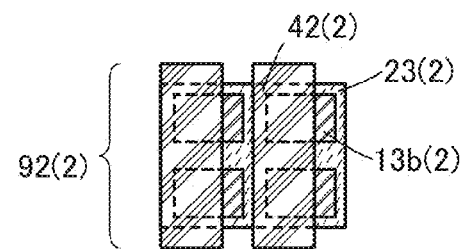
FIG. 34B1
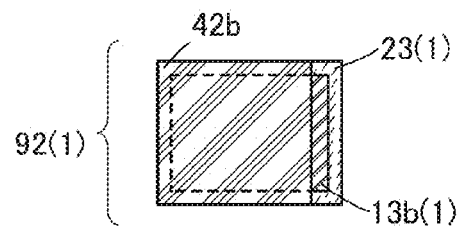
FIG. 34B2
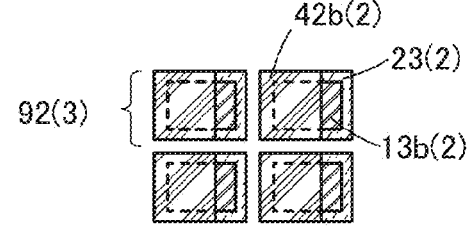

FIG. 35A1
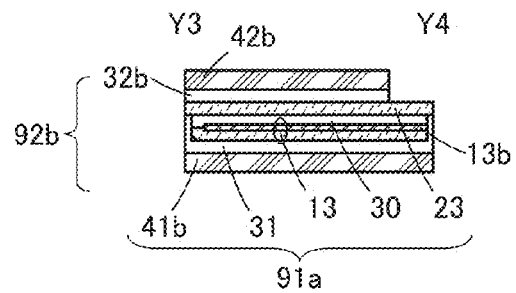
FIG. 35A2
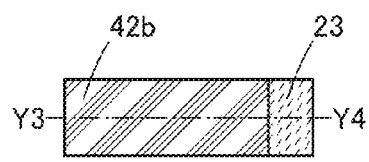
FIG. 35B1
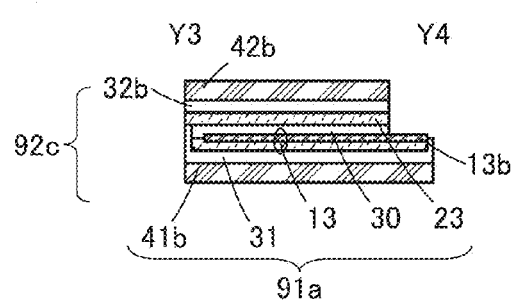
FIG. 35B2
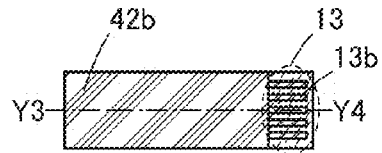
FIG. 35C1
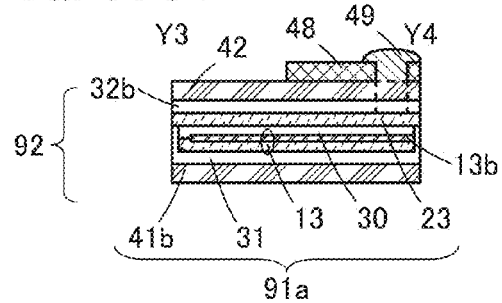
FIG. 35C2
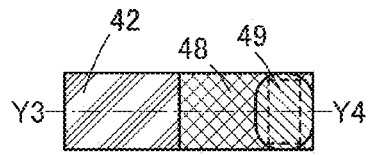
FIG. 35D1
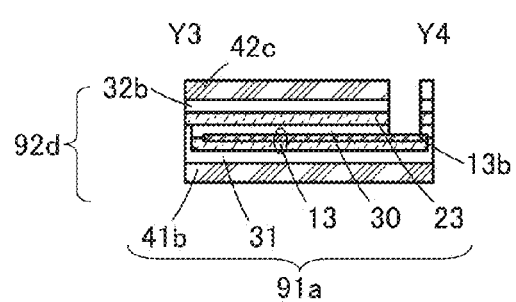
FIG. 35D2

SUPPORT SUPPLY APPARATUS AND METHOD FOR SUPPLYING SUPPORT

This application is a continuation of U.S. Ser. No. 14/468,808, filed Aug. 26, 2014, now U.S. Pat. No. 9,455,418, issued Sep. 27, 2016, all of which is incorporated by reference.

BACKGROUND OF THE INVENTION

1. Field of the Invention

The present invention relates to an object, a method, or a manufacturing method. In addition, the present invention relates to a process, a machine, manufacture, or a composition of matter. Specifically, the present invention relates to, for example, a semiconductor device, a display device, a light-emitting device, a power storage device, a driving method thereof, or a manufacturing method thereof. More specifically, one embodiment of the present invention relates to a support supply apparatus or a stack manufacturing apparatus.

2. Description of the Related Art

The social infrastructures relating to means for transmitting information have advanced. This has made it possible to acquire, process, and send out many pieces and various kinds of information with the use of an information processor not only at home or office but also at other visiting places.

With this being the situation, portable information processors are under active development.

For example, portable information processors are often used outdoors, and force might be accidentally applied by dropping to the information processors and display devices included in them. As an example of a display device that is not easily broken, a display device having high adhesiveness between a structure body by which a light-emitting layer is divided and a second electrode layer is known (Patent Document 1).

REFERENCE

Patent Document

[Patent Document 1] Japanese Published Patent Application No. 2012-190794

SUMMARY OF THE INVENTION

An object of one embodiment of the present invention is to provide an apparatus for supplying a support having a clean surface. Another object is to provide an apparatus for manufacturing a stack including a support and a remaining portion of a processed member whose one surface layer is separated. Another object is to provide a novel manufacturing apparatus. Another object is to provide an apparatus fabricated using the novel manufacturing apparatus.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a support supply apparatus including a positioning portion provided with a first transfer mechanism that can supply a sheet-like stacked film and a table for fixing the stacked film, a slit formation portion provided with a cutter that can form a slit which does not pass through the separator in the vicinity of an end portion of the stacked film, and a peeling portion provided with a second transfer mechanism for transferring the stacked film while supporting one surface of the stacked film and a peeling mechanism that holds and extends the separator overlapping with the end portion and then peels the separator. The sheet-like stacked film includes a support and a separator in contact with one surface of the support.

Another embodiment of the present invention is the above support supply apparatus including a pretreatment portion provided with a first pretreatment mechanism which irradiates one surface of the support with ultrasonic waves and suctions the atmosphere while blowing compressed air and/or a second pretreatment mechanism which irradiates one surface of the support with ultraviolet rays.

The above support supply apparatus of the embodiment of the present invention includes the positioning portion, the slit formation portion, and the peeling portion. The positioning portion is provided with the first transfer mechanism for supplying the stacked film and the table for fixing the stacked film. The stacked film includes the support and the separator. The slit formation portion is provided with the cutter for forming the slit which does not pass through the separator. The peeling portion is provided with the second transfer mechanism and the peeling mechanism extending and then peeling the separator. In addition, the pretreatment portion that activates a surface of the support is included. In this manner, the separator is peeled from the stacked film including the support and the separator; thus, the support can be used in the state where the surface of the support is clean. Moreover, the support can be supplied in the state where the surface is activated. As a result, it is possible to provide a support supply apparatus that can supply a support which is clean and has a high adhesive property.

Another embodiment of the present invention is the above support supply apparatus including a sheet supply portion provided with a tray in which a plurality of sheet-like stacked films is stored, a multi-feed prevention mechanism which blows a gas to the end portion of the stacked film picked up by a first transfer mechanism from the tray, and a multi-feed detection mechanism which detects whether the stacked film picked up by the first transfer mechanism is one.

The above support supply apparatus of the embodiment of the present invention includes the sheet supply portion provided with the multi-feed prevention mechanism which prevents multi feed by handling the plurality of stacked films picked up by the first transfer mechanism and the multi-feed detection mechanism which detects multi-feed stacked films. Thus, the first transfer mechanism can supply one sheet-like stacked film with high reproducibility. As a result, the suspension time due to the multi-feed can be shortened and a support supply unit with high productivity can be provided.

Another embodiment of the present invention is the above support supply apparatus including a sheet supply portion provided with an unwinding mechanism which unwinds a stacked film in a rolled state and supplies the stacked film, a cutting mechanism which cuts the stacked film into the sheet-like stacked film with a predetermined size, and the tray in which the sheet-like stacked films are stored.

The above support supply apparatus of the embodiment of the present invention unwinds a stacked film, cuts this film into the sheet with a predetermined size, and is provided with the tray in which the sheet-like stacked films are stored. Thus, the sheet-like stacked films with a predetermined size can be manufactured from the rolled stacked film, and stored in the tray. As a result, a support supply apparatus which can supply a support with a needed size can be provided.

Another embodiment of the present invention is a stack manufacturing apparatus including a first loader unit supplying a processed member; a first separation unit separating one surface layer of the processed member to form a first remaining portion; a first bonding unit supplied with a first support and bonding the first support to the first remaining portion with a first adhesive layer; a support supply unit supplying the first support; and a first unloader unit transporting a first stack including the first remaining portion, the first adhesive layer, and the first support bonded to the first remaining portion with the first adhesive layer.

The support supply unit includes a positioning portion provided with a first transfer mechanism for supplying a sheet-like stacked film and a table for fixing the supplied stacked film, a slit formation portion provided with a cutter that can form a slit which does not pass through the separator in the vicinity of an end portion of the stacked film, and a peeling portion provided with a second transfer mechanism for transferring the stacked film while supporting one surface of the stacked film and a peeling mechanism that holds and extends the separator overlapping with the end portion and then peels the separator. The sheet-like stacked film includes a support and a separator in contact with one surface of the support.

The above stack manufacturing apparatus of one embodiment of the present invention includes the loader unit supplying the processed member; the first separation unit separating the first remaining portion; the first bonding unit bonding the first support to the first remaining portion; the support supply unit supplying the first support; and the first unloader unit transporting a first stack including the first remaining portion, the first adhesive layer, and the first support bonded to the first remaining portion with the first adhesive layer. Thus, one surface layer of the processed member is separated to form the first remaining portion, and the first support can be bonded to the first remaining portion. As a result, a manufacturing apparatus of a stack including a remaining portion of a processed member whose one surface layer is separated and a support.

Another embodiment of the present invention is a stack manufacturing apparatus including a first loader unit supplying a processed member; a first separation unit separating one surface layer of the processed member to form a first remaining portion; a first bonding unit supplied with a first support and bonding the first support to the first remaining portion with a first adhesive layer; a support supply unit supplying the first support and a second support; a first unloader unit transporting a first stack including the first remaining portion, the first adhesive layer, and the first support bonded to the first remaining portion with the first adhesive layer; a second loader unit supplying the first stack; a trigger formation unit forming a separation trigger in the vicinity of an end portion of the first remaining portion and an end portion of the first support; a second separation unit separating one surface layer of the first stack to form a second remaining portion; a second bonding unit supplied with the second support and bonding the second support to the second remaining portion with a second adhesive layer; and a second unloader unit transporting a second stack including the second remaining portion, the second adhesive layer, and the second support bonded to the second remaining portion with the second adhesive layer.

The support supply unit includes a positioning portion provided with a first transfer mechanism for supplying a sheet-like stacked film and a table for fixing the supplied stacked film, a slit formation portion provided with a cutter that can form a slit which does not pass through the separator in the vicinity of an end portion of the stacked film, and a peeling portion provided with a second transfer mechanism for transferring the stacked film while supporting one surface of the stacked film and a peeling mechanism that holds and extends the separator overlapping with the end portion and then peels the separator. The sheet-like stacked film includes a support and a separator in contact with one surface of the support.

The above stack manufacturing apparatus of one embodiment of the present invention includes the loader unit supplying the processed member, the first separation unit separating the first remaining portion, the first bonding unit bonding the first support to the first remaining portion, the support supply unit supplying the first support and the second support, the first unloader unit transporting a first stack including the first remaining portion, the first adhesive layer, and the first support bonded to the first remaining portion with the first adhesive layer, the stack loader unit, the trigger formation unit forming the separation trigger, the second separation unit separating the second remaining portion, the second bonding unit bonding the second support to the second remaining portion, and the second unloader unit transporting a second stack including the second remaining portion, the second adhesive layer, and the second support bonded to the second remaining portion with the second adhesive layer. Thus, both of the surface layers of the processed member are separated to form the second remaining portion, and the first support and the second support can be bonded to the second remaining portion. As a result, a manufacturing apparatus of a stack including a remaining portion of a processed member whose one surface layer is separated and a support.

According to one embodiment of the present invention, an apparatus for supplying a support having a clean surface can be provided. Moreover, an apparatus for manufacturing a stack including a support and a remaining portion of a processed member can be provided.

BRIEF DESCRIPTION OF THE DRAWINGS

In the accompanying drawings:

FIGS. 2A1, 2A2, 2B1, 2B2, 2C1, and 2C2 illustrate structures and operations of a positioning portion and a slit formation portion of a support supply apparatus;

FIGS. 4A1, 4A2, 4B1, 4B2, 4C1, 4C2, 4D1, and 4D2 illustrate structures and operations of a pretreatment portion of a support supply apparatus;

FIGS. 7A1, 7A2, 7B1, 7B2, 7C, 7D1, 7D2, 7E1, and 7E2 are schematic views illustrating a manufacturing process of a stack of one embodiment;

FIGS. 9A1, 9A2, 9B1, 9B2, 9C, 9D1, 9D2, 9E1, and 9E2 are schematic views illustrating a manufacturing process of a stack of one embodiment;

FIGS. 10A1, 10A2, 10B, 10C, 10D1, 10D2, 10E1, and 10E2 are schematic views illustrating a manufacturing process of a stack of one embodiment;

FIGS. 12A1, 12A2, 12B1, and 12B2 are schematic views each illustrating a structure of a processed member of one embodiment;

FIGS. 33A1, 33A2, 33B1, 33B2, 33C1, 33C2, 33D1, and 33D2 illustrate manufacturing methods of a stack using a processed member of one embodiment;

FIGS. 34A1, 34A2, 34B1, and 34B2 illustrate manufacturing methods of a stack using a processed member of one embodiment;

FIGS. 35A1, 35A2, 35B1, 35B2, 35C1, 35C2, 35D1, and 35D2 are schematic views illustrating a manufacturing method of a stack including an opening, according to one embodiment;

DETAILED DESCRIPTION OF THE INVENTION

Figure 1:
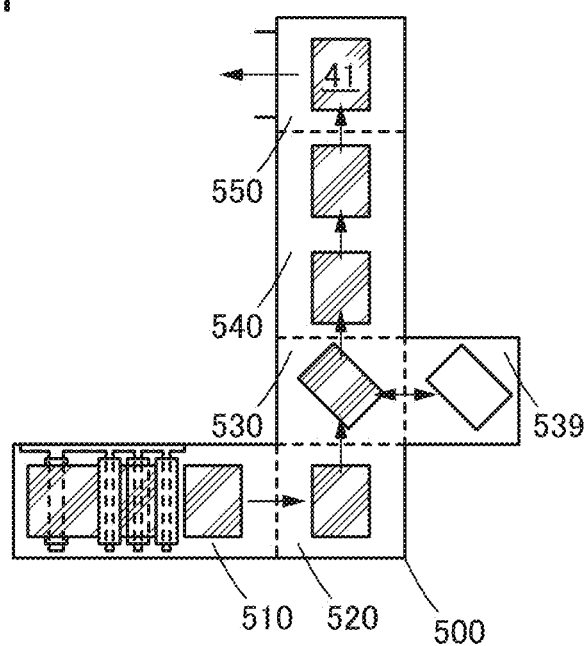
FIG. 1 is a schematic view illustrating a structure of a support supply apparatus.

The support supply apparatus of one embodiment of the present invention includes a positioning portion, a slit formation portion, and a peeling portion. The positioning portion is provided with a first transfer mechanism for supplying a stacked film including a support and a separator and a table for fixing the stacked film. The slit formation portion is provided with a cutter for forming a slit which does not pass through the separator. The peeling portion is provided with a second transfer mechanism and a peeling mechanism for extending and peeling the separator. In addition, a pretreatment portion that activates a surface of the support is included.

With this structure, the separator is peeled from the stacked film of the support and the separator; thus, the support can be used with its surface clean. Moreover, the support can be supplied with its surface activated. As a result, a support supply apparatus that can supply a support which is clean and has a high adhesive property can be provided.

A stack manufacturing apparatus of one embodiment of the present invention includes the loader unit supplying the processed member; the first separation unit separating the first remaining portion; the first bonding unit bonding the first support to the first remaining portion; the support supply unit supplying the first support; and the first unloader unit transporting a first stack including the first remaining portion, the first adhesive layer, and the first support bonded to the first remaining portion with the first adhesive layer.

Thus, one surface layer of the processed member is separated to form the first remaining portion, and the first support can be bonded to the first remaining portion. As a result, a manufacturing apparatus of a stack including a remaining portion of a processed member whose one surface layer is separated and a support. In this specification, a surface layer refers to a layer on a surface of a processed member or a stack. The surface layer is not limited to being formed using a single layer, but is formed using a plurality of layers. Furthermore, a remaining portion refers to a portion of the processed member or the stack except one surface layer.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

(Embodiment 1)

In this embodiment, a structure of a support supply apparatus of one embodiment of the present invention is described with reference to FIG. 1, FIGS. 2A1, 2A2, 2B1, 2B2, 2C1, and 2C2, FIGS. 3A to 3D, FIGS. 4A1, 4A2, 4B1, 4B2, 4C1, 4C2, 4D1, and 4D2, and FIGS. 5A and 5B.

FIG. 1 is a schematic view illustrating a structure of a support supply apparatus 500 of one embodiment of the present invention.

FIGS. 2A1, 2A2, 2B1, 2B2, 2C1, and 2C2 illustrate structures and operations of a positioning portion 520 and a slit formation portion 530 of the support supply apparatus 500 of one embodiment of the present invention.

FIGS. 3A to 3D illustrate an operation of a peeling portion 539 of the support supply apparatus 500 of one embodiment of the present invention.

FIGS. 4A1, 4A2, 4B1, 4B2, 4C1, 4C2, 4D1, and 4D2 illustrate a structure and operation of a pretreatment portion 540 of the support supply apparatus 500 of one embodiment of the present invention.

Figure 5A:
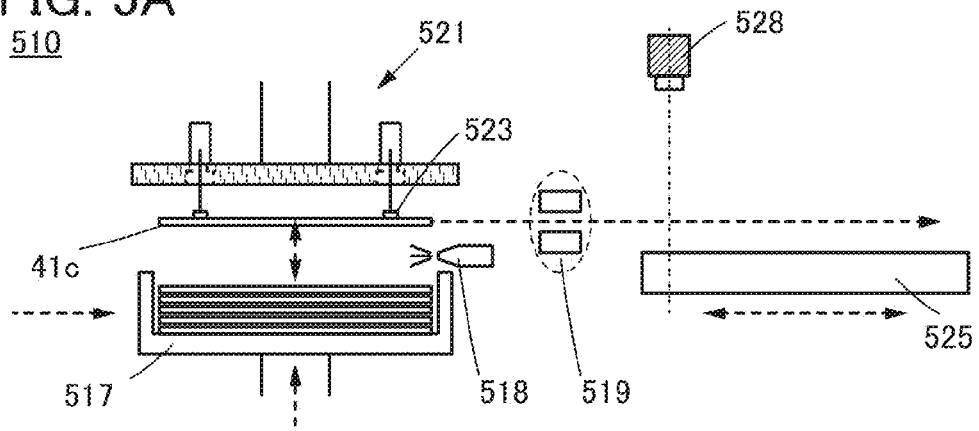
FIGS. 5A and 5B illustrate structures and operations of a sheet supply portion that can be used in the support supply apparatus.
Figure 5B:
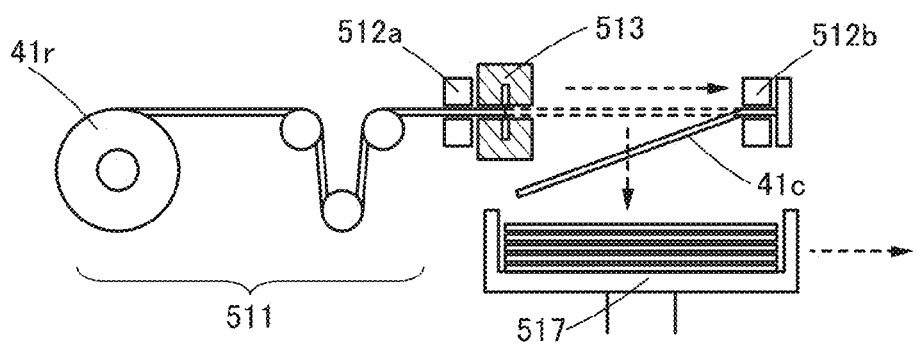

FIGS. 5A and 5B illustrate a structure and operation of a sheet supply portion 510 that can be used in the support supply apparatus 500 of one embodiment of the present invention.

The support supply apparatus 500 described in this embodiment includes the positioning portion 520 provided with a first transfer mechanism 521 for supplying a sheet-like stacked film 41c including a support 41 and a separator 41a in contact with one surface of the support 41 and a table 525 for fixing the stacked film 41c (see FIG. 1, FIG. 2A1, and FIG. 2A2). Note that the first transfer mechanism 521 can supply one sheet-like stacked film 41c at a time.

In addition, the support supply apparatus 500 includes the slit formation portion 530 provided with a cutter 538 that can form a slit 41s in the vicinity of an end portion of the stacked film 41c. The slit 41s does not pass through the separator 41a (see FIG. 1, FIG. 2B1, and FIG. 2B2).

Moreover, the support supply apparatus 500 includes the peeling portion 539 provided with a second transfer mechanism 531 for transferring the stacked film 41c by supporting the surface which is not in contact with the separator 41a and a peeling mechanism 535. The peeling mechanism 535 is attached to the end portion of the separator 41a overlapping with the slit 41s and extends the separator 41a, so that the separator 41a is peeled (see FIG. 1 and FIGS. 3A to 3D). The peeling mechanism 535 moves relative to the second transfer mechanism 531; thus, the separator 41a can be extended and then peeled. Furthermore, the peeling portion 539 can be stored with the peeled separator 41a.

In addition, the support supply apparatus 500 includes the pretreatment portion 540 provided with a first pretreatment mechanism 542 which irradiates one surface of the support 41 with ultrasonic waves and suctions the atmosphere while blowing compressed air and/or a second pretreatment mechanism 547 which irradiates one surface of the support 41 with ultraviolet rays (see FIG. 1 and FIGS. 4A1, 4A2, 4B1, and 4B2).

The support supply apparatus 500 described in this embodiment includes the positioning portion 520, the slit formation portion 530, and the peeling portion 539. The positioning portion 520 is provided with the first transfer mechanism 521 for supplying the stacked film 41c including the support 41 and the separator 41a and the table 525 for fixing the stacked film 41c. The slit formation portion 530 is provided with the cutter 538 for forming the slit 41s which does not pass through the separator 41a. The peeling portion 539 is provided with the second transfer mechanism 531 and the peeling mechanism 535 for extending and peeling the separator 41a. In addition, the pretreatment portion 540 that activates a surface of the support 41 is included. With this structure, the separator is peeled from the stacked film of the support and the separator; thus, the support 41 can be used with its surface clean. Moreover, the support 41 can be supplied with its surface activated. As a result, a support supply apparatus that can supply a support which is clean and has a high adhesive property can be provided.

In addition, the support supply apparatus 500 described in this embodiment includes a camera 528 for positioning, a vent 534, a support attachment 541, a treatment tank 546, and a delivery robot 551, and the like (see FIGS. 2A1 and 2A2 and FIGS. 4A1, 4B1, and 4C1).

The camera 528 for positioning is provided in the positioning portion 520 and is used for determining whether the end portion of the sheet-like stacked film 41c is positioned at a predetermined position of the table 525.

The vent 534 is provided in a suction table 532 of the second transfer mechanism 531. By spouting gas, the vent 534 can separate the end portion of the stacked film 41c in which the slit 41s is formed from the suction table 532 (see FIGS. 3A to 3D).

The support attachment 541 is provided in the pretreatment portion 540 and presses the end portion of the support 41 against the suction table 532 to prevent the end portion of the support 41 from separating from the second transfer mechanism 531 by the first pretreatment mechanism 542 that irradiates the support 41 with ultrasonic waves and suctions the atmosphere while blowing compressed air.

The treatment tank 546 is provided in the pretreatment portion 540 and has an opening in an upper portion that the second transfer mechanism 531 can cover. By stopping up the opening, leakage of ultraviolet rays emitted by the second pretreatment mechanism 547 can be prevented.

Elements included in the support supply apparatus of one embodiment of the present invention will be described below.

<Sheet Supply Portion>

The sheet supply portion 510 is stored with the sheet-like stacked films 41c. For example, a tray with a predetermined size and having an opening in an upper portion, which can be stored with the sheet-like stacked films to be aligned, can be used as the sheet supply portion 510.

The sheet-like stacked film 41c includes the support 41 and the separator 41a in contact with one surface of the support 41. Furthermore, a support 41b may be provided on the other surface of the support 41 (see FIG. 2A1). The separator 41a and the support 41b can protect the surfaces of the support 41 against damage and attachment of dirt.

A flexible resin film or the like can be used as the support 41. As the separator 41a and the support 41b, a resin film or the like whose surface is subjected to releasing treatment can be used. As a resin, for example, it is possible to use a material containing polyester, polyolefin, polyamide, polyimide, aramid, polycarbonate, acrylic, or a composite of a plurality of resins selected from these, or a stack including a plurality of materials selected from these.

<First Transfer Mechanism>

The first transfer mechanism 521 can move between the sheet supply portion 510 and the positioning portion 520 (see FIG. 1 and FIGS. 2A1 and 2A2). The first transfer mechanism 521 transfers the sheet-like stacked film 41c to the table 525 in the positioning portion 520.

The first transfer mechanism 521 has a suction pad 523, which can advance and retreat.

With the use of the advancing suction pad 523, the first transfer mechanism 521 suctions the surface of the sheet-like stacked film 41c that is not in contact with the separator 41a, and the suction pad 523 retreats to pick up the sheet-like stacked film 41c from the sheet supply portion 510.

Then, the first transfer mechanism 521 places the sheet-like stacked film 41c at the predetermined position of the table 525 (see FIGS. 2A1 and 2A2).

<Table>

The table 525 can move between the positioning portion 520 and the slit formation portion 530 (see FIG. 1).

The table 525 has a flat portion on its upper surface and the stacked film 41c can be fixed on the flat portion. Examples of a fixing mechanism of the stacked film 41c are a suction chuck and an electrostatic chuck.

The flat portion of the table 525 can move and rotate along the flat surface including the flat portion (see FIGS. 2A2 and 2B2).

<Camera for Positioning>

The camera 528 for positioning can take an image for determining whether the end portion of the sheet-like stacked film 41c is positioned at a predetermined position of the table 525. When the end portion of the sheet-like stacked film 41c is not positioned at the predetermined position, the sheet-like stacked film 41c is released from the table 525 and picked up by the first transfer mechanism 521, and then the table 525 moves and rotates to place the end portion of the sheet-like stacked film 41c at the predetermined position.

Note that it is useful that the predetermined position at which the sheet-like stacked film 41c is positioned be set for each size on the basis of a corner of the sheet-like stacked film 41c because the sheet-like stacked films 41c having different sizes are each placed at a predetermined position in the same method.

<Cutter>

The cutter 538 is provided in the slit formation portion 530. The cutter 538 forms the slit 41s which does not pass through the separator 41a in the vicinity of the end portion of the stacked film 41c (see FIGS. 2B1 and 2B2). Specifically, the distance between an edge of the cutter 538 and the table 525 is adjusted so that the support 41b and the support 41 of the sheet-like stacked film 41c are cut and the separator 41a is not cut. Note that forming a slit while remaining part of an object to be processed is referred to as "half-cutting".

It is also possible that a detector which detects a touch of the edge be provided on the cutter 538 and the edge of the cutter be pushed to a predetermined depth.

Note that it is useful that the position at which the slit 41s is formed be set at a corner of the sheet-like stacked film 41c because the slits 41s can be formed in the sheet-like stacked films 41c having different sizes in the same method.

<Second Transfer Mechanism>

The second transfer mechanism 531 can move between the slit formation portion 530 and the peeling portion 539 (see FIG. 1). Moreover, the second transfer mechanism 531 can move between the slit formation portion 530 and the pretreatment portion 540.

The second transfer mechanism 531 transfers the stacked film 41c between the slit formation portion 530 and the peeling portion 539 while supporting the surface of the stacked film 41c that is not in contact with the separator 41a.

The second transfer mechanism 531 includes the suction table 532 which suctions the surface of the stacked film 41c that is not in contact with the separator 41a, a suction pad 533 which can advance and retreat from the suction table, and the vent 534 which can spout gas to separate the end portion of the stacked film 41c in which the slit 41s is formed from the suction table 532 (see FIGS. 2C1 and 2C2 and FIGS. 3A to 3D).

Note that the second transfer mechanism 531 can deliver the support 41b to the pretreatment portion 540 on a delivery chamber 550 side.

Specifically, the support 41b is suctioned by the suction pad 533, and then the support 41b is released from the suction table 532. Next, the suction pad 533 advances and the support 41b is separated from the suction table 532 (see FIGS. 4C1 and 4C2).

The delivery robot 551 provided with a suction pad 553 is interposed between the suction table 532 and the support 41b, and the support 41 is delivered from the suction pad 533 to the suction pad 553.

The support 41b suctioned by the suction pad 553 of the delivery robot 551 is pulled out, whereby the support 41 is supplied to the delivery chamber 550 (see FIGS. 4D1 and 4D2).

<Peeling Mechanism>

The peeling mechanism 535 is provided in the peeling portion 539. The peeling mechanism 535 can hold the separator 41a in a portion overlapping with the end portion of the stacked film 41c in which the slit 41s is formed. For example, a suction pad and the like can be used for the peeling mechanism 535 (see FIG. 3A).

A method of peeling the separator 41a by the peeling mechanism 535 is described with reference to FIGS. 3A to 3D.

Figure 3A:
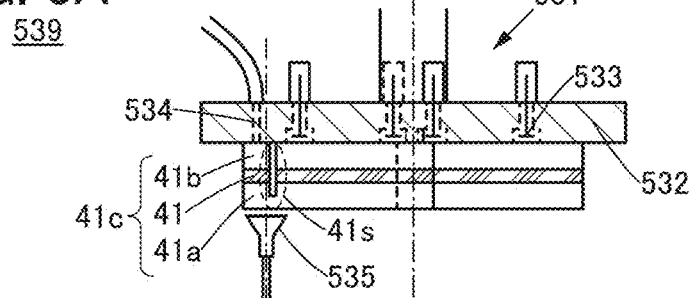
FIGS. 3A to 3D illustrate an operation of a peeling portion of a support supply apparatus.
Figure 3B:
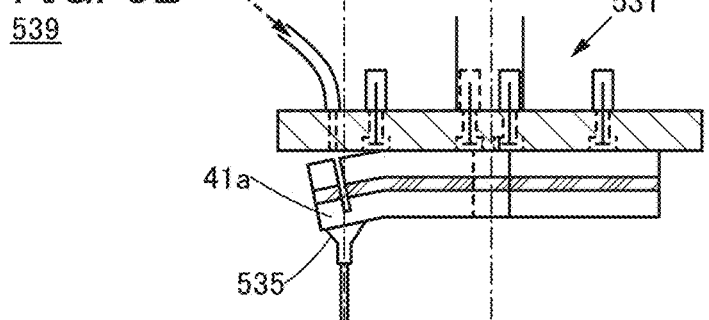
Figure 3C:
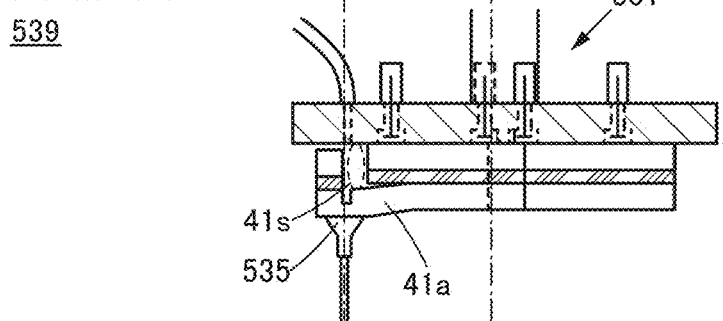
Figure 3D:
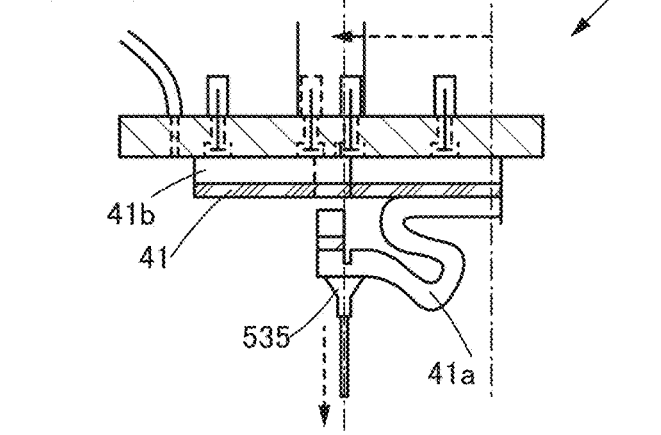

In a first step, the second transfer mechanism 531 moves so that the end portion of the stacked film 41c in which the slit 41s is formed is placed in the vicinity of the peeling mechanism 535 (see FIG. 3A).

In a second step, the suction pad of the peeling mechanism 535 is in a state where the pad can suction, and the vent 534 spouts gas such as air. The spouted gas makes the end portion of the stacked film 41c in which the slit 41s is formed separate from the second transfer mechanism 531, and the end portion is suctioned by the suction pad of the peeling mechanism 535 (see FIG. 3B).

In a third step, the second transfer mechanism 531 provided with the suction table 532 moves relative to the suction pad of the peeling mechanism 535 that suctions the end portion in which the slit 41s is formed, whereby stress is applied in a direction where the separator 41a extends or the separator 41a twists. Thus, in the portion where the slit 41s is formed, a separation trigger, at which the separator 41a is peeled from the support 41, is formed (see FIG. 3C).

In a fourth step, the second transfer mechanism 531 and/or the peeling mechanism 535 moves in a direction where the separator 41a is peeled. Thus, the separator 41a can be peeled (see FIG. 3D). For example, in the case where the predetermined slit 41s is formed at a corner of the sheet-like stacked film 41c, the peeling mechanism 535 moves in a diagonal direction of the second transfer mechanism 531.

After the separator 41a is peeled, the separator 41a is released from the suction pad of the peeling mechanism 535. Thus, the separator 41a falls down and is stored in the peeling portion 539.

With such a peeling method, only the separator 41a which is not cut from a slit can be peeled certainly. Specifically, a defect of peeling the support 41 from the support 41b which is cut from a slit by mistake can be unlikely to be caused.

<First Pretreatment Mechanism>

The first pretreatment mechanism 542 is provided in the pretreatment portion 540 (see FIG. 1 and FIGS. 4A1 and 4A2). The second transfer mechanism 531 places one surface of the support 41 toward the first pretreatment mechanism 542.

The first pretreatment mechanism 542 irradiates one surface of the support 41 with ultrasonic waves and suctions the atmosphere while blowing compressed air; thus, foreign substances attached to one surface of the support 41 can be removed. Note that it is preferable that the pressure of compressed air be higher because the foreign substances can be removed efficiently, and for example, the pressure can be 14 kPa, preferably 25 kPa. Moreover, it is preferable that one surface of the support 41 not be in contact with the first pretreatment mechanism 542 and the distance between the one surface of the support 41 and the first pretreatment mechanism 542 be 5 mm or shorter because the foreign substances can be removed efficiently.

In the case where the first pretreatment mechanism 542 performs treatment on one surface of the support 41 in a linear shape, the first pretreatment mechanism 542 moves relative to the one surface of the support 41.

Furthermore, the support attachment 541 presses the end portion of the support 41 to prevent the end portion of the support 41 from separating from the second transfer mechanism 531.

<Second Pretreatment Mechanism>

The second pretreatment mechanism 547 is provided in the pretreatment portion 540 (see FIG. 1). The second transfer mechanism 531 places one surface of the support 41 toward the second pretreatment mechanism 547 (see FIGS. 4B1 and 4B2).

The second pretreatment mechanism 547 irradiates one surface of the support 41 with ultraviolet rays, whereby an organic material and the like attached to or suctioned to the one surface of the support 41 can be removed. It is preferable that the second pretreatment mechanism 547 be placed near but not in contact with the one surface of the support 41 because the organic material and the like can be removed efficiently. For example, the distance between the second pretreatment mechanism 547 and the one surface of the support 41 may be approximately 5 mm. Moreover, by generating ozone, the attached or suctioned organic material and the like can be removed efficiently.

In the case where the second pretreatment mechanism 547 performs treatment on one surface of the support 41 in a linear shape, the second pretreatment mechanism 547 moves relative to the one surface of the support 41.

The treatment tank 546 has the opening in an upper portion that the second transfer mechanism 531 can cover. By covering the opening, leakage of ultraviolet rays emitted from the second pretreatment mechanism 547 can be prevented.

<Modification Example>

As a modification example of this embodiment, a structure in which the support supply apparatus 500 includes the sheet supply portion 510 supplying the sheet-like stacked films 41*c* is described with reference to FIGS. 5A and 5B.

FIGS. 5A and 5B illustrate a structure and operation of the sheet supply portion 510. FIG. 5A illustrates a tray and a multi-feed prevention mechanism of the sheet supply portion 510 and FIG. 5B illustrates an unwinding mechanism and a cutting mechanism of the sheet supply portion 510.

The support supply apparatus 500 described as a modification example of this embodiment includes the sheet supply portion 510 provided with a tray 517 in which the sheet-like stacked films 41*c* are stored, a multi-feed prevention mechanism 518 which blows gas to the end portion of the stacked film 41*c* picked up by the first transfer mechanism 521 from the tray 517, and a multi-feed detection mechanism 519 which detects whether one or plural stacked films 41*c* are picked up by the first transfer mechanism 521 (see FIG. 5A).

The support supply apparatus 500 described as a modification example of this embodiment includes the sheet supply portion 510 provided with the multi-feed prevention mechanism 518 which prevents multi feed by handling the plurality of stacked films 41*c* picked up by the first transfer mechanism 521 by mistake and the multi-feed detection mechanism 519 which detects multi-feed stacked films. Thus, the first transfer mechanism 521 can supply one sheet-like stacked film 41*c* with high reproducibility. As a result, the suspension time due to the multi feed can be shortened and a support supply unit with high productivity can be provided.

In addition, the support supply apparatus 500 described as a modification example of this embodiment includes the sheet supply portion 510 including an unwinding mechanism 511 which supplies a stacked film from the state of being rolled up, a cutting mechanism 513 which provides the sheet-like stacked film with a predetermined size, and the tray 517 in which the sheet-like stacked films 41*c* are stored (see FIG. 5B).

The support supply apparatus 500 described as a modification example of this embodiment unwinds a stacked film, cuts this film into the sheet with a predetermined size, and is provided with the tray 517 in which the sheet-like stacked films 41*c* are stored. Thus, the sheet-like stacked films 41*c* with a predetermined size can be manufactured from a rolled stacked film 41*r*, and stored in the tray 517. As a result, a support supply apparatus which can supply a support with an appropriate size can be provided.

Components of the support supply apparatus which is a modification example of this embodiment are described below.

<Tray>

The tray 517 has an opening in an upper portion and the plurality of sheet-like stacked films 41*c* is stored in the tray 517 (see FIG. 5A).

The suction pad 523 of the first transfer mechanism 521 can advance to suction a back surface of one stacked film 41*c* and retreat to pick up the stacked film 41*c*.

The height of the tray 517 may be adjusted so that the first transfer mechanism 521 can pick up each stacked film 41*c* at the same height. Specifically, the height of the tray 517 is detected and a servomotor or a cylinder may control the height to be uniform.

Furthermore, the height of the tray 517 shows the number of stacked films 41*c* remaining in the tray 517. When the amount of remaining stacked films 41*c* is small, the alarm is sounded, whereby the user is promoted to supply the stacked films 41*c*.

The height of the tray 517 can be known by not only a distance sensor but also a sensor which detects a distance at which the suction pad 523 advances to suction the stacked film 41*c*, and the like.

<Multi-Feed Prevention Mechanism>

The multi-feed prevention mechanism 518 prevents a defect that the first transfer mechanism 521 transfers the plurality of stacked films 41*c* to the table 525. For example, the multi-feed prevention mechanism 518 blows gas such as air to the end portion of the stacked film 41*c* picked up by the first transfer mechanism 521, whereby the stacked film 41*c* which is not suctioned is separated from the stacked film 41*c* suctioned by the suction pad 523.

<Multi-Feed Detection Mechanism>

The multi-feed detection mechanism 519 detects whether the first transfer mechanism 521 is transferring the plurality of stacked films 41*c* or not. For example, from the intensity of the reflected wave of the irradiation ultrasonic waves or the intensity of the transmitted light of the irradiation light, whether the first transfer mechanism 521 is transferring one stacked film 41c or not can be known.

<Unwinding Mechanism>

The unwinding mechanism 511 takes out a stacked film from the rolled stacked film 41r.

<Cutting Mechanism>

The cutting mechanism 513 cuts out a stacked film with a predetermined size from the stacked film with a size larger than the predetermined size. For example, the cutting mechanism 513 includes a butting portion 512b, a guide (not illustrated) which guides the unwound stacked film to the butting portion 512b, and a film attachment 512a placed at a predetermined distance from the butting portion 512b. Thus, the unwound film can be cut to have a predetermined size.

Note that it is probable that the tray 517 be placed under the cutting mechanism 513 and the cut out sheet-like stacked films 41c be stored in the tray 517.

Alternatively, the plurality of trays 517 is placed in a turret, and the sheet-like stacked films cut out by the cutting mechanism 513 may be stored in the trays corresponding to the size. Thus, the user can select a sheet-like stacked film with a needed size by rotating the turret.

This embodiment can be combined with any of the other embodiments in this specification as appropriate.

(Embodiment 2)

In this embodiment, a structure of a stack manufacturing apparatus of one embodiment of the present invention is described with reference to FIG. 6 and FIGS. 7A1, 7A2, 7B1, 7B2, 7C, 7D1, 7D2, 7E1, and 7E2.

Figure 6:
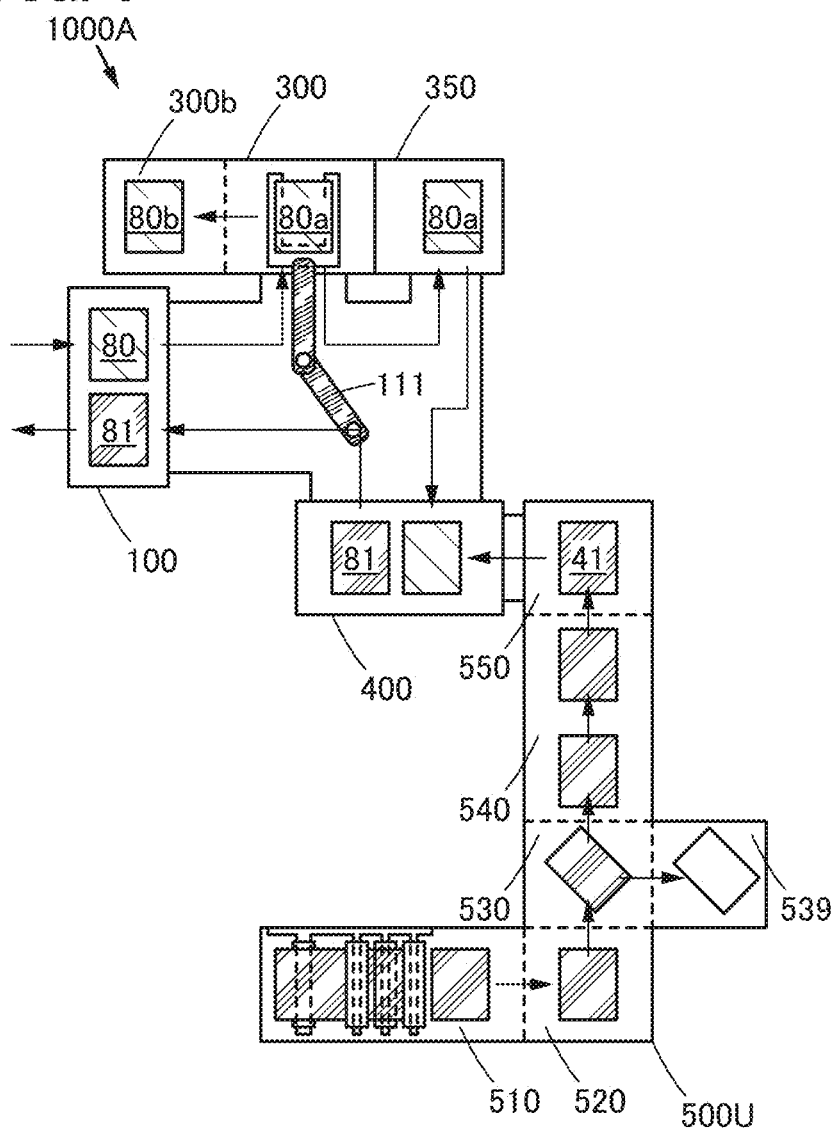
FIG. 6 is a schematic view illustrating a structure of a stack manufacturing apparatus of one embodiment.
Figure 7C:
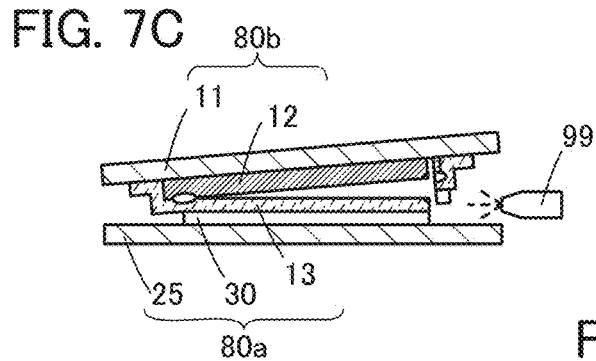

FIG. 6 is a schematic view illustrating a structure of a stack manufacturing apparatus 1000A that is one embodiment of the present invention, and a conveyance path of a processed member and a stack in a process. FIGS. 7A1, 7A2, 7B1, 7B2, 7C, 7D1, 7D2, 7E1, and 7E2 are schematic views illustrating a process for manufacturing a stack with the use of the stack manufacturing apparatus 1000A that is one embodiment of the present invention. FIGS. 7A1, 7B1, 7D1, and 7E1 on the left side are cross-sectional views (along line X1-X2) illustrating structures of a processed member and a stack. FIGS. 7A2, 7B2, 7D2, and 7E2 on the right side are top views corresponding to the cross-sectional views.

<Structure of Stack Manufacturing Apparatus 1000A>

The stack manufacturing apparatus 1000A described in this embodiment includes a first loader unit 100, a first separation unit 300, a first bonding unit 400, and a support supply unit 500U (see FIG. 6).

The first loader unit 100 can be supplied with a processed member 80 and supply the processed member 80. Note that the first loader unit 100 can also serve as a first unloader unit.

The first separation unit 300 separates one surface layer 80b of the processed member 80 to form a first remaining portion 80a (see FIG. 6 and FIGS. 7A1, 7A2, 7B1, 7B2, and 7C).

The first bonding unit 400 is supplied with the first remaining portion 80a and a first support 41, and bonds the first remaining portion 80a to the first support 41 with a first adhesive layer 31 (see FIG. 6 and FIGS. 7D1, 7D2, 7E1, and 7E2).

The support supply unit 500U includes the support supply apparatus 500 in Embodiment 1 and supplies the first support 41 (see FIG. 6).

The first loader unit 100 also serving as the first unloader unit can be supplied with and can transport a stack 81 including the first adhesive layer 31 and the first remaining portion 80a and the first support 41 that are bonded to each other with the first adhesive layer 31 (see FIG. 6 and FIGS. 7E1 and 7E2).

The stack manufacturing apparatus 1000A that is one embodiment of the present invention includes the first loader unit 100 also serving as the first unloader unit that supplies the processed member 80 and transports the stack 81 including the first adhesive layer 31 and the first remaining portion 80a and the first support 41 bonded to each other with the first adhesive layer 31; the first separation unit 300 that separates the first remaining portion 80a; the first bonding unit 400 that bonds the first support 41 to the first remaining portion 80a; and the support supply unit 500U that supplies the first support 41. This structure makes it possible to bond the first support 41 to the first remaining portion 80a of the processed member 80 whose one surface layer is separated. Consequently, a manufacturing apparatus of the stack 81 including the first remaining portion 80a of the processed member 80 and the first support 41 can be provided.

Furthermore, the stack manufacturing apparatus 1000A in this embodiment includes a first storage portion 300b, a first cleaning device 350, a transfer mechanism 111, and the like.

The first storage portion 300b stores the one surface layer 80b separated from the processed member 80.

The first cleaning device 350 cleans the first remaining portion 80a obtained from the processed member 80.

The transfer mechanism 111 transfers the processed member 80, the first remaining portion 80a separated from the processed member 80, and the stack 81.

The following describes individual components included in the stack manufacturing apparatus that is one embodiment of the present invention.

<<First Loader Unit>>

The first loader unit 100 can be supplied with the processed member 80 and supply the processed member 80. For example, to allow the transfer mechanism 111 to transfer a plurality of processed members 80 successively, a multistage storage capable of storing the plurality of processed members 80 can be included.

Furthermore, the first loader unit 100 in this embodiment also serves as the first unloader unit. The first loader unit 100 transports the stack 81 including the first remaining portion 80a, the first adhesive layer 31, and the first support 41 bonded to the first remaining portion 80a with the first adhesive layer 31. For example, to allow the transfer mechanism 111 to transfer the plurality of stacks 81 successively, a multistage storage capable of storing the plurality of stacks 81 can be included.

<<First Separation Unit>>

The first separation unit 300 includes a mechanism for holding one surface layer of the processed member 80 and a mechanism for holding the other surface layer facing the one surface layer. One holding mechanism is pulled away from the other holding mechanism, whereby the one surface layer of the processed member 80 is separated to form the first remaining portion 80a.

<<First Bonding Unit>>

The first bonding unit 400 includes a mechanism for forming the first adhesive layer 31 and a bonding mechanism for bonding the first remaining portion 80a to the first support 41 with the first adhesive layer 31 provided therebetween.

Examples of the bonding mechanism for forming the first adhesive layer 31 include a dispenser for applying a liquid adhesive, screen printing, and a device supplying an adhesive sheet shaped as a sheet in advance.

Note that the first adhesive layer 31 may be formed on the first remaining portion 80a and/or the first support 41. Specifically, the first support 41 provided with the first adhesive layer 31 having a sheet-like shape or the like in advance may be used.

As the mechanism of bonding the first remaining portion 80a to the first support 41, a mechanism of applying pressure that is controlled to apply a constant pressure or provide a uniform gap, such as a pair of rollers, a flat plate and a roller, and a pair of flat plates facing each other can be used.

<<Support Supply Unit>>

The support supply unit 500U supplies the first support 41. For example, the support supply unit 500U includes the sheet supply portion 510 in which a stack of a film and a protective film supplied in a rolled shape is unwound and cut to a predetermined length, the positioning portion 520 in which the cut film is placed at a predetermined position, the slit formation portion 530 in which part of the protective film is cut, the separation portion 539 in which the protective film is peeled from the film, the pretreatment portion 540 in which the surface of the film from which the protective film is removed is cleaned and/or activated, and the delivery chamber 550 which supplies the cleaned and/or activated film as the first support 41.

A method for manufacturing the stack 81 from the processed member 80 with the use of the stack manufacturing apparatus 1000A is described below with reference to FIG. 6 and FIGS. 7A1, 7A2, 7B1, 7B2, 7C, 7D1, 7D2, 7E1, and 7E2.

The processed member 80 includes a first substrate 11, a first separation layer 12 on the first substrate 11, a first layer 13 to be separated (hereinafter simply referred to as the first layer 13) whose one surface is in contact with the first separation layer 12, a bonding layer 30 whose one surface is in contact with the other surface of the first layer 13, a base 25 in contact with the other surface of the bonding layer 30 (see FIGS. 7A1 and 7A2). Note that a structure of the processed member 80 is described in detail in Embodiment 4.

<<Formation of Separation Trigger>>

The processed member 80 in which separation triggers 13s are provided in the vicinity of the end portions of the bonding layer 30 is prepared (see FIGS. 7B1 and 7B2). The separation trigger 13s is formed by separating part of the first layer 13 from the first substrate 11. Part of the first layer 13 can be separated from the separation layer 12 by inserting a sharp tip into the first layer 13 from the first substrate 11 side or by a method using a laser or the like (e.g., a laser ablation method). Accordingly, the separation trigger 13s can be formed.

<<First Step>>

The processed member 80 in which the separation triggers 13s are provided in the vicinity of the end portions of the bonding layer 30 in advance is transferred to the first loader unit 100. The first loader unit 100 supplies the processed member 80 into the transfer mechanism 111, and the transfer mechanism 111 transfers the processed member 80 and supplies it into the first separation unit 300.

<<Second Step>>

The one surface layer 80b of the processed member 80 is separated. As a result, the first remaining portion 80a is obtained from the processed member 80. Specifically, from the separation trigger 13s formed in the vicinity of the end portion of the bonding layer 30, the first substrate 11 and the first separation layer 12 are separated from the first layer 13 (see FIG. 7C). Through this step, the first remaining portion 80a including the first layer 13, the bonding layer 30 whose one surface is in contact with the first layer 13, and the base 25 in contact with the other surface of the bonding layer 30 is obtained. Note that the separation may be performed while the vicinity of the interface between the separation layer 12 and the layer 13 is irradiated with ions to remove static electricity. Specifically, the ions may be generated by an ionizer. Furthermore, separation of the layer 13 from the separation layer 12 may be performed by injecting a liquid into the interface between the layer 13 and the separation layer 12. Alternatively, the liquid may be ejected and sprayed by a nozzle 99. For example, as the liquid injected or sprayed, water, a polar solvent, or the like can be used. By injecting the liquid, an influence of static electricity and the like generated with the separation can be reduced. Alternatively, the separation may be performed while a liquid that dissolves the separation layer is injected. In particular, in the case where a film containing a tungsten oxide is used as the separation layer 12, it is preferable that the first layer 13 be separated while a liquid containing water is injected or sprayed because stress applied to the first layer 13 due to the separation can be reduced. For example, when the second step is performed by using the stack manufacturing apparatus 1000A, the one surface layer 80b of the processed member 80 is separated using the first separation unit 300.

The transfer mechanism 111 can transfer and supply the first remaining portion 80a. The first cleaning device 350 supplied with the first remaining portion 80a can clean the first remaining portion 80a.

<<Third Step>>

The first adhesive layer 31 is formed on the first remaining portion 80a and the first remaining portion 80a is bonded to the first support 41 with the first adhesive layer 31 (see FIGS. 7D1 and 7D2).

Through this step, the stack 81 is obtained from the first remaining portion 80a.

Specifically, the stack 81 including the first support 41, the first adhesive layer 31, the first layer 13, the bonding layer 30 whose one surface is in contact with the first layer 13, and the base 25 in contact with the other surface of the bonding layer 30 is obtained (see FIGS. 7E1 and 7E2). Note that the adhesive layer 31 can be formed by any of various methods. For example, the adhesive layer 31 can be formed with a dispenser, by a screen printing method, or the like. Then, the adhesive layer 31 is cured by a method selected depending on its material. For example, when a light curable adhesive is used for the adhesive layer 31, light including light with a predetermined wavelength is emitted. In the case where the stack manufacturing apparatus 1000A is used, the transfer mechanism 111 transfers the first remaining portion 80a, and the support supply unit 500U supplies the first support 41. The first bonding unit 400 is supplied with the first remaining portion 80a and the first support 41, and the first bonding unit 400 bonds the first remaining portion 80a and the first support 41 to each other with the first adhesive layer 31 in (see FIG. 6).

<<Fourth Step>>

The transfer mechanism 111 transfers the stack 81, and the stack 81 is supplied into the first loader unit 100 also serving as the first unloader unit.

Through this step, the stack 81 is ready to be transported.

Note that the stack 81 in which the first adhesive layer 31 is not cured yet is preferably transported to cure the first adhesive layer 31 outside the stack manufacturing apparatus 1000A, in which case occupancy time of the apparatus can be reduced.

This embodiment can be combined with any of the other embodiments in this specification as appropriate.

(Embodiment 3)

In this embodiment, a structure of a stack manufacturing apparatus of one embodiment of the present invention is described with reference to FIG. 8, FIGS. 9A1, 9A2, 9B1, 9B2, 9C, 9D1, 9D2, 9E1, and 9E2, and FIGS. 10A1, 10A2, 10B, 10C, 10D1, 10D2, 10E1, and 10E2.

Figure 8:
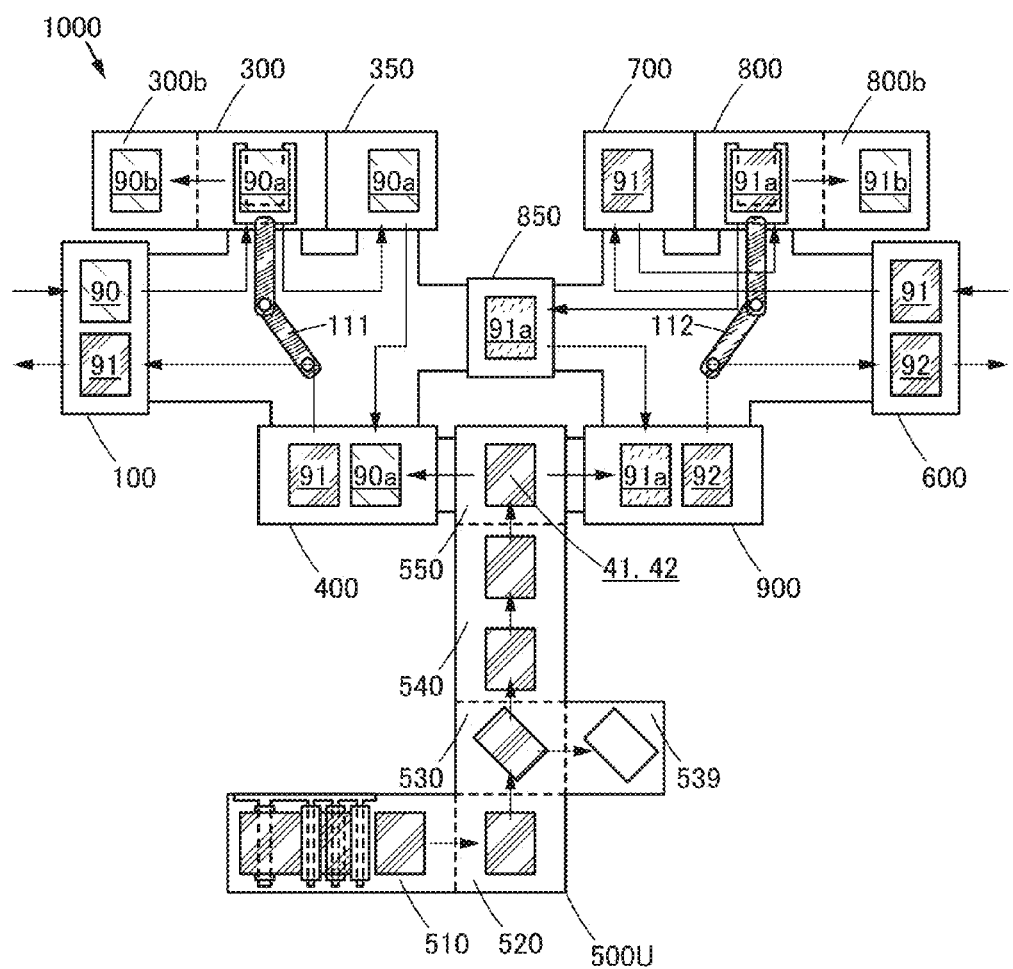
FIG. 8 is a schematic view illustrating a structure of a stack manufacturing apparatus of one embodiment.

FIG. 8 is a schematic view illustrating a structure of a stack manufacturing apparatus 1000 that is one embodiment of the present invention, and the conveyance path of a processed member and a stack in a process.

FIGS. 9A1, 9A2, 9B1, 9B2, 9C, 9D1, 9D2, 9E1, and 9E2 and FIGS. 10A1, 10A2, 10B, 10C, 10D1, 10D2, 10E1, and 10E2 are schematic views illustrating a process for manufacturing a stack with the use of the stack manufacturing apparatus 1000 that is one embodiment of the present invention. FIGS. 9A1, 9B1, 9D1, and 9E1 and FIGS. 10A1, 10D1, and 10E1 on the left side are cross-sectional views (along line Y1-Y2 or Y3-Y4) illustrating structures of a processed member and a stack. FIGS. 9A2, 9B2, 9D2, and 9E2 and FIGS. 10A2, 10D2, and 10E2 on the right side are top views corresponding to the cross-sectional views.

<Structure of Stack Manufacturing Apparatus>

The stack manufacturing apparatus 1000 in this embodiment includes the first loader unit 100, the first separation unit 300, the first bonding unit 400, the support supply unit 500U, a second loader unit 600, a trigger formation unit 700, a second separation unit 800, and a second bonding unit 900.

The first loader unit 100 can supplied with a processed member 90 and supply the processed member 90. Note that the first loader unit 100 can also serve as a first unloader unit.

The first separation unit 300 separates one surface layer 90b of the processed member 90 to form a first remaining portion 90a (see FIG. 8 and FIGS. 9A1, 9A2, 9B1, 9B2, and 9C).

The first bonding unit 400 is supplied with the first remaining portion 90a and a first support 41, and bonds the first remaining portion 90a to the first support 41 with a first adhesive layer 31 (see FIG. 8 and FIGS. 9D1, 9D2, 9E1, and 9E2).

The support supply unit 500U includes the support supply apparatus 500 in Embodiment 1 and supplies the first support 41 and the second support 42 (see FIG. 8).

The first loader unit 100 also serving as the first unloader unit can be supplied with and can transport a stack 91 including the first adhesive layer 31 and the first remaining portion 90a and the first support 41 that are bonded to each other with the first adhesive layer 31 (see FIG. 8 and FIGS. 9E1 and 9E2).

The second loader unit 600 can supplied with the first stack 91 and supply the first stack 91. Note that the second loader unit 600 can also serve as a second unloader unit.

The trigger formation unit 700 forms separation trigger 91s in the vicinity of end portions of the first remaining portion 90a and a first support 41b in the first stack 91 (see FIGS. 10A1 and 10A2).

The second separation unit 800 separates one surface layer 91b of the stack 91 to form a second remaining portion 91a (see FIGS. 10A1 and 10B).

The second bonding unit 900 is supplied with the second remaining portion 91a and a second support 42, and bonds the second remaining portion 91a to the second support 42 with a second adhesive layer 32 (see FIGS. 10D1, 10D2, 10E1, and 10E2).

The second loader unit 600 also serving as the second unloader unit transports a second stack 92 including the second remaining portion 91a and the second support 42 that are bonded to each other with the second adhesive layer 32 (see FIG. 8 and FIGS. 10E1 and 10E2).

The stack manufacturing apparatus in this embodiment includes the loader unit 100 also serving as the first unloader unit that supplies the processed member 90 and transports the stack 91 including the first remaining portion 90a and the first support 41 bonded to each other with the first adhesive layer 31; the first separation unit 300 that separates the first remaining portion 90a; the first bonding unit 400 that bonds the first support 41 to the first remaining portion 90a; and the support supply unit 500U that supplies the first support 41 and the second support 42; the loader unit 600 that supplies the stack 91 and transports the stack 92 including the second remaining portion 91a and the second support 42 bonded to each other with the second adhesive layer 32; the trigger formation unit 700 that forms a separation trigger; the second separation unit 800 that separates the second remaining portion 91a; and the second bonding unit 900 that bonds the second support 42 to the second remaining portion 91a. This structure makes it possible to separate the both surface layers of the processed member 90 to form the second remaining portion 91a, and the first support 41 and the second support 42 are bonded to the second remaining portion 91a. Consequently, a manufacturing apparatus of the stack 92 including the second remaining portion 91a of the processed member 90, the first support 41, and the second support 42 can be provided.

Furthermore, the stack manufacturing apparatus 1000 in this embodiment includes the first storage portion 300b, a second storage portion 800b, the first cleaning device 350, a second cleaning device 850, the transfer mechanism 111, a transfer mechanism 112, and the like.

The first storage portion 300b stores the one surface layer 90b separated from the processed member 90.

The second storage portion 800b stores the one surface layer 91b separated from the stack 91.

The first cleaning device 350 cleans the first remaining portion 90a obtained from the processed member 90.

The second cleaning device 850 cleans the second remaining portion 91a obtained from the stack 91.

The transfer mechanism 111 transfers the processed member 90, the first remaining portion 90a obtained from the processed member 90, and the stack 91.

The transfer mechanism 112 transfers the stack 91, the second remaining portion 91a obtained from the stack 91, and the stack 92.

The following describes individual components included in the stack manufacturing apparatus that is one embodiment of the present invention.

Note that the stack manufacturing apparatus 1000 is different from the stack manufacturing apparatus 1000A described in Embodiment 2 in that the second loader unit 600, the trigger formation unit 700, the second separation unit 800, the second bonding unit 900, the second storage portion 800b, and the second cleaning device 850 are included. In this embodiment, a structure different from that of the stack manufacturing apparatus 1000A is described, and the description in Embodiment 2 is referred to for a structure common to that of the stack manufacturing apparatus 1000.

<<Second Loader Unit>>

The second loader unit 600 can have the same structure as the first loader unit 100 described in Embodiment 2 except that the second loader unit 600 can supply the stack 91.

Furthermore, the second loader unit 600 in this embodiment also serves as the second unloader unit.

<<Trigger Formation Unit>>

The trigger formation unit 700 includes a cutting mechanism which cuts the first support 41 and the first adhesive layer 31 of the first stack 91 and separates part of a second layer 23 to be separated (hereinafter simply referred to as a second layer 23) from a second substrate 21, for example.

Specifically, the cutting mechanism includes one or a plurality of blades which has a sharp tip and a transfer mechanism which transfers the blade relatively to the stack 91.

<<Second Separation Unit>>

The second separation unit 800 includes a mechanism of holding one surface layer of the first stack 91 and a mechanism of holding the other surface layer facing the one surface layer. One holding mechanism is pulled away from the other holding mechanism, whereby the one surface layer of the first stack 91 is separated to form the second remaining portion 91*a*.

<<Second Bonding Unit>>

The second bonding unit 900 includes a mechanism for forming the second adhesive layer 32 and a bonding mechanism for bonding the second remaining portion 91*a* and the second support 42 to each other with the second adhesive layer 32 provided therebetween.

The mechanism for forming the second adhesive layer 32 can have a structure similar to that of the first bonding unit 400 described in Embodiment 2.

Note that the second adhesive layer 32 may be formed on the second remaining portion 91*a* and/or the second support 42. Specifically, the second support 42 on which the sheet-like second adhesive layer 32 is formed in advance may be used.

The bonding mechanism for bonding the second remaining portion 91*a* and the second support 42 to each other can have a structure similar to that of the first bonding unit 400 described in Embodiment 2.

<Method for Manufacturing Stack>

A method for manufacturing the stack 92 from the processed member 90 with the use of the stack manufacturing apparatus 1000 is described below with reference to FIG. 8, FIGS. 9A1, 9A2, 9B1, 9B2, 9C, 9D1, 9D2, 9E1, and 9E2, and FIGS. 10A1, 10A2, 10B, 10C, 10D1, 10D2, 10E1, and 10E2.

The processed member 90 is different from the processed member 80 in that the other surface of the bonding layer 30 is in contact with one surface of the second layer 23 instead of the base 25. Specifically, in the processed member 90, the second substrate 21, a second separation layer 22 over the second substrate 21, and the second layer 23 whose other surface is in contact with the second separation layer 22 are included, and one surface of the second layer 23 is in contact with the other surface of the bonding layer 30.

Specifically, the processed member 90 includes the first substrate 11, the first separation layer 12, the first layer 13 whose one surface is in contact with the first separation layer 12, the bonding layer 30 whose one surface is in contact with the other surface of the first layer 13, the second layer 23 whose one surface is in contact with the other surface of the bonding layer 30, the second separation layer 22 whose one surface is in contact with the other surface of the second layer 23, and the second substrate 21 (see FIGS. 9A1 and 9A2). Note that a structure of the processed member 90 is described in detail in Embodiment 4.

<<First Step>>

The processed member 90 in which separation triggers 13*s* are provided in the vicinity of the end portions of the bonding layer 30 is prepared (see FIGS. 9B1 and 9B2). The separation trigger 13*s* is formed by separating part of the first layer 13 from the first substrate 11. Part of the first layer 13 can be separated from the separation layer 12 by inserting a sharp tip into the first layer 13 from the first substrate 11 side or by a method using a laser or the like (e.g., a laser ablation method). Accordingly, the separation trigger 13*s* can be formed. For example, in the case where the first step is performed by using the stack manufacturing apparatus 1000, the processed member 90 in which the separation trigger 13*s* is formed is prepared. The first loader unit 100 supplies the processed member 90 into the transfer mechanism 111, and the transfer mechanism 111 transfers the processed member 90 and supplies it into the first separation unit 300.

<<Second Step>>

The one surface layer 90*b* of the processed member 90 is separated. As a result, the first remaining portion 90*a* is obtained from the processed member 90. Specifically, from the separation trigger 13*s* formed in the vicinity of the end portion of the bonding layer 30, the first substrate 11 and the first separation layer 12 are separated from the first layer 13 (see FIG. 9C).

Through this step, the first remaining portion 90*a* including the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 in this order is obtained. Note that the separation may be performed while the vicinity of the interface between the separation layer 22 and the layer 23 is irradiated with ions to remove static electricity. Specifically, the ions may be generated by an ionizer. Furthermore, separation of the layer 13 from the separation layer 22 may be performed by injecting a liquid into the interface between the layer 23 and the separation layer 22. Alternatively, the liquid may be ejected and sprayed by a nozzle 99. For example, as the liquid injected or sprayed, water, a polar solvent, or the like can be used. By injecting the liquid, an influence of static electricity and the like generated with the separation can be reduced. Alternatively, the separation may be performed while a liquid that dissolves the separation layer is injected. In particular, in the case where a film containing a tungsten oxide is used as the separation layer 22, it is preferable that the second layer 23 be separated while a liquid containing water is injected or sprayed because stress applied to the second layer 23 due to the separation can be reduced. For example, when the second step is performed by using the stack manufacturing apparatus 1000, the one surface layer 90*b* of the processed member 90 is separated using the first separation unit 300.

The transfer mechanism 111 can transfer and supply the first remaining portion 90*a*. The first cleaning device 350 supplied with the first remaining portion 90*a* can clean and supply the first remaining portion 90*a*.

<<Third Step>>

The first adhesive layer 31 is formed on the first remaining portion 90*a* (see FIGS. 9D1 and 9D2) and the first remaining portion 90*a* is bonded to the first support 41 with the first adhesive layer 31. Through this step, the stack 91 is obtained from the first remaining portion 90*a*.

Specifically, the stack 91 including the first support 41, the first adhesive layer 31, the first layer 13, the bonding layer 30 whose one surface is in contact with the first layer 13, the second layer 23 whose one surface is in contact with the other surface of the bonding layer 30, the second separation layer 22 whose one surface is in contact with the other surface of the second layer 23, and the second substrate 21 in this order is obtained (see FIGS. 9E1 and 9E2).

The transfer mechanism 111 transfers the first remaining portion 90a, and the support supply unit 500U supplies the first support 41. The first bonding unit 400 is supplied with the first remaining portion 90a and the first support 41, and bonds the first remaining portion 90a to the first support 41 with the first adhesive layer 31 (see FIGS. 9D1, 9D2, 9E1, and 9E2).

<<Fourth Step>>

The transfer mechanism 111 transfers the stack 91, and the first loader unit 100 also serving as the first unloader unit transports the supplied stack 91.

For example, when it takes time to cure the first adhesive layer, the stack 91 in which the first adhesive layer is not cured yet can be transported to cure the first adhesive layer 31 outside the stack manufacturing apparatus 1000. Thus, occupancy time of the apparatus can be reduced.

<<Fifth Step>>

The stack 91 is prepared. The second loader unit 600 is supplied with and supplies the stack 91 to the transfer mechanism 112, the transfer mechanism 112 transfers the stack 92 to the trigger formation unit 700.

<<Sixth Step>>

Part of the second layer 23 in the vicinity of the end portion of the first adhesive layer 31 of the stack 91 is separated from the second substrate 21 to form the second separation trigger 91s.

For example, the first support 41 and the first adhesive layer 31 are cut from the first support 41 side, and part of the second layer 23 is separated from the second substrate 21 along an end portion of the first adhesive layer 31 which is newly formed.

Specifically, the first adhesive layer 31 and the first support 41 in a region which is over the second separation layer 22 and in which the second layer 23 is provided are cut with a blade or the like including a sharp tip, and along an end portion of the first adhesive layer 31 which is newly formed, the second layer 23 is partly separated from the second substrate 21 (see FIGS. 10A1 and 10A2).

Through this step, the separation trigger 91s is formed in the vicinity of the end portions of the first support 41b and the first adhesive layer 31 which are newly formed.

<<Seventh Step>>

The second remaining portion 91a is separated from the stack 91. As a result, the second remaining portion 91a is obtained from the stack 91 (see FIG. 10C).

Specifically, from the separation trigger 91s formed in the vicinity of the end portion of the first adhesive layer 31, the second substrate 21 and the second separation layer 22 are separated from the second layer 23. Through this step, the second remaining portion 91a including the first support 41b, the first adhesive layer 31, the first layer 13, the bonding layer 30 whose one surface is in contact with the first layer 13, and the second layer 23 whose one surface is in contact with the other surface of the bonding layer 30 in this order is obtained. Note that the separation may be performed while the vicinity of the interface between the separation layer 22 and the layer 23 is irradiated with ions to remove static electricity. Specifically, the ions may be generated by an ionizer. Furthermore, separation of the layer 23 from the separation layer 22 may be performed by injecting a liquid into the interface between the layer 23 and the separation layer 22. Alternatively, the liquid may be ejected and sprayed by a nozzle 99. For example, as the liquid injected or sprayed, water, a polar solvent, or the like can be used. By injecting the liquid, an influence of static electricity and the like generated with the separation can be reduced. Alternatively, the separation may be performed while a liquid that dissolves the separation layer is injected. In particular, in the case where a film containing a tungsten oxide is used as the separation layer 22, it is preferable that the first layer 23 be separated while a liquid containing water is injected or sprayed because stress applied to the first layer 23 due to the separation can be reduced. For example, when the seventh step is performed by using the stack manufacturing apparatus 1000, the one surface layer 91b of the stack 91 is separated using the second separation unit 800.

<<Eighth Step>>

The transfer mechanism 112 transfers the second remaining portion 91a, and turns the second remaining portion 91a so that the second layer 23 faces upward. In the second cleaning device 850, the supplied second remaining portion 91a is cleaned.

The transfer mechanism 112 transfers the second remaining portion 91a, and the support supply unit 500U supplies the second support 42.

Note that the second remaining portion 91a may be supplied into the second bonding unit 900 without being supplied into the second cleaning device.

<<Ninth Step>>

The second adhesive layer 32 is formed on the second remaining portion 91a (see FIGS. 10D1 and 10D2). The second remaining portion 91a is bonded to the second support 42 with the second adhesive layer 32. Through this step, the stack 92 is obtained from the second remaining portion 91a (see FIGS. 10E1 and 10E2).

Specifically, the stack 92 including the first support 41b, the first adhesive layer 31, the first layer 13, the bonding layer 30 whose one surface is in contact with the other surface of the first layer 13, the second layer 23 whose one surface is in contact with the other surface of the bonding layer 30, the second adhesive layer 32, and the second support 42 in this order is obtained.

<<Tenth Step>>

The transfer mechanism 112 transfers the stack 92 to the second loader unit 600, and the second loader unit 600 also serving as the second unloader unit transports the stack 92.

Through this step, the stack 92 is ready to be transported.

<Modification Example>

A modification example of this embodiment is described with reference to FIG. 11.

Figure 11:
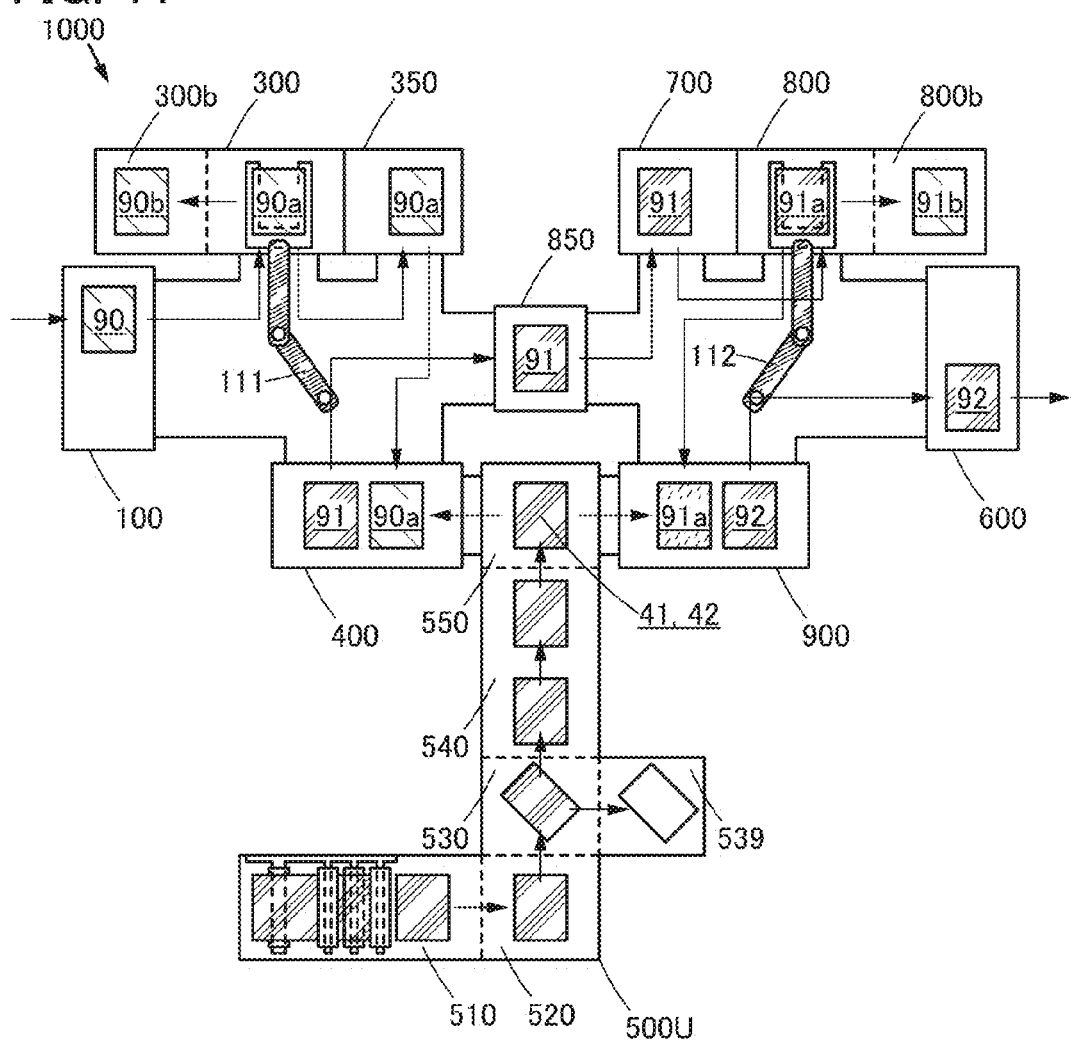
FIG. 11 is a schematic view illustrating a structure of a stack manufacturing apparatus of one embodiment.

FIG. 11 is a schematic diagram illustrating a structure of the stack manufacturing apparatus 1000 that is one embodiment of the present invention, and the conveyance path of a processed member and a stack in a process.

In the modification example of this embodiment, a method for manufacturing the stack 92 from the processed member 90 with the use of the stack manufacturing apparatus 1000, which is different from the above-described method, is described with reference to FIGS. 9A1, 9A2, 9B1, 9B2, 9C, 9D1, 9D2, 9E1, and 9E2, FIGS. 10A1, 10A2, 10B, 10C, 10D1, 10D2, 10E1, and 10E2, and FIG. 11.

Specifically, the differences between the method in this modification example and the above-described method are as follows: in the fourth step, the transfer mechanism 111 transfers the stack 91 and the stack 91 is supplied into the second cleaning device 850; in the fifth step, the transfer mechanism 112 transfers the stack 91 and the stack 91 is supplied into the trigger formation unit 700; and in the eighth step, the second remaining portion 91a is supplied into the second bonding unit 900. Thus, different steps will be described in detail below. Refer to the above description for portions where the same steps can be employed.

<Modification Example of Fourth Step>

The conveying mechanism 111 conveys the stack 91 and the stack 91 is fed into the second cleaning device 850.

In the modification example of this embodiment, the second cleaning device 850 is used as a delivery chamber in which the transfer mechanism 111 delivers the stack 91 to the transfer mechanism 112 (see FIG. 11).

By using the second cleaning device 850 as the delivery chamber, the stack 91 can be continuously processed without being transported from the stack manufacturing apparatus 1000.

Modification Example of Fifth Step>

The transfer mechanism 112 transfers the stack 91, and the stack 91 is supplied into the trigger formation unit 700.

<Modification Example of Eighth Step>

The transfer mechanism 112 transfers the second remaining portion 91a, and turns the second remaining portion 91a so that the second layer 23 faces upward. The second remaining portion 91a is supplied into the second bonding unit 900.

The second bonding unit 900 forms the second adhesive layer 32 on the supplied second remaining portion 91a (see FIGS. 10D1 and 10D2), and bonds the second remaining portion 91a to the second support 42 with the second adhesive layer 32 (see FIGS. 10E1 and 10E2).

Through this step, the stack 92 is obtained from the second remaining portion 91a. Specifically, the stack 92 includes the first layer 13, the first support 41b bonded to one surface of the first layer 13 with the first adhesive layer 31, the bonding layer 30 whose one surface is in contact with the other surface of the first layer 13, the second layer 23 whose one surface is in contact with the other surface of the bonding layer 30, and the second support 42 bonded to the other surface of the second layer 23 with the second adhesive layer 32.

This embodiment can be combined with any of the other embodiments in this specification as appropriate.

(Embodiment 4)

In this embodiment, structures of processed members that can be used for the stack manufacturing apparatus that is one embodiment of the present invention are described with reference to FIGS. 12A1, 12A2, 12B1, and 12B2.

FIGS. 12A1, 12A2, 12B1, and 12B2 are schematic views illustrating structures of processed members that can be used to form a stack with the use of the stack manufacturing apparatus that is one embodiment of the present invention.

FIG. 12A1 is a cross-sectional view (along line X1-X2) illustrating a structure of the processed member 80, which can be a stack, and FIG. 12A2 is a top view corresponding to the cross-sectional view.

FIG. 12B1 is a cross-sectional view (along line Y1-Y2) illustrating a structure of the processed member 90, which can be a stack, and FIG. 12B2 is a top view corresponding to the cross-sectional view.

<Structural Example 1 of Processed Member>

The processed member 80 includes the first substrate 11, the first separation layer 12 on the first substrate 11, the first layer 13 whose one surface is in contact with the first separation layer 12, the bonding layer 30 whose one surface is in contact with the other surface of the first layer 13, and the base 25 which is in contact with the other surface of the bonding layer 30 (see FIGS. 12A1 and 12A2).

Note that the separation triggers 13s may be provided in the vicinity of the end portions of the bonding layer 30.

<<First Substrate>>

There is no particular limitation on the first substrate 11 as long as the first substrate 11 has heat resistance high enough to withstand a manufacturing process and a thickness and a size which can be used in a manufacturing apparatus.

For the first substrate 11, an organic material, an inorganic material, a composite material of an organic material and an inorganic material, or the like can be used. For example, an inorganic material such as glass, ceramics, or metal, can be used.

Examples of the materials that can be used for the first substrate 11 are as follows: glass such as non-alkali glass, soda-lime glass, potash glass, or crystal glass; a film such as a metal oxide film, a metal nitride film, or a metal oxynitride film (e.g., a silicon oxide film, a silicon nitride film, a silicon oxynitride film, or an alumina film); SUS; aluminum; an organic material such as a resin, a resin film, or plastic (e.g., a resin film or a resin plate of polyester, polyolefin, polyamide, polyimide, polycarbonate, or an acrylic resin); a composite material formed by attaching a metal plate, a thin glass plate, or an inorganic material film to a resin film; a composite material formed by dispersing a fibrous or particulate metal, glass, inorganic material, or the like into a resin film; and a composite material formed by dispersing a fibrous or particulate resin, organic material, or the like into an inorganic material.

For the first substrate 11, a single-layer material or a stacked-layer material can be used. For example, a stacked-layer material including a base and an insulating layer that prevents diffusion of impurities contained in the base can be used. Specifically, a stacked-layer material of glass and one or a plurality of films that prevents diffusion of impurities contained in the glass and that are selected from a silicon oxide layer, a silicon nitride layer, and a silicon oxynitride layer can be used. Alternatively, a stacked-layer material of a resin and a film that prevents diffusion of impurities contained in the resin, such as a silicon oxide film, a silicon nitride film, and a silicon oxynitride film can be used.

<<First Separation Layer>>

The first separation layer 12 is provided between the first substrate 11 and the first layer 13. A boundary that separates the first layer 13 from the first substrate 11 is formed in the vicinity of the first separation layer 12. There is no particular limitation on the first separation layer 12 as long as the first separation layer 12 has heat resistance high enough to withstand the manufacturing process of the first layer 13 formed thereon.

For the first separation layer 12, for example, an inorganic material, an organic resin, or the like can be used.

Specific examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon.

Specifically, an organic material such as polyimide, polyester, polyolefin, polyamide, polycarbonate, and an acrylic resin can be used.

For the first separation layer 12, a single-layer material or a stacked-layer material can be used. Specifically, a stacked-layer material of a layer containing tungsten and a layer containing an oxide of tungsten can be used.

The layer containing an oxide of tungsten can be formed by stacking another layer to a layer containing tungsten. Specifically, the layer containing an oxide of tungsten may be formed by stacking a silicon oxide film or a silicon oxynitride film to a layer containing tungsten. The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

Specifically, a layer containing polyimide can be used as the first separation layer 12. The layer containing polyimide has heat resistance high enough to withstand the various manufacturing steps of the first layer 13. For example, the layer containing polyimide has heat resistance of 200° C. or higher, preferably 250° C. or higher, more preferably 300° C. or higher, still more preferably 350° C. or higher. A condensed film containing polyimide obtained by heating a film containing a monomer formed on the first substrate 11 can be used.

<<First Layer to be Separated>>

There is no particular limitation on the first layer 13 as long as the first layer 13 can be separated from the first substrate 11 and has heat resistance high enough to withstand the manufacturing process. A boundary that separates the first layer 13 from the first substrate 11 may be formed between the first layer 13 and the first separation layer 12 or may be formed between the first separation layer 12 and the first substrate 11. In the case where the boundary is formed between the first layer 13 and the first separation layer 12, the first separation layer 12 is not included in the stack, and in the case where the boundary is formed between the first separation layer 12 and the first substrate 11, the first separation layer 12 is included in the stack. An inorganic material, an organic material, a single-layer material, or a stacked-layer material can be used for the first separation layer 13.

For example, an inorganic film such as a metal oxide film, a metal nitride film, and a metal oxynitride film can be used as the first layer 13. Specifically, silicon oxide, silicon nitride, silicon oxynitride, an alumina film, or the like can be used. Alternatively, a resin, a resin film, plastic, or the like can be used for the first layer 13. Specifically, a polyimide film or the like can be used.

For example, a material having the following structure can be used: a functional layer overlapping with the first separation layer 12 and an insulating layer that is provided between the first separation layer 12 and the functional layer and can prevent unintended diffusion of impurities which impairs the function of the functional layer are stacked. Specifically, a 0.7-mm-thick glass plate is used as the first substrate 11, and a stacked-layer material of a 200-nm-thick silicon oxynitride film and a 30-nm-thick tungsten film stacked in this order from the first substrate 11 side is used for the first separation layer 12. A film including a stacked-layer material of a 600-nm-thick silicon oxynitride film and a 200-nm-thick silicon nitride film stacked in this order from the first separation layer 12 side can be used as the first layer 13. Note that a silicon oxynitride film refers to a film that includes more oxygen than nitrogen, and a silicon nitride oxide film refers to a film that includes more nitrogen than oxygen. Alternatively, instead of the above first layer 13, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order from the first separation layer 12 side can be used as a layer to be separated. Specifically, a polyimide film, a layer containing silicon oxide, silicon nitride, or the like and the functional layer may be stacked in this order from the first separation layer 12 side.

<<Functional Layer>>

A functional layer is included in the first layer 13. As the functional layer, a functional circuit, a functional element, an optical element, a functional film, or a layer including a plurality of elements selected from the above examples can be used. Specific examples are layers including a display element that can be used for a display device, a pixel circuit for driving the display element, a driver circuit of the pixel circuit, a color filter, a moisture-proof film, and a layer including a plurality of elements selected from the above examples.

<<Bonding Layer>>

There is no particular limitation on the bonding layer 30 as long as the bonding layer 30 bonds the first layer 13 and the base 25 to each other.

For example, an inorganic material, an organic resin, or the like can be used for the bonding layer 30.

Specifically, a glass layer with a melting point of 400° C. or lower, preferably 300° C. or lower, an adhesive, or the like can be used.

For the bonding layer 30, a light curable adhesive, a reactive curable adhesive, a heat curable adhesive, and/or an anaerobic adhesive can be used.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used.

<<Base>>

There is no particular limitation on the base 25 as long as the base 25 has heat resistance high enough to withstand a manufacturing process and a thickness and a size which can be used in a manufacturing apparatus.

A material used for the base 25 can be similar to that used for the first substrate 11, for example.

<<Separation Trigger>>

In the processed member 80, the separation triggers 13*s* may be provided in the vicinity of the end portions of the bonding layer 30.

The separation triggers 13*s* are formed by separating part of the first layer 13 from the first substrate 11.

Part of the first layer 13 can be separated from the separation layer 12 by inserting a sharp tip into the first layer 13 from the first substrate 11 side or by a method using a laser or the like (e.g., a laser ablation method). Accordingly, the separation trigger 13*s* can be formed.

<Structural Example 2 of Processed Member>

A modification example of a structure of the processed member that can be used in the stack manufacturing apparatus of one embodiment is described with reference to FIGS. 12B1 and 12B2.

The processed member 90 is different from the processed member 80 in that the other surface of the bonding layer 30 is in contact with one surface of the second layer 23 instead of the base 25. Thus, different portions will be described in detail below. The above description is referred to for portions where the same structures can be employed. Specifically, the processed member 90 includes the first substrate 11 on which the first separation layer 12 and the first layer 13 whose one surface is in contact with the first separation layer 12 are formed, the second substrate 21 on which the second separation layer 22 and the second layer 23 whose other surface is in contact with the second separation layer 22 are formed, and the bonding layer 30 whose one surface is in contact with the other surface of the first layer 13 and whose other surface is in contact with the one surface of the second separation layer 23.

<<Second Substrate>>

As the second substrate 21, the same substrate as the first substrate 11 can be used. Alternatively, the second substrate 21 and the first substrate 11 do not need to have the same structure.

<<Second Separation Layer>>

As the second separation layer 22, the same layer as the first separation layer 12 can be used. Alternatively, the second separation layer 22 and the first separation layer 12 do not need to have the same structure.

<<Second Layer to be Separated>>

The second layer 23 can have the same structure as the first layer 13. Alternatively, the second layer 23 can have a structure different from that of the first layer 13.

Specifically, a structure may be employed in which the first layer 13 includes a functional circuit and the second layer 23 includes a functional layer that prevents diffusion of impurities into the functional circuit.

Specifically, the first layer 13 may include a light-emitting element that emits light to the second layer 23, a pixel circuit for driving the light-emitting element, and a driver circuit of the pixel circuit, and the second layer 23 may include a color filter that transmits part of light emitted from the light-emitting element and a moisture-proof film that prevents unintended diffusion of impurities into the light-emitting element. Note that the processed member with such a structure can be used for a stack that can be used as a flexible display device.

This embodiment can be combined with any of the other embodiments in this specification as appropriate.

(Embodiment 5)

In this embodiment, description is given of an example of a flexible light-emitting device (light-emitting panel) that can be manufactured with the use of any of the stack manufacturing apparatuses described in Embodiments 2 and 3.

<Specific Example 1>

Figure 13A:
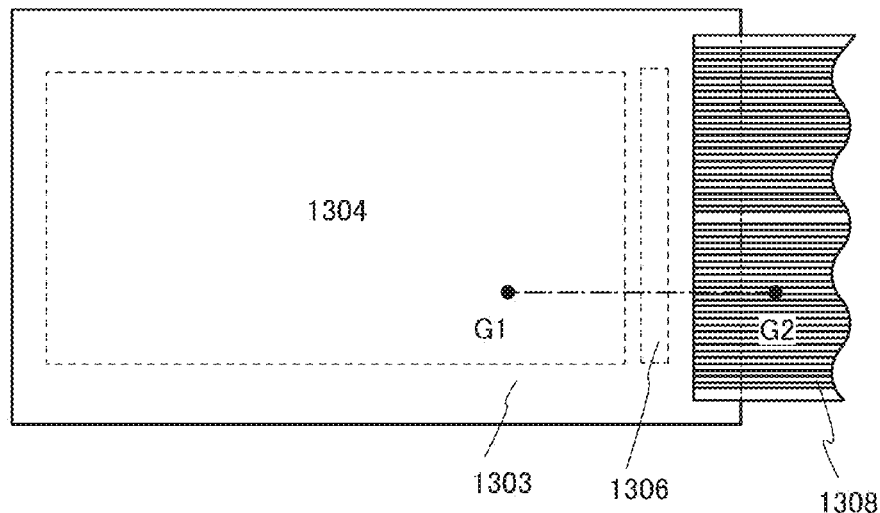
FIGS. 13A and 13B illustrate a light-emitting panel of one embodiment.
Figure 13B:
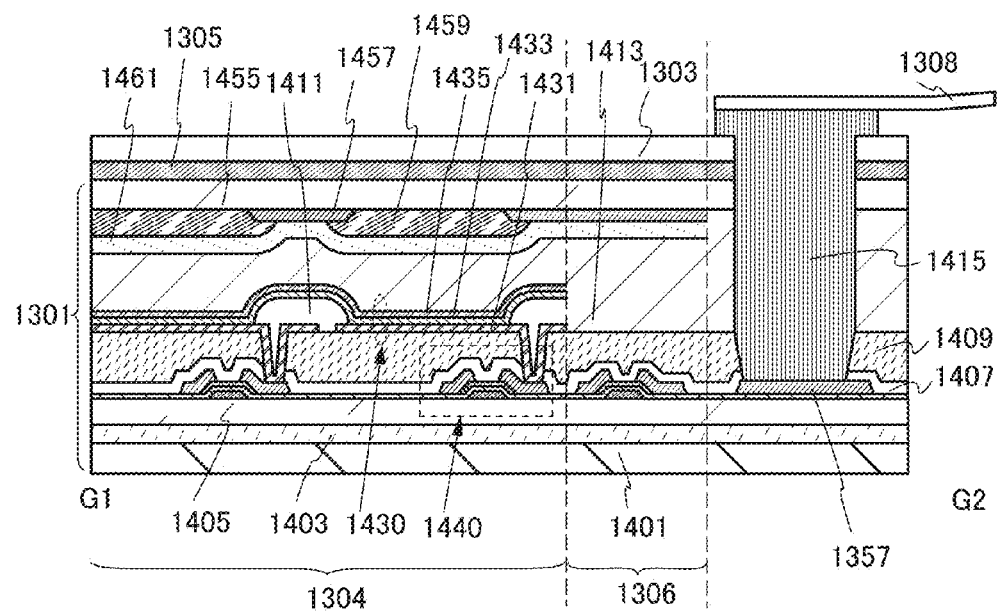
Figure 17A:
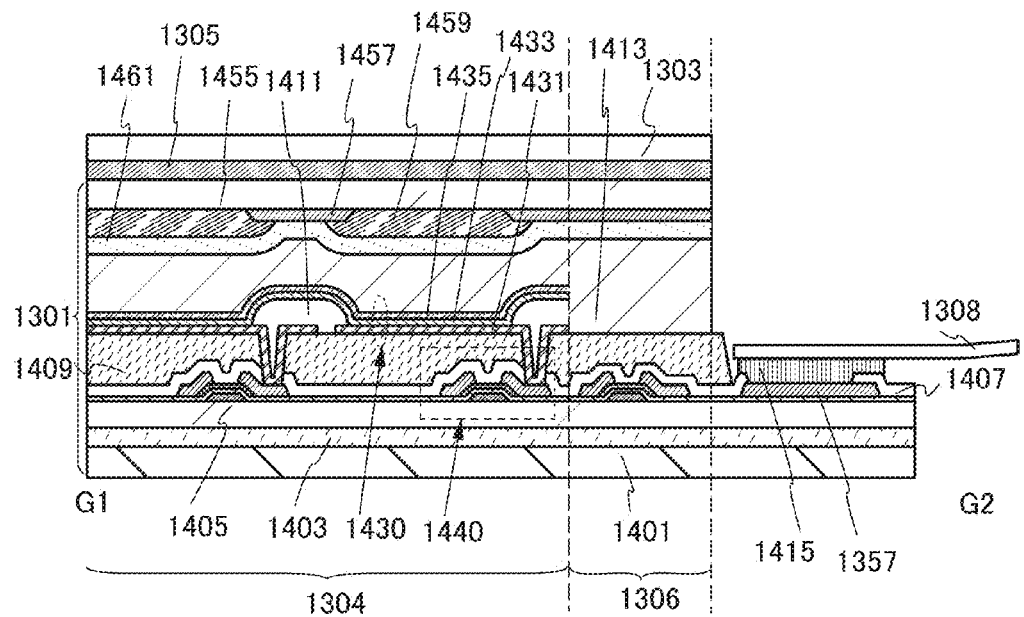
FIGS. 17A and 17B each illustrate a light-emitting panel of one embodiment.
Figure 17B:
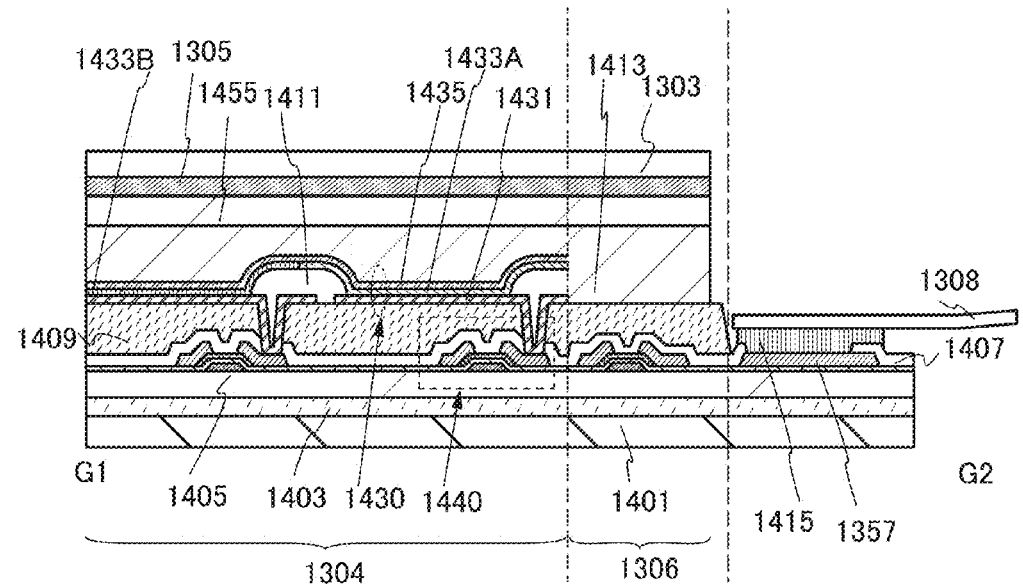

FIG. 13A is a plan view of a flexible light-emitting panel, and FIG. 13B is an example of a cross-sectional view taken along dashed-dotted line G1-G2 in FIG. 13A. In addition, examples of another cross-sectional view are illustrated in FIGS. 17A and 17B.

The light-emitting panel illustrated in FIG. 13B includes an element layer 1301, an adhesive layer 1305, and a substrate 1303. The element layer 1301 includes a substrate 1401, an adhesive layer 1403, an insulating layer 1405, a transistor 1440, a conductive layer 1357, an insulating layer 1407, an insulating layer 1409, a light-emitting element 1430, an insulating layer 1411, a sealing layer 1413, an insulating layer 1461, a coloring layer 1459, a light-blocking layer 1457, and an insulating layer 1455.

The conductive layer 1357 is electrically connected to an FPC (flexible printed circuit) 1308 via a connector 1415.

The light-emitting element 1430 includes a lower electrode 1431, an EL layer 1433, and an upper electrode 1435. The lower electrode 1431 is electrically connected to a source electrode or a drain electrode of the transistor 1440. An end portion of the lower electrode 1431 is covered with the insulating layer 1411. The light-emitting element 1430 has a top emission structure. The upper electrode 1435 has a light-transmitting property and transmits light emitted from the EL layer 1433.

Note that as illustrated in FIG. 17B, with the use of an EL layer 1433A and an EL layer 1433B, the EL layers may be separately provided for each pixel. In this case, different colors are emitted in the pixels; therefore, the coloring layer 1459 is not necessarily provided.

The coloring layer 1459 is provided to overlap with the light-emitting element 1430, and the light-blocking layer 1457 is provided to overlap with the insulating layer 1411. The coloring layer 1459 and the light-blocking layer 1457 are covered with the insulating layer 1461. A space between the light-emitting element 1430 and the insulating layer 1461 is filled with the sealing layer 1413.

The light-emitting panel includes a plurality of transistors in a light extraction portion 1304 and a driver circuit portion 1306. The transistor 1440 is provided over the insulating layer 1405. The insulating layer 1405 and the substrate 1401 are bonded to each other with the adhesive layer 1403. The insulating layer 1455 and the substrate 1303 are bonded to each other with the adhesive layer 1305. It is preferable to use films with low water permeability for the insulating layer 1405 and the insulating layer 1455, in which case an impurity such as water can be prevented from entering the light-emitting element 1430 or the transistor 1440, leading to improved reliability of the light-emitting panel. The adhesive layer 1403 can be formed using a material similar to that of the adhesive layer 1305.

The light-emitting panel in Specific example 1 can be manufactured in the following manner: the insulating layer 1405, the transistor 1440, and the light-emitting element 1430 are formed over a formation substrate with high heat resistance; the formation substrate is separated; and the insulating layer 1405, the transistor 1440, and the light-emitting element 1430 are transferred to the substrate 1401 and bonded thereto with the adhesive layer 1403. The light-emitting panel in Specific example 1 can be manufactured in the following manner: the insulating layer 1455, the coloring layer 1459, and the light-blocking layer 1457 are formed over a formation substrate with high heat resistance; the formation substrate is separated; and the insulating layer 1455, the coloring layer 1459, and the light-blocking layer 1457 are transferred to the substrate 1303 and bonded thereto with the adhesive layer 1305.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate having high heat resistance; thus, a highly reliable transistor and an insulating film with sufficiently low water permeability can be formed. Then, the transistor and the insulating film are transferred to the substrate 1303 or the substrate 1401, whereby a highly reliable light-emitting panel can be manufactured. Thus, with one embodiment of the present invention, a thin or/and lightweight light-emitting device with high reliability can be provided. Details of the manufacturing method will be described later.

The substrate 1303 and the substrate 1401 are each preferably formed using a material with high toughness. Thus, a display device with high impact resistance that is less likely to be broken can be provided. For example, when the substrate 1303 is an organic resin substrate and the substrate 1401 is a substrate formed using a thin metal material or a thin alloy material, a light-emitting panel that is more lightweight and less likely to be broken as compared with the case where a glass substrate is used can be provided.

A metal material and an alloy material, which have high thermal conductivity, are preferred because they can easily conduct heat to the whole substrate and accordingly can prevent a local temperature rise in the light-emitting panel.

The thickness of a substrate using a metal material or an alloy material is preferably greater than or equal to 10 μm and less than or equal to 200 μm, further preferably greater than or equal to 20 μm and less than or equal to 50 μm.

Further, when a material with high thermal emissivity is used for the substrate 1401, the surface temperature of the light-emitting panel can be prevented from rising, leading to prevention of breakage or a decrease in reliability of the light-emitting panel. For example, the substrate 1401 may have a stacked-layer structure of a metal substrate and a layer with high thermal emissivity (the layer can be formed using a metal oxide or a ceramic material, for example).

<Specific Example 2>

Figure 14A:
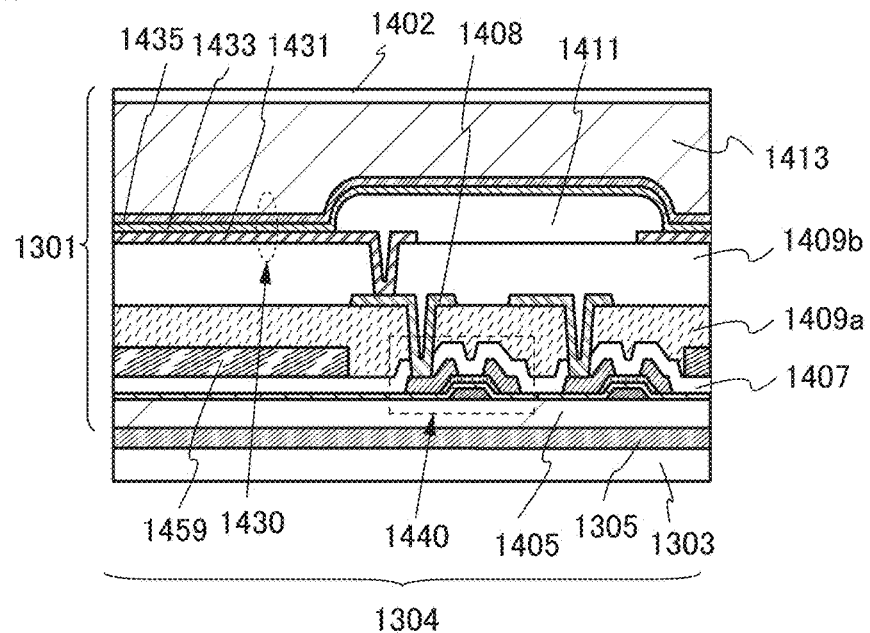
FIGS. 14A and 14B illustrate a light-emitting panel of one embodiment.

FIG. 14A illustrates another example of the light extraction portion 1304 in the light-emitting panel.

The light extraction portion 1304 illustrated in FIG. 14A includes the substrate 1303, the adhesive layer 1305, a substrate 1402, the insulating layer 1405, the transistor 1440, the insulating layer 1407, a conductive layer 1408, an insulating layer 1409a, an insulating layer 1409b, the light-emitting element 1430, the insulating layer 1411, the sealing layer 1413, and the coloring layer 1459.

The light-emitting element 1430 includes the lower electrode 1431, the EL layer 1433, and the upper electrode 1435. The lower electrode 1431 is electrically connected to the source electrode or the drain electrode of the transistor 1440 via the conductive layer 1408. An end portion of the lower electrode 1431 is covered with the insulating layer 1411. The light-emitting element 1430 has a bottom emission structure. The lower electrode 1431 has a light-transmitting property and transmits light emitted from the EL layer 1433.

The coloring layer 1459 is provided to overlap with the light-emitting element 1430, and light emitted from the light-emitting element 1430 is extracted from the substrate 1303 side through the coloring layer 1459. A space between the light-emitting element 1430 and the substrate 1402 is filled with the sealing layer 1413. The substrate 1402 can be formed using a material similar to that of the substrate 1401.

<Specific Example 3>

Figure 14B:
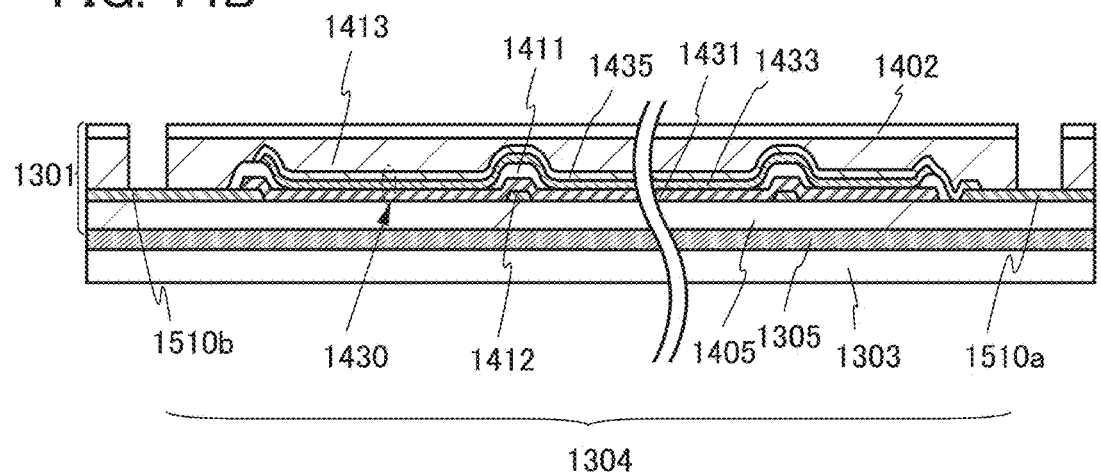

FIG. 14B illustrates another example of the light-emitting panel.

The light-emitting panel illustrated in FIG. 14B includes the element layer 1301, the adhesive layer 1305, and the substrate 1303. The element layer 1301 includes the substrate 1402, the insulating layer 1405, a conductive layer 1510a, a conductive layer 1510b, a plurality of light-emitting elements, the insulating layer 1411, a conductive layer 1412, and the sealing layer 1413.

The conductive layer 1510a and the conductive layer 1510b, which are external connection electrodes of the light-emitting panel, can each be electrically connected to an FPC or the like.

The light-emitting element 1430 includes the lower electrode 1431, the EL layer 1433, and the upper electrode 1435. An end portion of the lower electrode 1431 is covered with the insulating layer 1411. The light-emitting element 1430 has a bottom emission structure. The lower electrode 1431 has a light-transmitting property and transmits light emitted from the EL layer 1433. The conductive layer 1412 is electrically connected to the lower electrode 1431.

The substrate 1303 may have, as a light extraction structure, a hemispherical lens, a micro lens array, a film provided with an uneven surface structure, a light diffusing film, or the like. For example, a light extraction structure can be formed by attaching the above lens or film to a resin substrate with an adhesive or the like having substantially the same refractive index as the substrate or the lens or film.

The conductive layer 1412 is preferably, though not necessarily, provided because voltage drop due to the resistance of the lower electrode 1431 can be inhibited. In addition, for a similar purpose, a conductive layer electrically connected to the upper electrode 1435 may be provided over the insulating layer 1411.

The conductive layer 1412 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 1412 can be greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 1435, metal particles forming the conductive layer aggregate; therefore, the surface of the conductive layer is rough and has many gaps. Thus, it is difficult for the EL layer 1433 to completely cover the conductive layer; accordingly, the upper electrode and the conductive layer are electrically connected to each other easily, which is preferable.

<Examples of Materials>

Next, materials and the like that can be used for the light-emitting panel are described. Note that description of the components already described in this embodiment is omitted.

The element layer 1301 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 1301 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the state of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be particularly used, in which case deterioration of the transistor characteristics can be suppressed.

The light-emitting element included in the light-emitting panel includes a pair of electrodes (the lower electrode 1431 and the upper electrode 1435); and the EL layer 1433 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further, alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. An alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and, copper or an alloy of silver and magnesium can be used for the conductive film. An alloy of silver and copper is preferable because of its high heat resistance. Furthermore, when a metal film or a metal oxide film is stacked in contact with an aluminum alloy film, oxidation of the aluminum alloy film can be inhibited. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 1431 and the upper electrode 1435, holes are injected to the EL layer 1433 from the anode side and electrons are injected to the EL layer 1433 from the cathode side. The injected electrons and holes are recombined in the EL layer 1433 and a light-emitting substance contained in the EL layer 1433 emits light.

The EL layer 1433 includes at least a light-emitting layer. In addition to the light-emitting layer, the EL layer 1433 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

For the EL layer 1433, either a low molecular compound or a high molecular compound can be used, and an inorganic compound may also be used. Each of the layers included in the EL layer 1433 can be formed by any of the following methods: an evaporation method (including a vacuum evaporation method), a transfer method, a printing method, an inkjet method, a coating method, and the like.

In the element layer 1301, the light-emitting element is preferably provided between a pair of insulating films with low water permeability. Thus, an impurity such as water can be inhibited from entering the light-emitting element, leading to inhibition of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The substrate 1303 has a light-transmitting property and transmits at least light emitted from the light-emitting element included in the element layer 1301. The substrate 1303 has flexibility. The refractive index of the substrate 1303 is higher than that of the air.

An organic resin, which has a specific gravity smaller than that of glass, is preferably used for the substrate 1303, in which case the light-emitting device can be more lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 1303 may have a stacked-layer structure of a layer of any of the above-described materials and a hard coat layer (e.g., a silicon nitride layer) which protects a surface of the light-emitting device from damage or the like, a layer (e.g., an aramid resin layer) which can disperse pressure, or the like. Furthermore, to suppress a decrease in the lifetime of the light-emitting element due to moisture and the like, the insulating film with low water permeability may be included in the stacked structure.

The adhesive layer 1305 has a light-transmitting property and transmits at least light emitted from the light-emitting element included in the element layer 1301. The refractive index of the adhesive layer 1305 is higher than that of the air.

For the adhesive layer 1305, a resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

The resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The adhesive layer 1305 may also include a scattering member for scattering light. For example, the adhesive layer 1305 can be a mixture of the above-described resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, a silicone resin, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 1405 and the insulating layer 1455 can each be formed using an inorganic insulating material. It is particularly preferable to use the insulating film with low water permeability, in which case a highly reliable light-emitting panel can be provided.

The insulating layer 1407 has an effect of inhibiting diffusion of impurities into a semiconductor included in the transistor. As the insulating layer 1407, an inorganic insulating film such as a silicon oxide film, a silicon oxynitride film, or an aluminum oxide film can be used.

As each of the insulating layers 1409, 1409*a*, and 1409*b*, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that a plurality of insulating films formed of these materials or inorganic insulating films may be stacked.

The insulating layer 1411 is provided to cover an end portion of the lower electrode 1431. In order that the insulating layer 1411 be favorably covered with the EL layer 1433 and the upper electrode 1435 formed thereover, a side wall of the insulating layer 1411 preferably has a tilted surface with continuous curvature.

As a material for the insulating layer 1411, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 1411.

There is no particular limitation on the method for forming the insulating layer 1411; a photolithography method, a sputtering method, an evaporation method, a droplet discharging method (e.g., an inkjet method), a printing method (e.g., a screen printing method or an off-set printing method), or the like may be used.

For the sealing layer 1413, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 1413. In the case where light emitted from the light-emitting element 1430 is extracted outside through the sealing layer 1413, the sealing layer 1413 preferably includes a filler with a high refractive index or a scattering member. Materials for the drying agent, the filler with a high refractive index, and the scattering member are similar to those that can be used for the adhesive layer 1305.

The conductive layer 1357 can be formed using the same material and the same step as a conductive layer included in the transistor or the light-emitting element. For example, the conductive layer can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 1408, 1412, 1510*a*, and 1510*b* can also be formed using any of the above-described metal materials, alloy materials, and conductive metal oxides.

For the connector 1415, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 1459 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 1457 is provided between the adjacent coloring layers 1459. The light-blocking layer 1457 blocks light emitted from the adjacent light-emitting element, thereby inhibiting color mixture between adjacent pixels. Here, the coloring layer 1459 is provided such that its end portion overlaps with the light-blocking layer 1457, whereby light leakage can be reduced. The light-blocking layer 1457 can be formed using a material that blocks light emitted from the light-emitting element, for example, a metal material, a resin material including a pigment or a dye, or the like. Note that the light-blocking layer 1457 is preferably provided in a region other than the light extraction portion 1304, such as the driver circuit portion 1306, as illustrated in FIG. 13B, in which case undesired leakage of guided light or the like can be inhibited.

The insulating layer 1461 covering the coloring layer 1459 and the light-blocking layer 1457 is preferably provided because it can inhibit an impurity such as a pigment included in the coloring layer 1459 or the light-blocking layer 1457 from diffusing into the light-emitting element or the like. For the insulating layer 1461, a light-transmitting material is used, and an inorganic insulating material or an organic insulating material can be used. The insulating film with low water permeability may be used for the insulating layer 1461.

<Manufacturing Method Example>

Next, an example of a method for manufacturing a light-emitting device will be described with reference to FIGS. 15A to 15C and FIGS. 16A to 16C. Here, the manufacturing method is described using the light-emitting device of Specific example 1 (FIG. 13B) as an example.

First, a separation layer 1503 is formed over a formation substrate 1501, and the insulating layer 1405 is formed over the separation layer 1503. Next, the transistor 1440, the conductive layer 1357, the insulating layer 1407, the insulating layer 1409, the light-emitting element 1430, and the insulating layer 1411 are formed over the insulating layer 1405. An opening is formed in the insulating layers 1411, 1409, and 1407 to expose the conductive layer 1357 (see FIG. 15A).

In addition, a separation layer 1507 is formed over a formation substrate 1505, and the insulating layer 1455 is formed over the separation layer 1507. Next, the light-blocking layer 1457, the coloring layer 1459, and the insulating layer 1461 are formed over the insulating layer 1455 (see FIG. 15B).

The formation substrate 1501 and the formation substrate 1505 can each be a hard substrate such as a glass substrate, a quartz substrate, a sapphire substrate, a ceramic substrate, or a metal substrate.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 1503 and the separation layer 1507 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or poly crystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Note that the insulating layer preferably has a single-layer structure or a stacked-layer structure including any of a silicon nitride film, a silicon oxynitride film, a silicon nitride oxide film, and the like.

Each of the insulating layers can be formed by a sputtering method, a plasma CVD method, a coating method, a printing method, or the like. For example, the insulating layer is formed at higher than or equal to 250° C. and lower than or equal to 400° C. by a plasma CVD method, whereby the insulating layer can be a dense film with very low water permeability.

Figure 15A:
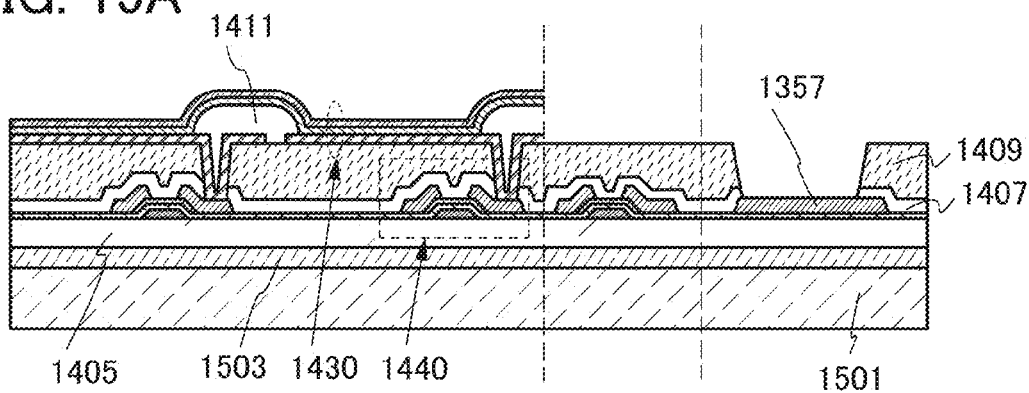
FIGS. 15A to 15C illustrate a method for manufacturing a light-emitting panel of one embodiment.
Figure 15B:
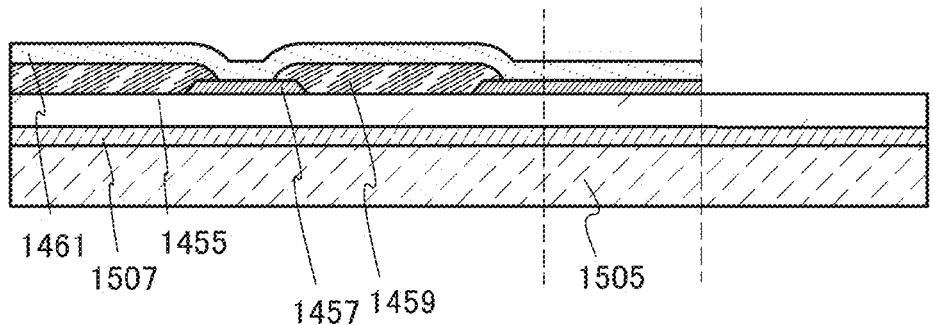
Figure 15C:
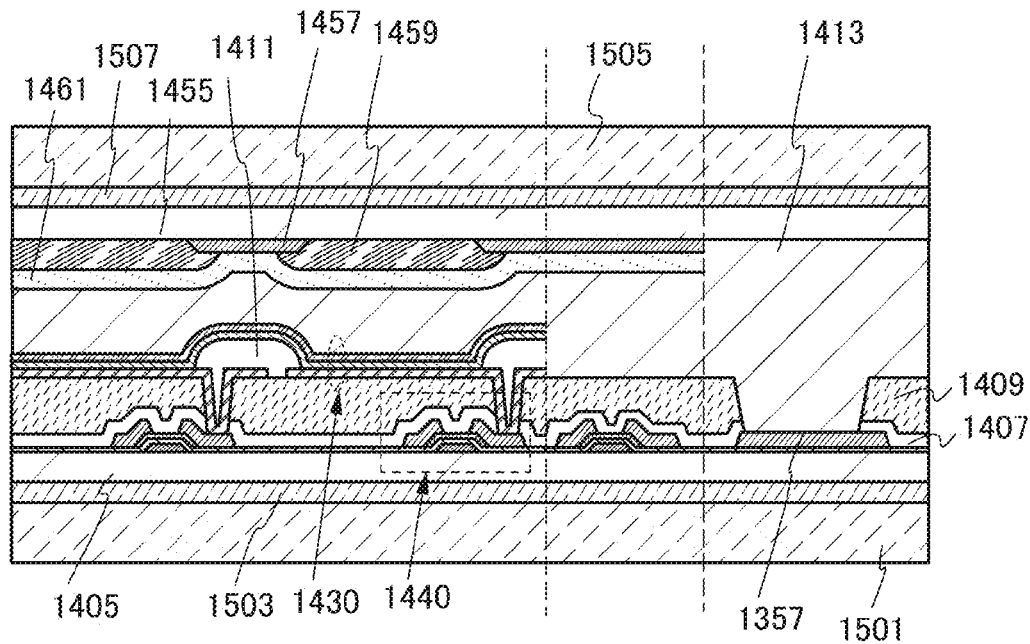

Then, a material for the sealing layer 1413 is applied to a surface of the formation substrate 1505 over which the coloring layer 1459 and the like are formed or a surface of the formation substrate 1501 over which the light-emitting element 1430 and the like are formed, and the formation substrate 1501 and the formation substrate 1505 are bonded to each other with the sealing layer 1413 positioned therebetween (see FIG. 15C).

Next, the formation substrate 1501 is separated, and the exposed insulating layer 1405 and the substrate 1401 are bonded to each other with the adhesion layer 1403. Furthermore, the formation substrate 1505 is separated, and the exposed insulating layer 1455 and the substrate 1303 are bonded to each other with the adhesive layer 1305. Although the substrate 1303 does not overlap with the conductive layer 1357 in FIG. 16A, the substrate 1303 may overlap with the conductive layer 1357.

Here, the substrate 1401 corresponds to the support 41 described in Embodiment 1 and the substrate 1303 corresponds to the second support 42.

The substrate 1303 or the substrate 1401 can be supplied by the support supply apparatus described in Embodiment 1. In addition, the step of separating the formation substrate 1501, the step of bonding the substrate 1401, the step of separating the formation substrate 1505, and the step of bonding the substrate 1303 can be performed with the stack manufacturing apparatus described in Embodiment 2 or Embodiment 3.

Note that in the separation step using any of the stack manufacturing apparatuses that are embodiments of the present invention, various separation methods can be performed on the formation substrate. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Furthermore, the separation step can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other. The step corresponds to the step of forming the separation trigger in this specification. The separation trigger is preferably formed in each of the processed member and the stack which are processed with any of the stack manufacturing apparatuses that are embodiments of the present invention.

Separation of the layer to be separated from the formation substrate may be carried out by filling the interface between the separation layer and the layer to be separated with a liquid. Furthermore, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 16A:
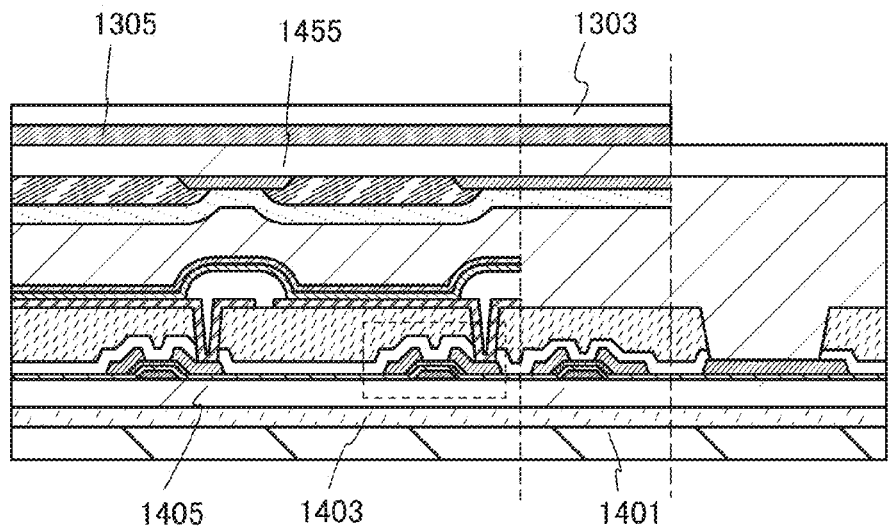
FIGS. 16A to 16C illustrate a method for manufacturing a light-emitting panel of one embodiment.
Figure 16B:
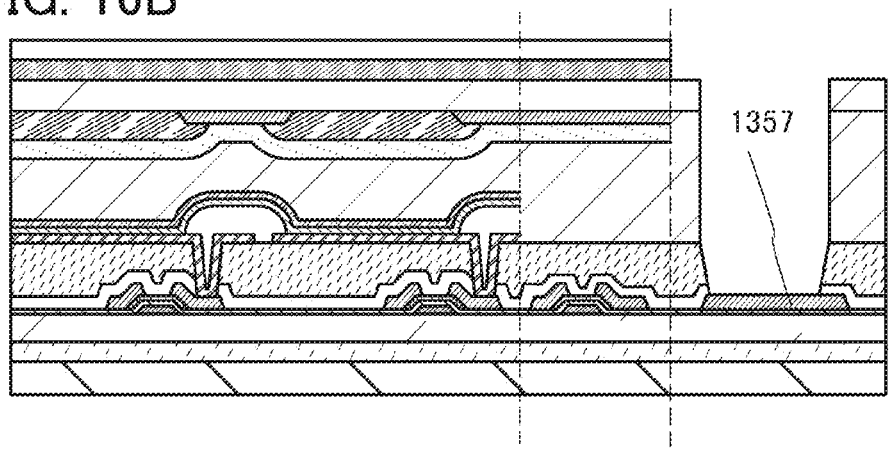
Figure 16C:
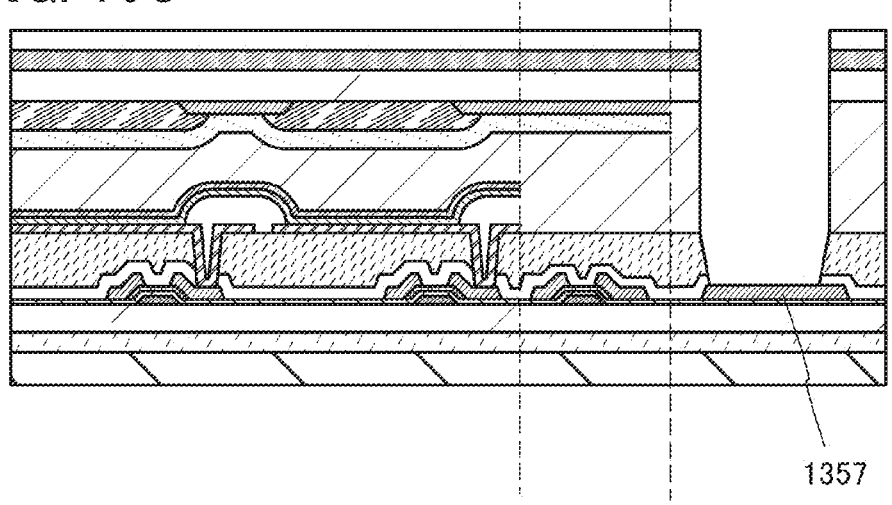

Lastly, an opening is formed in the insulating layer 1455 and the sealing layer 1413 to expose the conductive layer 1357 (see FIG. 16B). In the case where the substrate 1303 overlaps with the conductive layer 1357, the opening is formed also in the substrate 1303 and the adhesive layer 1305 (see FIG. 16C). The mechanism for forming the opening is not particularly limited and may be, for example, a laser ablation method, an etching method, an ion beam sputtering method, or the like. As another method, a slit may be made in a film over the conductive layer 1357 with a sharp knife or the like and part of the film may be separated by physical force.

In the above-described manner, the light-emitting panel can be manufactured.

Figure 18:
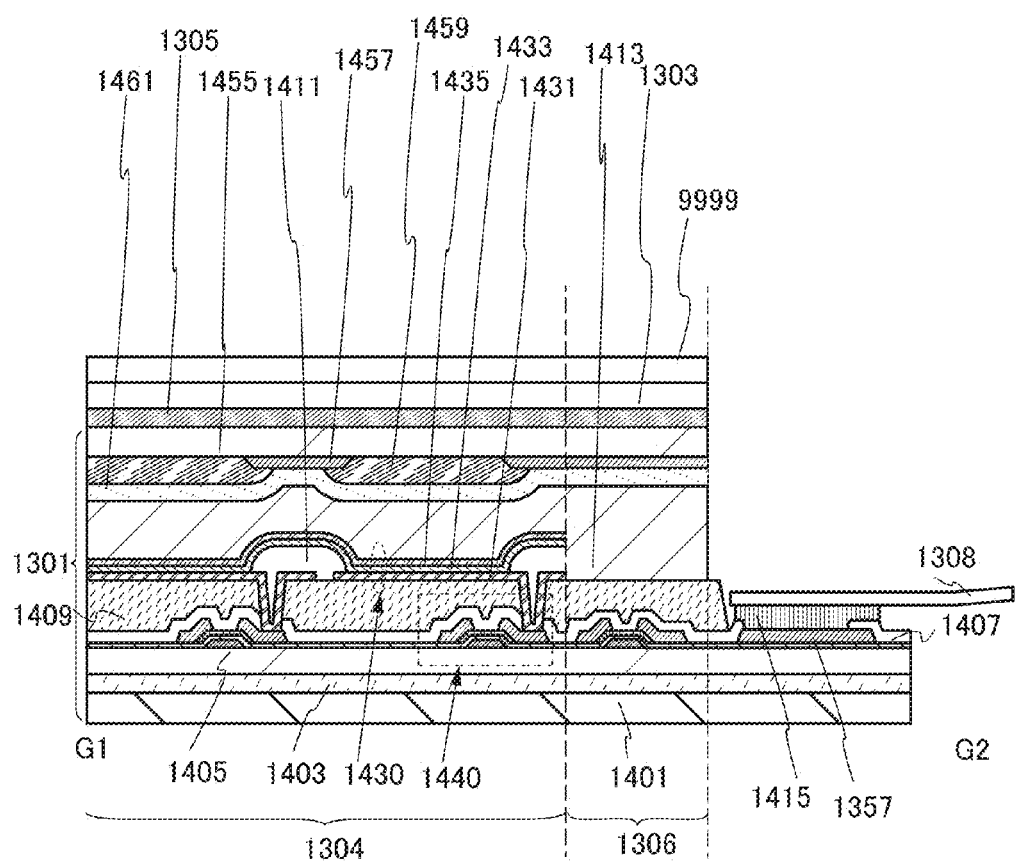
FIG. 18 illustrates a light-emitting panel of one embodiment.

Note that a touch sensor or a touch panel may be provided. For example, FIG. 18 illustrates a case where a touch panel is incorporated in the light-emitting panel in FIGS. 13A and 13B. A touch sensor may be directly formed on the substrate 1303; alternatively, the touch panel 9999 formed on another substrate may be placed over the substrate 1303.

Note that although the case where the light-emitting element is used as a display element is illustrated here, one embodiment of the present invention is not limited thereto. Various display elements can be used. For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like.

In this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, a metal insulator metal (MIM), a thin film diode (TFD), or the like can also be used. Since such an element has few number of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Alternatively, since an active element (a non-linear element) is not used, the aperture ratio can be improved, so that power consumption can be reduced or higher luminance can be achieved, for example.

As described above, a light-emitting panel of this embodiment includes two substrates; one is the substrate 1303 and the other is the substrate 1401. The light-emitting device can be formed with two substrates even when including a touch sensor. Owing to the use of the minimum number of substrates, improvement in light extraction efficiency and improvement in clarity of display can be easily achieved.

Examples of the electronic devices to which the flexible light-emitting device that can be manufactured using the stack manufacturing apparatus of one embodiment of the present invention is applied include television sets (also referred to as televisions or television receivers), monitors of computers or the like, cameras such as digital cameras or digital video cameras, digital photo frames, mobile phones (also referred to as cellular phones or cellular phone devices), portable game consoles, portable information terminals, audio reproducing devices, large-sized game machines such as pachinko machines, and the like.

As examples of electronic devices including a display device with flexibility, the following can be given: television devices (also referred to as televisions or television receivers), monitors of computers or the like, cameras such as digital cameras or digital video cameras, digital photo frames, mobile phones (also referred to as mobile phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 19A:
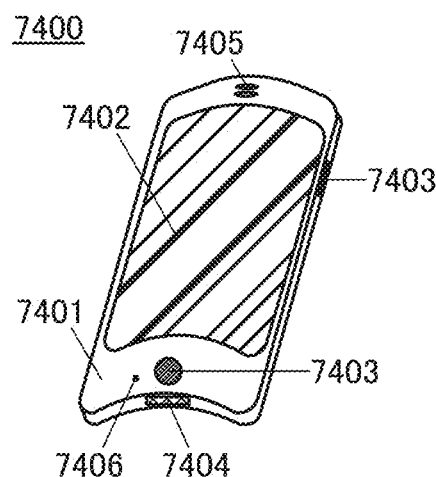
FIGS. 19A to 19D illustrate examples of electronic devices and lighting devices.

FIG. 19A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is fabricated using the display device for the display portion 7402.

When the display portion 7402 of the mobile phone 7400 illustrated in FIG. 19A is touched with a finger or the like, data can be input into the mobile phone 7400. Operations such as making a call and inputting a letter can be performed by touch on the display portion 7402 with a finger or the like.

With the operation button 7403, power ON or OFF can be switched. In addition, types of images displayed on the display portion 7402 can be switched; for example, switching images from a mail creation screen to a main menu screen is performed with the operation button 7403.

Here, the display portion 7402 includes a display device of one embodiment of the present invention. Thus, the mobile phone can have a curved display portion and high reliability.

Figure 19B:
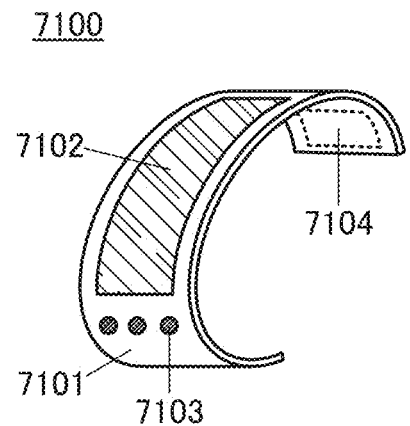

FIG. 19B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes a display device of one embodiment of the present invention. Thus, the portable display device can have a curved display portion and high reliability.

Figure 19C:
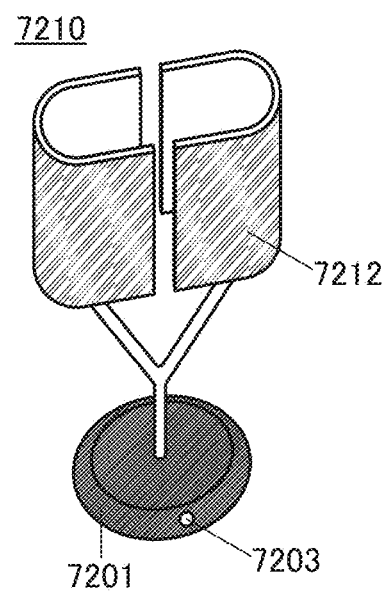
Figure 19D:
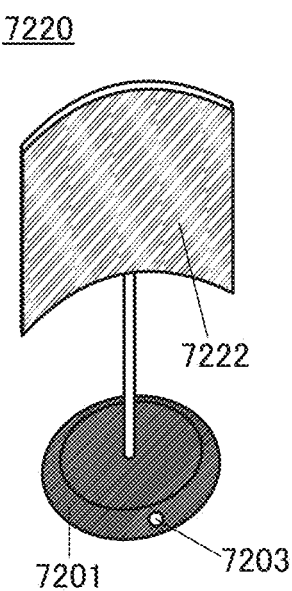

FIGS. 19C and 19D each illustrate an example of a lighting device. Lighting devices 7210 and 7220 each include a stage 7201 provided with an operation switch 7203 and a light-emitting portion supported by the stage 7201.

A light-emitting portion 7212 included in the lighting device 7210 illustrated in FIG. 19C has two convex-curved light-emitting portions symmetrically placed. Thus, all directions can be illuminated with the lighting device 7210 as a center.

The lighting device 7220 illustrated in FIG. 19D includes a concave-curved light-emitting portion 7222. This is suitable for illuminating a specific range because light emitted from the light-emitting portion 7222 is collected to the front of the lighting device 7220.

The light-emitting portion included in each of the lighting devices 7210 and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7210 and 7220 each include a display device of one embodiment of the present invention. Thus, the lighting devices can have curved display portions and high reliability.

Figure 20A:
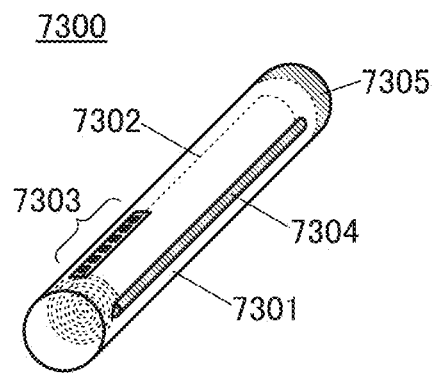
FIGS. 20A and 20B illustrate one example of an electronic device.

FIG. 20A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 20B:
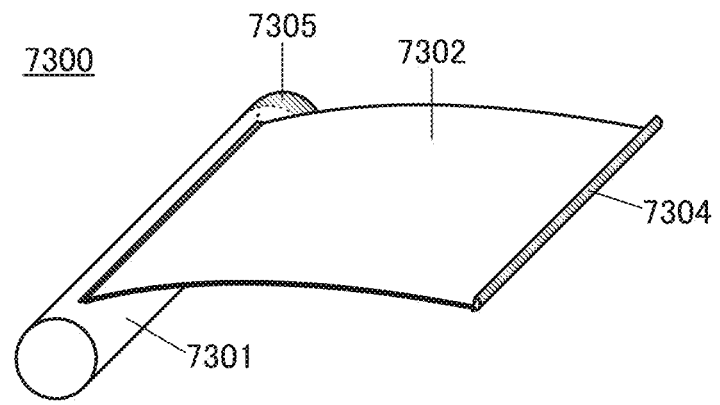

FIG. 20B illustrates a state in which the display portion 7302 is pulled out with the display portion pull 7304. Videos can be displayed on the display portion 7302 in this state. In addition, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes a display device of one embodiment of the present invention. Thus, the display portion 7302 is a display device which is flexible and highly reliable, which makes the display device 7300 lightweight and highly reliable.

It is needless to say that one embodiment of the present invention is not limited to the above-described electronic devices and lighting devices as long as a display device of one embodiment of the present invention is included.

This embodiment can be implemented in an appropriate combination with any of the structures described in the other embodiments.

(Embodiment 6)

In this embodiment, description is given of an example of a flexible light-emitting device (light-emitting panel) that can be manufactured with the use of any of the stack manufacturing apparatuses described in Embodiments 2 and 3.

Figure 21A:
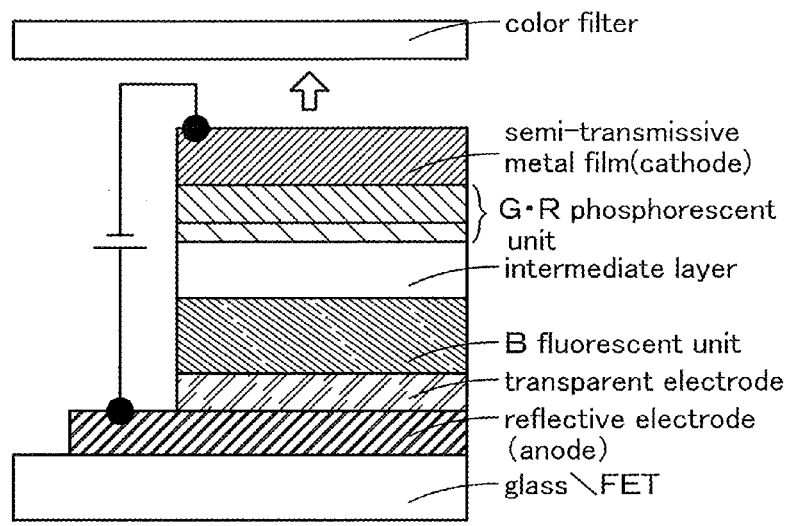
FIGS. 21A and 21B illustrate structures of a light-emitting element and a light-emitting panel of one embodiment.
Figure 21B:
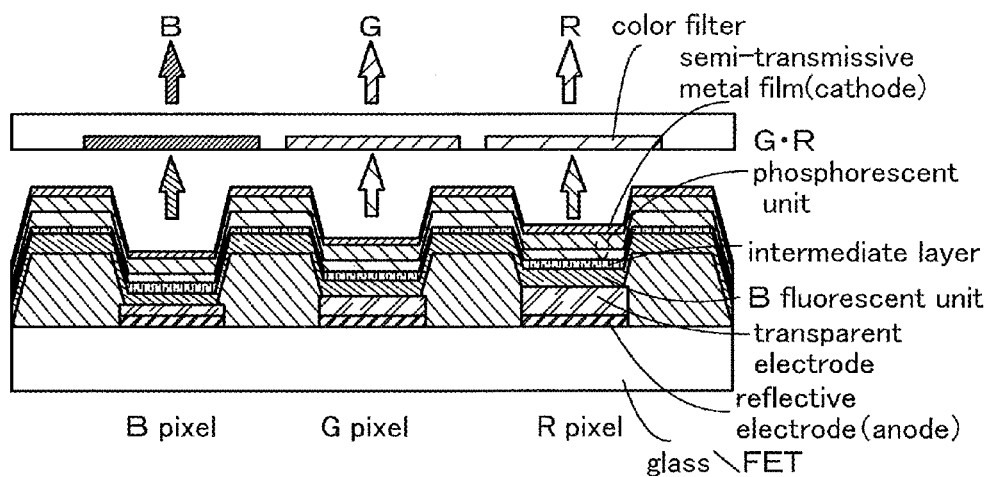

FIGS. 21A and 21B are cross-sectional views illustrating structures of a light-emitting element and a light-emitting panel. FIG. 21A is a cross-sectional view illustrating a structure of a light-emitting element with a WTC structure, and FIG. 21B is a cross-sectional view illustrating a structure of a light-emitting panel provided with a plurality of light-emitting elements each with a WTC structure.

Figure 22:
FIG. 22 is a photograph showing display quality of a light-emitting panel of one embodiment.

FIG. 22 is a photograph showing display quality of a display device including a light-emitting element with a WTC structure.

Figure 23:
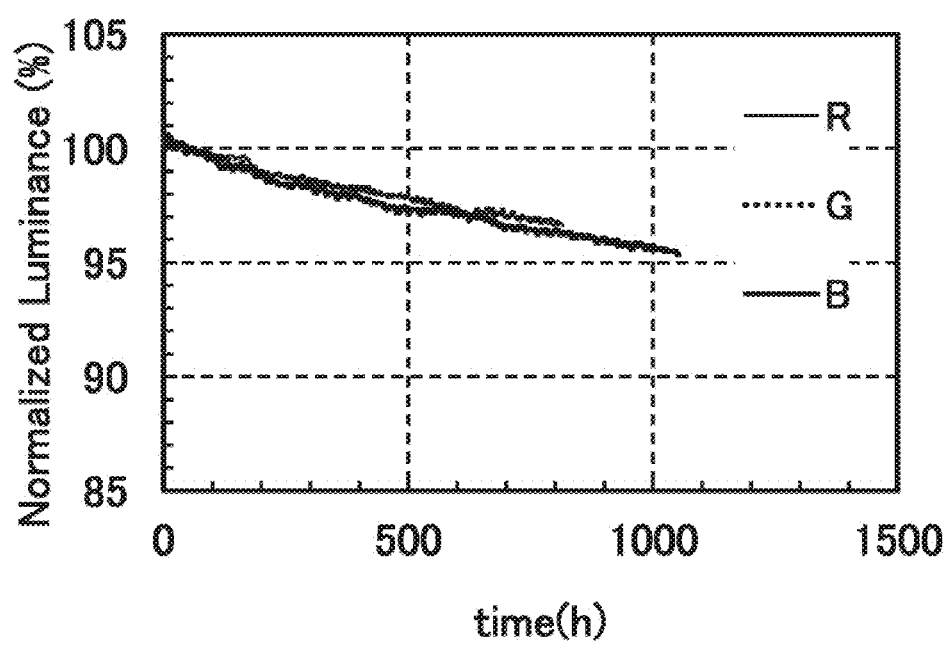
FIG. 23 is a graph showing changes over time in luminance, occurring in a light-emitting element of one embodiment.

FIG. 23 is a graph showing changes over time in luminance normalized with respect to initial luminance, which are recognized when a light-emitting element with a WTC structure emits light continuously.

<Organic EL Display>

Organic EL (organic light-emitting diode (OLED)) is a light-emitting element with a structure in which approximately submicron thin films including light-emitting organic materials (also referred to as an EL layer) are sandwiched between electrodes, and also is a planar light-emitting body.

Organic EL displays commercialized so far have been mainly manufactured by a side-by-side method using a metal mask such as a pixel mask (hereinafter, referred to as a separate coloring mask) in a film formation of an EL layer.

However, there is a limit on high resolution by the film formation method because it is difficult to form an opening with a pitch which is narrower than the thickness of the separate coloring mask. Moreover, there is a problem in that there is a limit on a larger metal mask and it is difficult to manufacture a high-resolution and large-screen display. Thus, small and middle-sized displays with a resolution less than or equal to 250 ppi are first commercialized, and it is said that the upper limit of the resolution of the panel actually manufactured is approximately 300 ppi.

Moreover, there are problems in that the use of the separate coloring mask makes it difficult to increase the yield in the manufacturing process and the manufacturing cost increases because the cost of a fine metal mask (FFM) increases as the resolution becomes high.

Furthermore, EL devices including a bottom emission display were initially on sale; however, in recent years, EL devices including a top emission have been mainly commercialized. A display with high color purity or an aperture considered, the top emission display is favorable to the small and middle-sized displays in the case where higher resolution and lower power consumption are planned.

Then, in order to develop a display which can have a high resolution and can achieve more power saving and a longer lifetime than the conventional organic EL displays without using the separate coloring mask, a WTC structure is developed. The WTC structure refers to a "white tandem, top emission and color filter" structure. The WTC structure is the same as that of a general white color filter method except that a white tandem is used in an OLED element. The EL device structure is a two-stack tandem structure of a blue light emitting unit and a green and red light emitting unit. A microcavity structure and a color filter are combined with the WTC structure, whereby a high-resolution panel can be manufactured without using the separate coloring mask.

FIG. 21A shows a WTC structure, and FIG. 21B shows a conceptual diagram of a substrate structure. A reflective electrode (anode), a transparent electrode, a B fluorescent unit, an intermediate layer, a G·R phosphorescent unit, a semi-transmissive metal film (cathode), and a color filter are sequentially stacked over a glass/FET.

With a top emission structure, the following advantages may be obtained. The high aperture can be kept without depending on a layout of an FET substrate, and a long lifetime of the panel can be achieved. In addition, with a cavity structure, luminance in the front direction increases, so that high efficiency can be achieved. Moreover, with a cavity structure and a color filter, a spectrum becomes sharp, and in addition, color purity becomes high because unnecessary wavelength light can be reduced by the color filter; thus, high color reproducibility can be achieved. As a result, the NTSC ratio can be 95% or more.

Table 1 shows specifications of display performance of a display device having a WTC structure and specifications of display performance of a display device manufactured by a side-by-side method. Table 2 shows specifications of a structure of a display device having a WTC structure and specifications of a structure of a display device manufactured by a side-by-side method.

TABLE 1

|  | WTC |
| --- | --- |
| Structure | White Tandem OLED + CF |
| Screen Size | 13.3 inch |
| Pixel Number | 7680 × RGB × 4320 |
| Definition | 664 ppi |
| Pixel Size | 12.75 μm × RGB × 38.25 μm |
| OLED Structure | White |
| Pixel Alignment | Stripe |
| Aperture Ratio | R = G = B = 44.3% |

TABLE 2

|  | WTC |
| --- | --- |
|  | White Tandem OLED + CF |
| Sealing | Hollow sealing |
| Polarizer | No polarizer |
| Color Filter | With color filter |
| Micro Cavity | With micro cavity (anode side) |
| Light Emission | Top emission |

TABLE 2-continued

| | WTC |
|---|---|
| Pixel Circuit Design | 5Tr + 1 C |
| Pixel FET | OS |

FIG. 22 is a photograph of a 13.3-inch display (the number of pixels: 7680×4320) having a resolution of 664 ppi with a WTC structure.

Table 3 shows characteristics of RGB elements in the WTC structure.

TABLE 3

| ×1 | Chromaticity (x, y) | Luminance (panel)×2 [cd/m$^2$] | Luminance (pixel)×3 [cd/m$^2$] | Current efficiency [cd/A] | Driving voltage [V] |
|---|---|---|---|---|---|
| R | (0.674, 0.325) | 77 | 655 | 16 | 6.6 |
| G | (0.273, 0.709) | 194 | 1667 | 65 | 6.5 |
| B | (0.136, 0.071) | 29 | 249 | 4.8 | 6.7 |
| W | (0.313, 0.329) | 300 | | | |

×1 Include transmitting properties of CF
×2 Luminance corresponding to all-white panel at 300 cd/m$^2$
×3 Intrinsic luminance at aperture ratio of 35%

In the case where the aperture is 35%, R pixels, G pixels, and B pixels emit light at luminance of approximately 650 cd/cm$^2$, approximately 1700 cd/cm$^2$, and approximately 250 cd/cm$^2$, respectively, whereby white luminance at chromaticity of D65 can be 300 cd/cm$^2$.

With the cavity structure and the color filter (also referred to as CF), high color purity can be obtained.

Table 4 also shows characteristics of RGB elements in the WTC structure.

TABLE 4

| | Luminance [cd/m$^2$] | Lifetime LT$_{95}$ [hr] |
|---|---|---|
| R (WTC) | 655 | 1,500 |
| G (WTC) | 1667 | 1,500 |
| B (WTC) | 249 | 1,200 |

The 5% decrease in the luminance of RGB elements can take 1000 hours or more (LT$_{95}$). This indicates that burn-in can be inhibited for more than one month (see FIG. 23 and Table 4).

This embodiment can be combined with any of the other embodiments in this specification as appropriate.

(Embodiment 7)

In this embodiment, description is given of an example of a flexible light-emitting device (light-emitting panel) that can be manufactured with the use of any of the stack manufacturing apparatuses described in Embodiments 2 and 3.

FIG. 24, FIG. 25, FIG. 26, FIG. 27 and FIG. 28 are photographs each showing the display quality of a flexible display panel including a light-emitting element with a WTC structure.

<Example 1 of Flexible Display>

Figure 24:
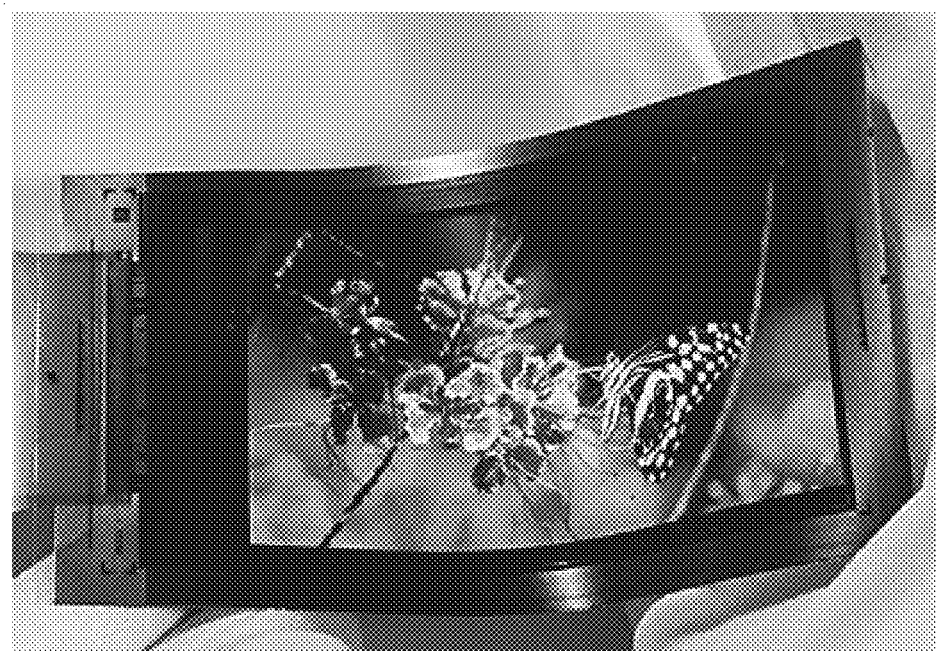
FIG. 24 is a photograph showing display quality of a light-emitting panel of one embodiment.

Specifications of an example of a flexible display panel including a light-emitting element with a WTC structure are shown in Table 5, and FIG. 24 is a photograph showing the display quality.

TABLE 5

| | Specification |
|---|---|
| Display Area | 42.12 mm(H) × 74.88 mm(V) |
| Resolution | 540 × RGB (H) × 960(V) |
| Pixel Density | 326 ppi |
| Aperture Ratio | 40% |
| Pixel Circuit | 2Tr + 1 C |
| Scan Driver | Integrated |
| Source Driver | Integrated |
| Light-emitting Structure | White tandam OLED + bottom emission + CF (WBC structure) |
| Counter Substrate | SUS Film |
| Thickness | Up to 100 μm |
| Weight | 2 g |

<Example 2 of Flexible Display>

Figure 25:
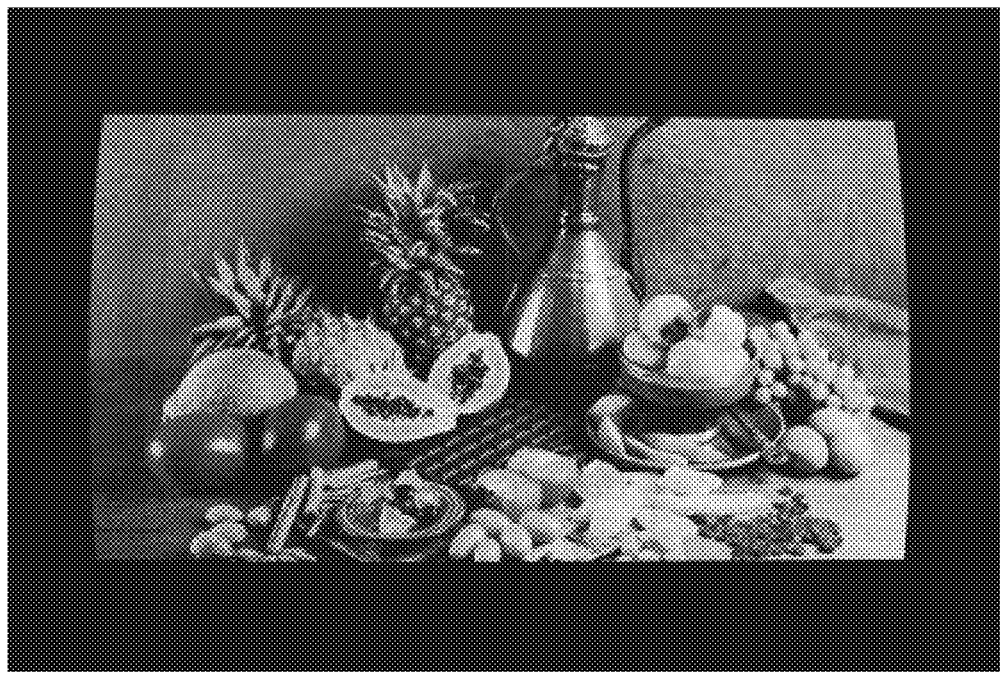
FIG. 25 is a photograph showing display quality of a light-emitting panel of one embodiment.

Specifications of an example of a flexible display panel including a light-emitting element with a WTC structure are shown in Table 6, and FIG. 25 is a photograph showing the display quality.

TABLE 6

| | Specification |
|---|---|
| Display Area | 299.5 mm(H) × 168.5 mm(V) |
| Resolution | 960 × RGB (H) × 540(V) |
| Pixel Density | 81.5 ppi |
| Aperture Ratio | 60% |
| Pixel Circuit | 6Tr + 1 C |
| Scan Driver | Integrated |
| Source Driver | COF |
| Light-emitting Structure | White tandam OLED + bottom emission + CF (WBC structure) |
| Counter Substrate | SUS Film |
| Thickness | Up to 100 μm |
| Weight | 18 g (not including FPC and COF) |

<Example 3 of Flexible Display>

Figure 26:
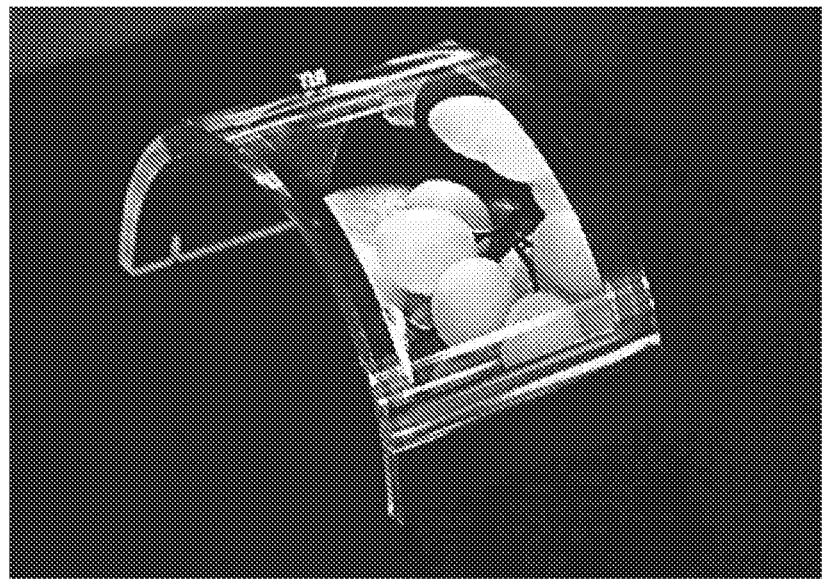
FIG. 26 is a photograph showing display quality of a light-emitting panel of one embodiment.
Figure 27:
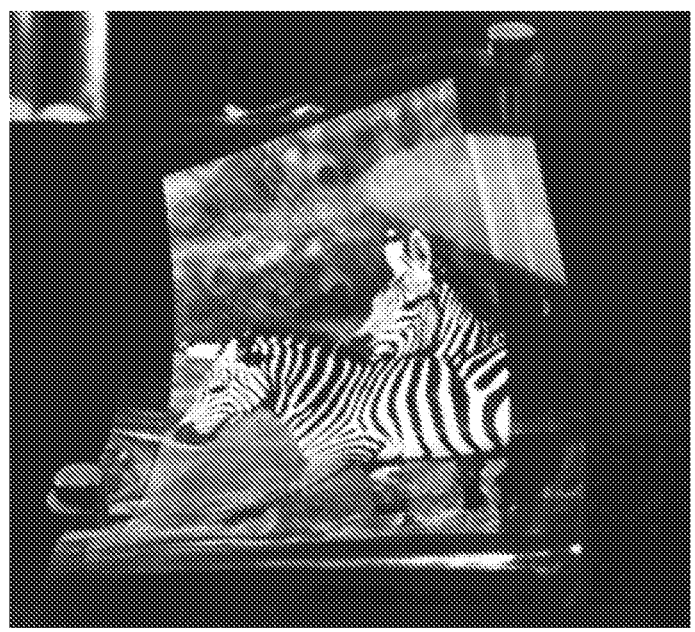
FIG. 27 is a photograph showing display quality of a light-emitting panel of one embodiment.
Figure 28:
FIG. 28 is a photograph showing display quality of a light-emitting panel of one embodiment.
Figure 28A:
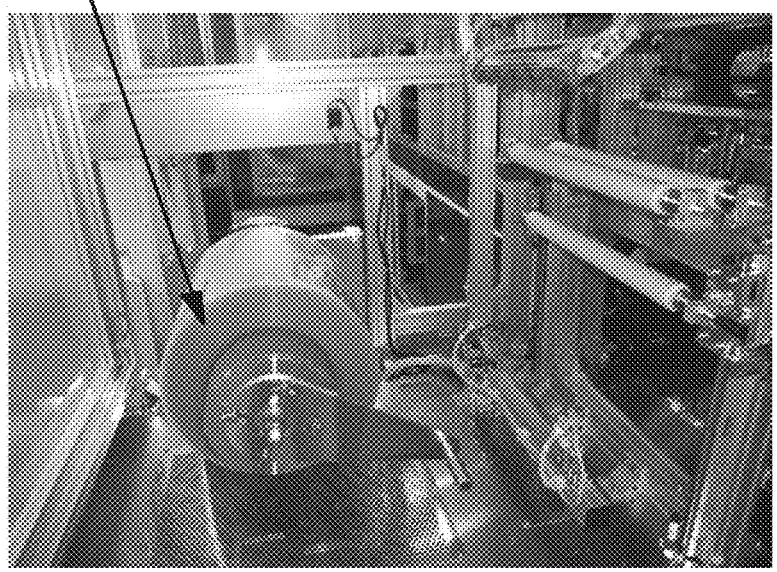
Figure 28B:
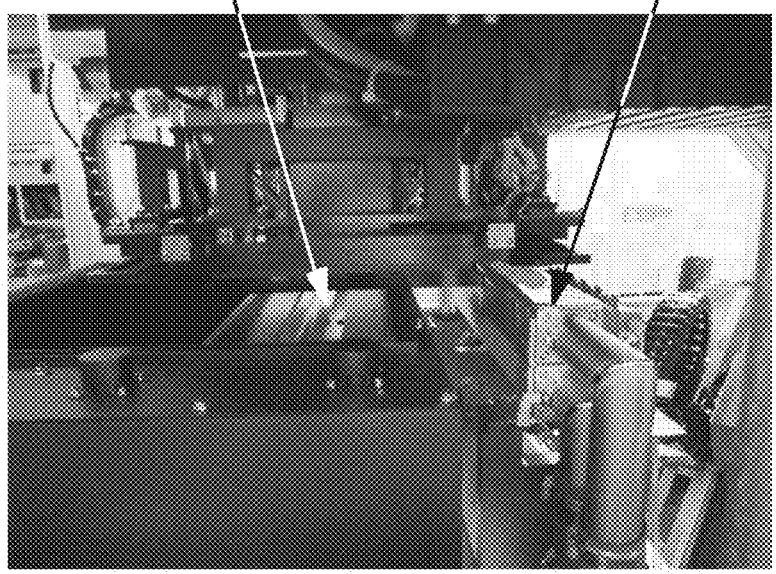

Specifications of an example of a flexible display panel including a light-emitting element with a WTC structure are shown in Table 7, and FIGS. 26 and 27 are photographs showing the display quality.

TABLE 7

| | Specification |
|---|---|
| Display Area | 42.12 mm(H) × 74.88 mm(V) |
| Resolution | 540 × RGB (H) × 960(V) |
| Pixel Density | 326 ppi |
| Aperture Ratio | 57% |
| Pixel Circuit | 2Tr + 1 C |
| Scan Driver | Integrated |
| Source Driver | Integrated |
| Light emitting Structure | White tandam OLED + top emission + CF (WBC structure) |
| Counter Substrate | SUS Film |
| Thickness | Up to 100 μm |
| Weight | 2 g |

<Example 4 of Flexible Display>

Specifications of an example of a flexible display panel including a light-emitting element with a WTC structure are shown in Table 8, and FIG. 27 is a photograph showing the display quality.

TABLE 8

| | Specification |
|---|---|
| Display Area | 299.5 mm(H) × 168.5 mm(V) |
| Resolution | 3840 × RGB (H) × 2160(V) |
| Pixel Density | 326 ppi |
| Aperture Ratio | 55.80% |
| Pixel Circuit | 5Tr + 1 C |
| Scan Driver | Integrated |
| Source Driver | COF |
| Light emitting Structure | White tandam OLED + top emission + CF (WBC structure) |
| Thickness | Up to 300 μm(including protective film) |
| Weight | Up to 30 g(including protective film, not including FPC and COF) |

This embodiment can be combined with any of the other embodiments in this specification as appropriate.

<Example of Support Supply Apparatus>

A method for supplying a support by a support supply apparatus is described. Here, a film is used as a support.

In a first step, a film is unwound from a rolled film, and is cut so that the film has a predetermined length for a bonding unit.

The support is sandwiched between two separators.

In a second step, the film stands in a film stock chamber. The process proceeds to a third step based on a timing (transfer instruction) signal supplied by the bonding unit.

In the third step, a slit is formed while a separator in a bottom portion is left; thus, a separation trigger is formed.

In a fourth step, a separator in a bottom portion is peeled.

In a fifth step, a US cleaner irradiates the support with ultrasonic waves and suctions the atmosphere while blowing compressed air; thus, foreign substances can be removed.

In a sixth step, a UV irradiation apparatus irradiates the support with ultraviolet rays and ozone, so that wettability of the surface and the like is improved.

In a seventh step, the support is supplied to a bonding chamber or the like.

This embodiment can be combined with any of the other embodiments in this specification as appropriate.

(Embodiment 9)

In this embodiment, manufacturing processes of a flexible light-emitting device (light-emitting panel) using a stack manufacturing apparatus of one embodiment of the present invention are described with reference to FIG. 29, FIG. 30, FIG. 31, and FIG. 32.

Figure 29:
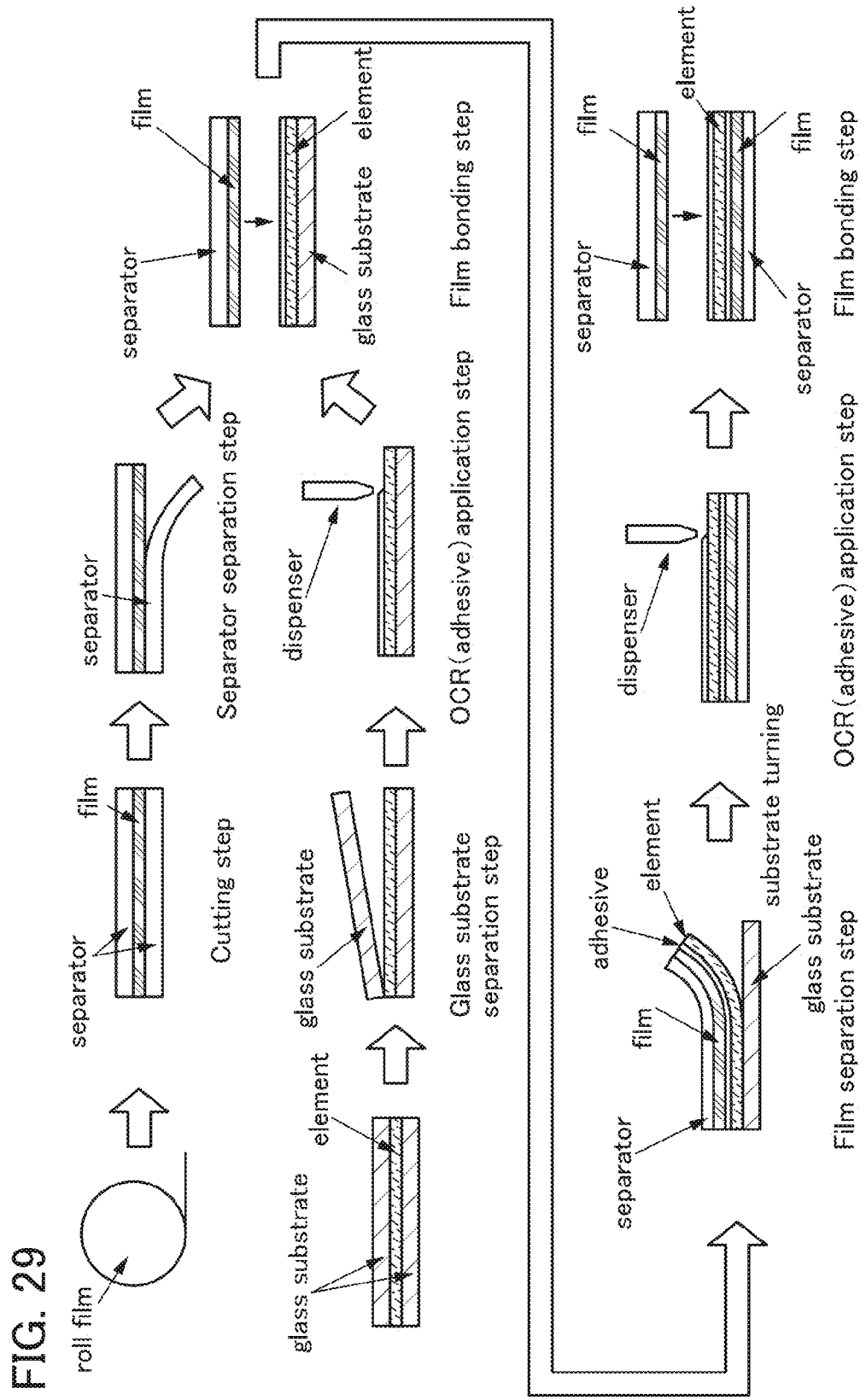
FIG. 29 illustrates a manufacturing process of a flexible light-emitting panel of one embodiment.

FIG. 29 illustrates a process for separating a functional element formed over a glass substrate and transferring it to a film with an optical clear resin (OCR).

Figure 30:
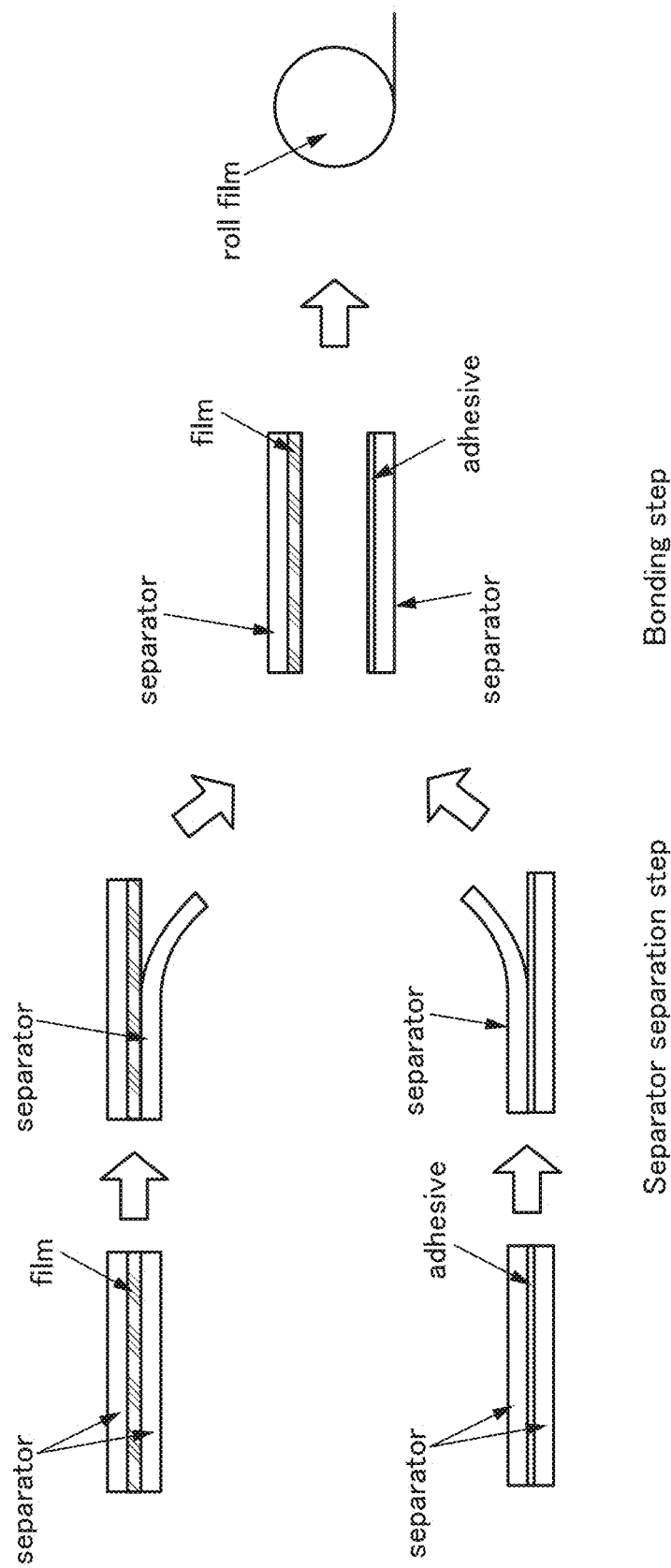
FIG. 30 illustrates a process of rolling up a film of one embodiment on which an OCA is formed.

FIG. 30 illustrates a process for bonding an optical clear adhesive (OCA) to a film and rolling up the film.

Figure 31:
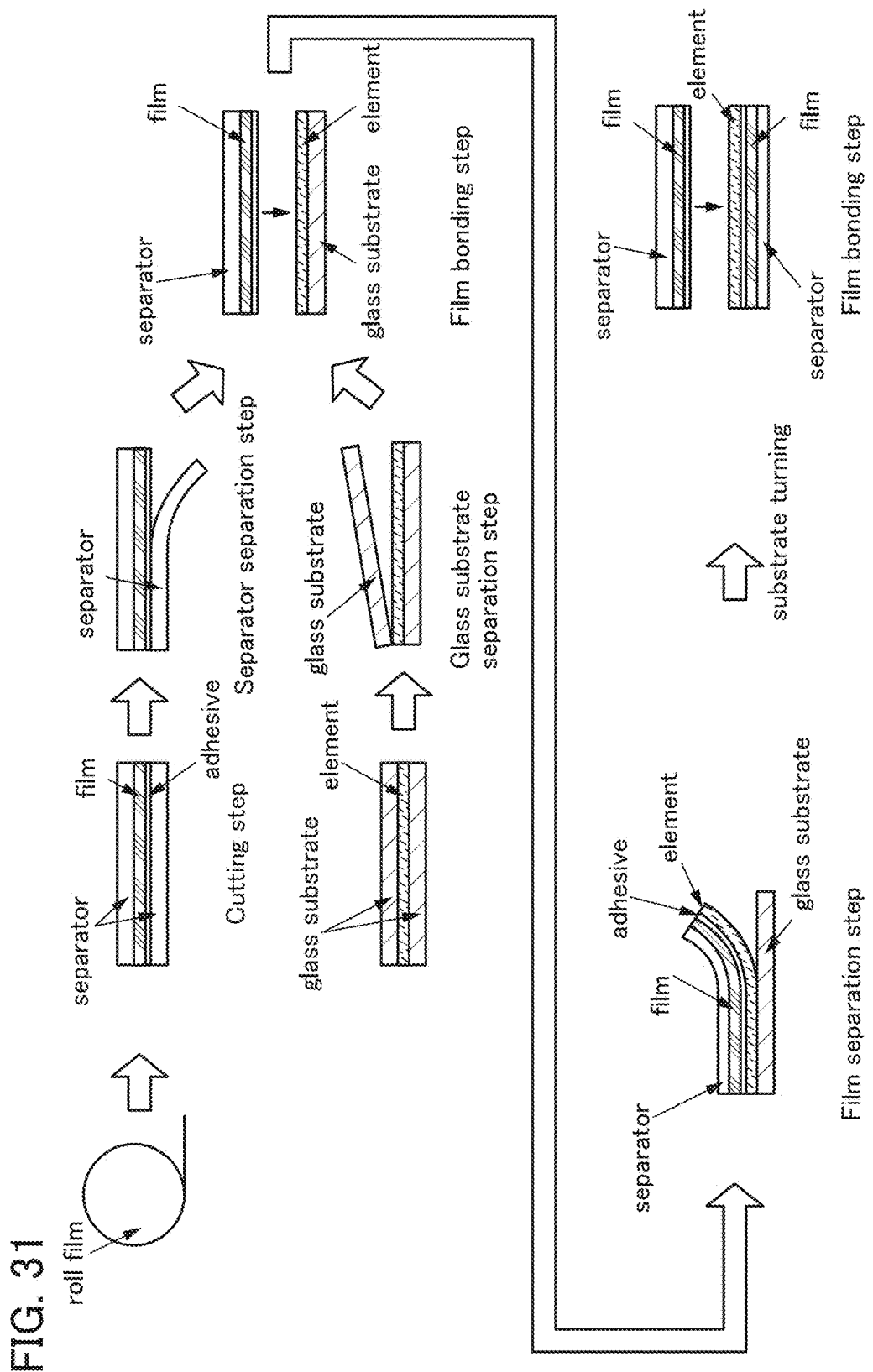
FIG. 31 illustrates a manufacturing process of a flexible light-emitting panel of one embodiment.

FIG. 31 illustrates a process for separating a functional element formed over a glass substrate and transferring it to a film with an OCA.

Figure 32:
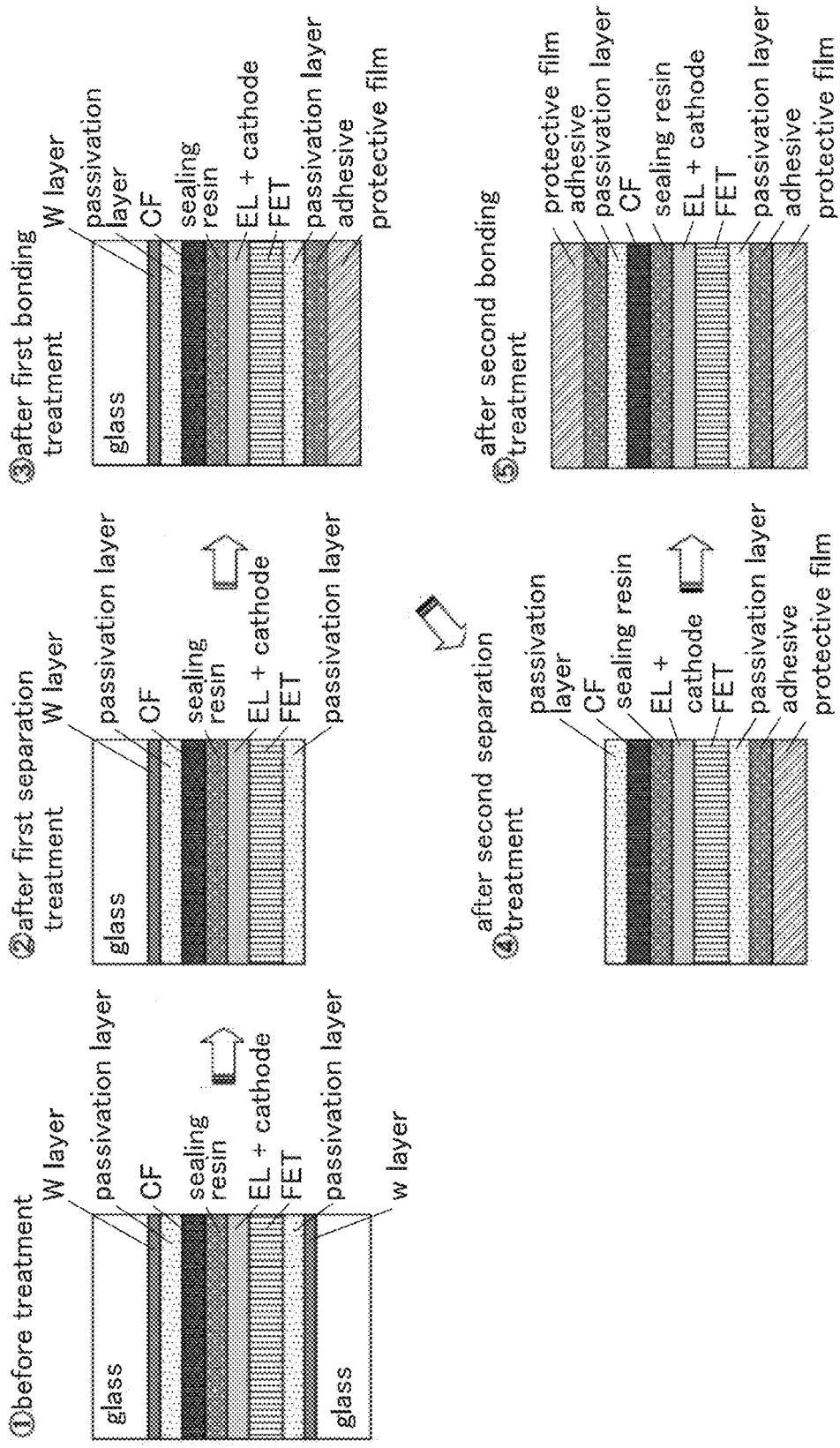
FIG. 32 illustrates a manufacturing process of a flexible light-emitting panel of one embodiment.

FIG. 32 illustrates a process for separating a functional element formed over a glass substrate and transferring it to a film.

<Schematic Structure of Device>

A device for separating a functional element formed over a glass substrate and transferring it to a film without destruction is referred to as a transfer technology (TT) apparatus.

With the TT apparatus, the yield can be increased. For example, by changing a substrate which has a size of 300 mm×360 mm or some of components of the TT apparatus, an element formed over a substrate which has a size of 320 mm×400 mm can be separated and transferred.

For example, one substrate over which a functional element is formed can be subjected to treatment in 10 minutes. As a result, approximately 4000 or more substrates can be subjected to treatment per month.

Suppose that the device operates for 28 days per month and is maintained and serviced for two or three days.

The clean degree in the device is class 100 and an ionizer is provided in each processing unit, whereby electric charges in the substrate in transporting or separating can be removed.

<Process Using Optical Clear Resin>

FIG. 29 illustrates a process in the case of using an OCR.

<<Cutting Step>>

From the rolled film which is rolled up in the state where a film is sandwiched between a pair of separators, the film is unwound together with the pair of separators, and a film with a length used in a bonding unit is cut out.

<<Separator Separation Step>>

One of the pair of separators is separated to expose one of the surfaces of the film.

<<Glass Substrate Separation Step>>

A first glass substrate in which a first separation layer and a first layer to be separated are formed in this order is bonded to a second glass substrate in which a second separation layer and a second layer to be separated are formed in this order so that the first layer to be separated and the second layer to be separated face each other, whereby a processed substrate is prepared. Then, one glass substrate of the processed substrate is separated from one of the layers to be separated.

Note that, for example, one of the first layer to be separated and the second layer to be separated includes a light-emitting element, and the other thereof includes a color filter.

<<Adhesive Application Step>>

An adhesive is applied to a surface that was in contact with the separated glass substrate using a dispenser or the like.

<<Film Bonding Step>>

The processed substrate after the adhesive application step and the film after the separator separation step are bonded to each other with the adhesive.

<<Film Separation Step>>

The processed substrate in which the separator, the film, the adhesive, the first layer to be separated, the second layer to be separated, and the other glass substrate are bonded in this order is prepared, and the other glass substrate is separated from the other of the layers to be separated.

<<Adhesive Application Step>>

An adhesive is applied to a surface that was in contact with the separated glass substrate using a dispenser or the like.

<<Film Bonding Step>>

The processed substrate after the adhesive application step and the film after the separator separation step are bonded to each other with the adhesive.

<Process Using Adhesive>

FIG. 30 illustrates a process for rolling up a film to which an adhesive is applied. Note that, for example, an OCA can be used as the adhesive.

<<Separator Separation Step>>

One of the pair of separators between which the film is sandwiched is separated to expose one of the surfaces of the film.

One of the pair of separators between which the adhesive is sandwiched is separated to expose one of the surfaces of the adhesive.

<<Bonding Step>>

The film after the separator separation step and the adhesive are bonded to each other.

<Process Using Optical Clear Adhesive>

FIG. 31 illustrates a process in the case of using an OCA.

The process using an OCA is simpler than the process using an OCR.

<<Cutting Step>>

From the rolled film which is rolled up in the state where the film with the adhesive is sandwiched between the pair of separators, the film with the adhesive is unwound together with the pair of separators, and a film with the adhesive with a length used in a bonding unit is cut out.

<<Separator Separation Step>>

One of the pair of separators, which is in contact with the adhesive, is separated to expose the adhesive.

<<Glass Substrate Separation Step>>

A first glass substrate in which a first separation layer and a first layer to be separated are formed in this order is bonded to a second glass substrate in which a second separation layer and a second layer to be separated are formed in this order so that the first layer to be separated and the second layer to be separated face each other, whereby a processed substrate is prepared. Then, one of the glass substrates is separated from one of the layers to be separated.

Note that, for example, one of the first layer to be separated and the second layer to be separated includes a light-emitting element, and the other thereof includes a color filter.

<<Film Bonding Step>>

The processed substrate and the film with the adhesive after the separator separation step are bonded to each other with the adhesive.

<<Film Separation Step>>

The processed substrate in which the separator, the film, the adhesive, the first layer to be separated, the second layer to be separated, and the other glass substrate are bonded in this order is prepared, and the other glass substrate is separated from the other of the layers to be separated.

<<Film Bonding Step>>

The film after the separator separation step is bonded to the surface of the processed substrate that was is in contact with the separated glass substrate with an adhesive.

<Manufacturing Process of Flexible Light-Emitting Panel>

FIG. 32 illustrates a manufacturing process of a flexible light-emitting panel.

<<Before Treatment>>

A processed substrate includes a glass substrate, a layer containing tungsten (W layer), a passivation layer, a layer including a transistor (FET), a layer including a light-emitting element (EL and cathode), a sealing resin layer, a color filter (CF), a passivation layer, a layer containing tungsten (W layer), and a glass substrate in this order.

<<After First Separation Treatment>>

The processed substrate from which one of the glass substrates is separated includes the passivation layer, the layer including the transistor (FET), the layer including the light-emitting element (EL and cathode), the sealing resin layer, the color filter (CF), the passivation layer, the layer containing tungsten (W layer), and the glass substrate in this order.

<<After First Bonding Treatment>>

The processed substrate one side of which is bonded to a film includes the protective film, an adhesive, the passivation layer, the layer including a transistor (FET), the layer including the light-emitting element (EL and cathode), the sealing resin layer, the color filter (CF), the passivation layer, the layer containing tungsten (W layer), and the glass substrate in this order.

<<After Second Separation Treatment>>

The processed substrate from which the other of the glass substrates is separated includes the protective film, the adhesive, the passivation layer, the layer including a transistor (FET), the layer including the light-emitting element (EL and cathode), the sealing resin layer, the color filter (CF), and the passivation layer in this order.

<<After Second Bonding Treatment>>

The processed substrate the other side of which is bonded to a film includes the protective film, the adhesive, the passivation layer, the layer including the transistor (FET), the layer including the light-emitting element (EL and cathode), the sealing resin layer, the color filter (CF), the passivation layer, an adhesive, and a protective film in this order. In this manner, a light-emitting panel is fabricated.

This embodiment can be combined with any of the other embodiments in this specification as appropriate.

(Embodiment 10)

In this embodiment, a manufacturing method of a stack of one embodiment of the present invention is described with reference to FIGS. 33A1, 33A2, 33B1, 33B2, 33C1, 33C2, 33D1, and 33D2, FIGS. 34A1, 34A2, 34B1, and 34B2, and FIGS. 35A1, 35A2, 35B1, 35B2, 35C1, 35C2, 35D1, and 35D2. Note that some of the components are not illustrated for easy understanding in some cases.

FIGS. 33A1, 33A2, 33B1, 33B2, 33C1, 33C2, 33D1, and 33D2, and FIGS. 34A1, 34A2, 34B1, and 34B2 are top views illustrating methods for manufacturing one stack or a plurality of stacks from one processed member of one embodiment of the present invention.

FIGS. 35A1, 35A2, 35B1, 35B2, 35C1, 35C2, 35D1, and 35D2 illustrate a manufacturing method of a stack including an opening of one embodiment of the present invention.

<Method for Manufacturing Stack>

The manufacturing method of a stack described in this embodiment is different from the manufacturing method of a stack in Embodiment 3 in that a plurality of stacks is manufactured from one processed member. Different steps will be described in detail below, and the above description is referred to for the similar steps.

With such a method, stacks having various sizes can be manufactured from processed members having various sizes.

Specifically, a stack including a 3.4-inch display panel can be manufactured using a glass substrate with a size of 126.6 mm×126.6 mm. Alternatively, a stack including a 13.5-inch display panel can be manufactured using a glass substrate with a size of 300 mm×360 mm.

Further alternatively, a stack in which four 3.4-inch display panels are placed or a stack in which two 5.9-inch display panels are placed can be manufactured using a glass substrate with a size of 300 mm×360 mm. Note that the stack in which a plurality of display panels is placed can be divided, so that a plurality of display panels can be manufactured from one stack.

<<First Step>>

A processed member 90(1) used for manufacturing a stack 92(1) is prepared. A structure of the processed member 90(1) is described with reference to FIGS. 33A1 and 33B1.

A processed member 90(2) used for manufacturing a stack 92(2) is prepared. A structure of the processed member 90(2) is described with reference to FIGS. 33A2 and 33B2.

The processed member 90(1) is formed by bonding a structure on the left side and a structure on the right side of FIG. 33A1 with a bonding layer (not illustrated) (see FIG. 33B1).

Specifically, the processed member 90(1) is formed by bonding a structure in which the first substrate 11, the first separation layer (not illustrated) formed over the first substrate 11, and a first layer 13(1) to be separated (hereinafter simply referred to as a first layer 13(1)) whose one surface is in contact with the first separation layer are stacked (see the left side of FIG. 33A1) and a structure in which the second substrate 21, the second separation layer (not illustrated) formed over the second substrate 21, and a second layer 23(1) to be separated (hereinafter simply referred to as a second layer 23(1)) whose one surface is in contact with the second separation layer are stacked (see the right side of FIG. 33A1) with the adhesive layer (see FIG. 33B1).

The processed member 90(2) is formed by bonding a structure on the left side and a structure on the right side of FIG. 33A2 with a bonding layer (not illustrated) (see FIG. 33B2).

Specifically, the processed member 90(2) is formed by bonding a structure in which the first substrate 11, the first separation layer (not illustrated) formed over the first substrate 11, and a first layer 13(2) to be separated (hereinafter simply referred to as a first layer 13(2)) whose one surface is in contact with the first separation layer are stacked (see the left side of FIG. 33A2) and a structure in which the second substrate 21, the second separation layer (not illustrated) formed over the second substrate 21, and a second layer 23(2) to be separated (hereinafter simply referred to as a second layer 23(2)) whose one surface is in contact with the second separation layer are stacked (see the right side of FIG. 33A2) with the adhesive layer (see FIG. 33B2).

The processed member 90(2) is different from the processed member 90(1) in the following two points.

The first different point is that the first layer 13(2) includes a plurality of functional layers separated by a space and conductive layers 13b(2) electrically connected to the respective functional layers and the first layer 13(1) includes one functional layer and a conductive layer 13b(1) electrically connected to the functional layer.

The second different point is that the second layer 23(2) includes a plurality of functional layers 23b(2) separated by the space and the second layer 23(1) includes one functional layer 23b(1).

The conductive layer 13b(1) or the conductive layers 13b(2) can be used as a terminal supplied with a signal or a terminal supplying a signal, for example. Moreover, the conductive layer 13b(1) or the conductive layers 13b(2) can be supplied with a signal or can supply a signal.

The space which separates the plurality of functional layers 23b(2) in the second layer 23(2) are placed to overlap with the space which separates the plurality of functional layers in the first layer 13(2) and the space which separates the conductive layers 13b(2).

Furthermore, in each of the processed member 90(1) and the processed member 90(2), separation triggers 13s are provided in the vicinity of the end portions of the bonding layer that is not illustrated.

<<Second Step>>

A surface layer including the first substrate 11 of each of the processed member 90(1) and the processed member 90(2) is separated to obtain a first remaining portion (not illustrated).

<<Third Step>>

The first adhesive layer (not illustrated) is formed on each first remaining portion and the first remaining portion is bonded to the first support (not illustrated) with the first adhesive layer. Through this step, the stacks 91(1) and 91(2) are obtained.

Specifically, the stack 91(1) including the first support, the first adhesive layer, the first layer 13(1), the bonding layer whose one surface is in contact with the first layer 13(1), the second layer 23(1) whose one surface is in contact with the other surface of the bonding layer, the second separation layer whose one surface is in contact with the other surface of the second layer 23(1), and the second substrate 21 in this order is obtained (see FIG. 33C1).

Furthermore, the stack 91(2) including the first support, the first adhesive layer, the first layer 13(2), the bonding layer whose one surface is in contact with the first layer 13(2), the second layer 23(2) whose one surface is in contact with the other surface of the bonding layer, the second separation layer whose one surface is in contact with the other surface of the second layer 23(2), and the second substrate 21 in this order is obtained (see FIG. 33C2).

<<Sixth Step>>

Part of the second layer 23(1) in the vicinity of the end portion of the first adhesive layer of the stack 91(1) is separated from the second substrate 21(1) to form the second separation trigger (not illustrated).

Part of the second layer 23(2) in the vicinity of the end portion of the first adhesive layer of the stack 91(2) is separated from the second substrate 21(2) to form the second separation trigger (not illustrated).

<<Seventh Step>>

The second remaining portion (not illustrated) is obtained by being separated from each of the stacks 91(1) and 91(2).

<<Modification Example of Ninth Step>>

The second adhesive layer (not illustrated) is formed on the second remaining portion. The second remaining portion is bonded to each of the second support 42(1) and the second support 42(2) with the second adhesive layer, so that the stack 92(1) and the stack 92(2) are obtained.

Note that the second support 42(1) may have a size with which part of the second layer 23(1) is exposed (see FIG. 33D1). The second support 42(2) may have a size with which part of the second layer 23(2) is exposed (see FIG. 33D2).

Specifically, the stack 92(1) including the first support, the first adhesive layer, the first layer 13(1), the bonding layer whose one surface is in contact with the other surface of the first layer 13(1), the second layer 23(1) whose one surface is in contact with the other surface of the bonding layer, and the second support 42(1) in this order is obtained (see FIG. 33D1).

Specifically, the stack 92(2) including the first support, the first adhesive layer, the first layer 13(2), the bonding layer whose one surface is in contact with the other surface of the first layer 13(2), the second layer 23(2) whose one surface is in contact with the other surface of the bonding layer, and the second support 42(2) in this order is obtained (see FIG. 33D2).

With a method described later, an opening exposing the conductive layer 13b(1) may be provided in the second layer 23(1) of the stack 92(1), and an opening exposing the conductive layer 13b(2) may be provided in the second layer 23(2) of the stack 92(2) (see FIGS. 34A1 and 34A2). In particular, the size of the second support 42(1) or the second support 42(2) and the position where the second support 42(1) or the second support 42(2) is bonded may be determined so that the position where the opening is provided is exposed.

Furthermore, the second support 42(1) may be cut so that the stack 92(1) has a predetermined size (see FIG. 34B1).

The positions where the space separating the plurality of functional layers 23b(2) of the second layer 23(2), the space separating the functional layers in the first layer 13(2), and the space separating the conductive layers 13b(2) overlap with each other are cut, so that a plurality of stacks 92(3) including the functional layers can be manufactured from the one stack 92(2) (see FIG. 34B2).

For example, in the case where four stacks 92(3) are manufactured from one stack 92(2), two second supports 42b(2) separated in a belt shape may be used. The second supports 42b(2) can be bonded to the second layers 23(2) easily. Alternatively, the second supports 42b(2) divided into four may be used or the second supports 42b(2) which is not divided may be used.

For example, in the case where the light-emitting panel with the WTC structure described in Embodiment 6 is manufactured using this method, the pixel on the FET substrate side and the color filter of the CF substrate side need to be positioned and bonded to each other so that the pixel and the color filter overlap with each other accurately. When the processed member becomes larger, by the influence of the bend or the like, the thickness of the bonding layer, the first adhesive layer, or the second adhesive layer may be not uniform in some cases. Furthermore, part of the films included in the stack may be peeled due to a dust or the like mixed into the stack in the process of bonding in some cases. The larger the processed member becomes, the easier the dust or the like is mixed into the stack; thus, the dust or the like in the manufacturing apparatus needs to be reduced.

For example, the manufacturing process of the light-emitting panel can be divided into three processes.

The separation of the substrate on the FET substrate and bonding of the first support, that is, the first step to the third step, correspond to a first separation process.

The separation of the substrate on the CF substrate and bonding of the second support, that is, the fourth step to the modification example of the ninth step, correspond to a second separation process.

Formation of the opening reaching the conductive layer on the FET substrate side and connecting an FPC to the FET substrate with an anisotropic conductive film correspond to an FPC connection process.

Table 9 shows yield for each process in the case where two 5.3-inch flexible display devices with the WTC structure were manufactured from one stack using a first substrate and a second substrate each having a size of 300 mm×360 mm. Note that Table 9 shows the case where 76 display devices (obtained from 38 substrates) were manufactured.

TABLE 9

| Process | 1st transfer | 2nd transfer | Exposing FPC | Total |
|---|---|---|---|---|
| Yield | 92.10% (70/76) | 91.40% (64/70) | 100.00% (64/64) | 84.20% (64/76) |

Yield for each process was 90% or higher. The total yield was 84%. A peeling of the organic film triggered by a foreign substrate is the major defect observed in the first and second separation processes.

<Manufacturing Method of Stack Including Opening>

A manufacturing method of a stack described in this embodiment is different from that described in Embodiment 3 in that a step of forming an opening is included.

The different steps will be described in detail below, and the above description is referred to for the similar steps.

A manufacturing method of a stack including an opening is described with reference to FIGS. 35A1, 35A2, 35B1, 35B2, 35C1, 35C2, 35D1, and 35D2.

FIGS. 35A1, 35A2, 35B1, 35B2, 35C1, 35C2, 35D1, and 35D2 illustrate the manufacturing method of a stack including an opening which exposes part of a layer to be separated. In FIGS. 35A1, 35A2, 35B1, 35B2, 35C1, 35C2, 35D1, and 35D2, cross-sectional views of a structure of a stack are illustrated on the left side, and top views corresponding to the cross sectional views are illustrated on the right side.

FIGS. 35A1, 35A2, 35B1, and 35B2 illustrate a method for manufacturing a stack 92c having an opening by using a second support 42b which is smaller than the first support 41b.

FIGS. 35C1, 35C2, 35D1, and 35D2 illustrate a method for manufacturing a stack 92d having an opening formed in the second support 42. <<Example 1 of Manufacturing Method of Stack Including Opening>>

A manufacturing method of a stack has the same step as the above ninth step except that the second support 42b which is smaller than the first support 41b is used instead of the second support 42. By the manufacturing method, a stack in which part of the second layer 23 is exposed can be manufactured (see FIGS. 35A1 and 35A2).

A liquid adhesive can be used as the second adhesive layer 32. Alternatively, an adhesive whose fluidity is inhibited and which is formed in a single wafer shape in advance (also referred to as a sheet-like adhesive) can be used. By using the sheet-like adhesive, the amount of part of the second adhesive layer 32 that extends beyond the second support 42b can be small. In addition, the second adhesive layer 32 can have uniform thickness easily.

Alternatively, part of the exposed part of the second layer 23 is cut off, and the first layer 13 may be exposed (see FIGS. 35B1 and 35B2).

Specifically, with a blade or the like which has a sharp tip, a slit is formed in the exposed second layer 23. Then, for example, an adhesive tape or the like is attached to part of the exposed second layer 23 to concentrate stress near the slit, and the part of the exposed second layer 23 is separated together with the attached tape or the like, whereby the part of the second layer 23 can be selectively removed.

Moreover, a layer which can suppress the bonding power of the bonding layer 30 to the first layer 13 may be selectively formed on part of the first layer 13. For example, a material which is not easily bonded to the bonding layer 30 may be selectively formed. Specifically, an island-shaped organic material may be deposited. Thus, part of the bonding layer 30 can be selectively removed together with the second layer 23 easily. As a result, the first layer 13 can be exposed.

Note that for example, in the case where the first layer 13 includes a functional layer and the conductive layer 13b electrically connected to the functional layer, the conductive layer 13b can be exposed in an opening in the second stack 92c. Thus, the conductive layer 13b exposed in the opening can be used as a terminal supplied with a signal.

As a result, the conductive layer 13b part of which is exposed in the opening can be used as a terminal that can extract a signal supplied by the functional layer. Alternatively, the conductive layer 13b can be used as a terminal that can be supplied with a signal from an external device.

<<Example 2 of Manufacturing Method of Stack Including Opening>>

A mask 48 having an opening formed to overlap with an opening formed in the second support 42 is formed on the stack 92. Next, a solvent 49 is dropped into the opening in the mask 48. Thus, with the solvent 49, the second support 42 exposed in the opening in the mask 48 can be swelled or dissolved (see FIGS. 35C1 and 35C2).

After the extra solvent 49 is removed, stress is applied by rubbing the second support 42 exposed in the opening in the mask 48 or the like. Thus, the second support 42 or the like in a portion overlapping with the opening in the mask 48 can be removed.

Moreover, with a solvent with which the bonding layer 30 is swelled or dissolved, the first layer 13 can be exposed (see FIGS. 35D1 and 35D2).

This embodiment can be combined with any of the other embodiments in this specification as appropriate.

(Embodiment 11)

In this embodiment, a structure of a flexible input/output device that can be manufactured using any of the stack manufacturing apparatuses described in Embodiments 2 and 3 is described with reference to FIGS. 36A to 36C.

Figure 36A:
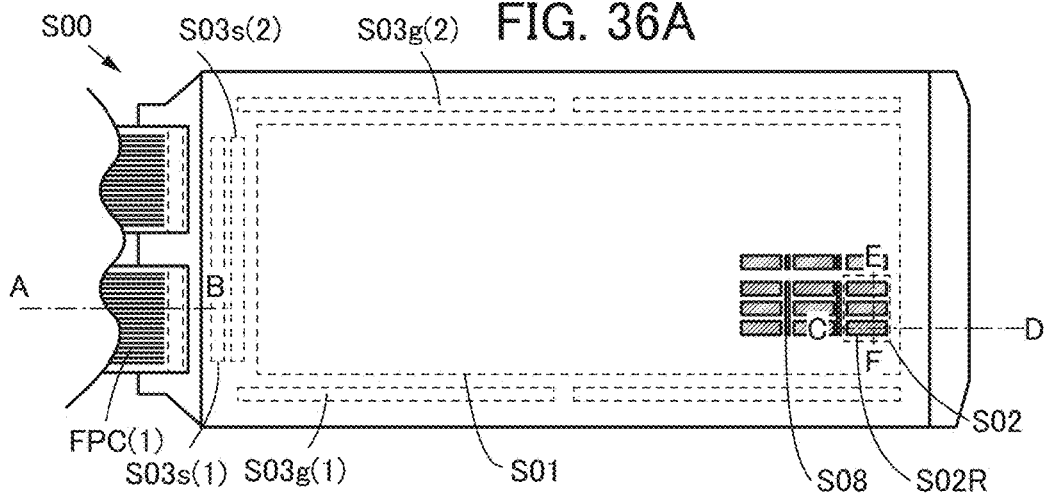
FIGS. 36A to 36C illustrate a structure of a flexible input/output device that can be manufactured using a manufacturing apparatus of one embodiment.

FIG. 36A is a top view illustrating the structure of an input/output device that can be used in a data processor according to one embodiment of the present invention.

Figure 36B:
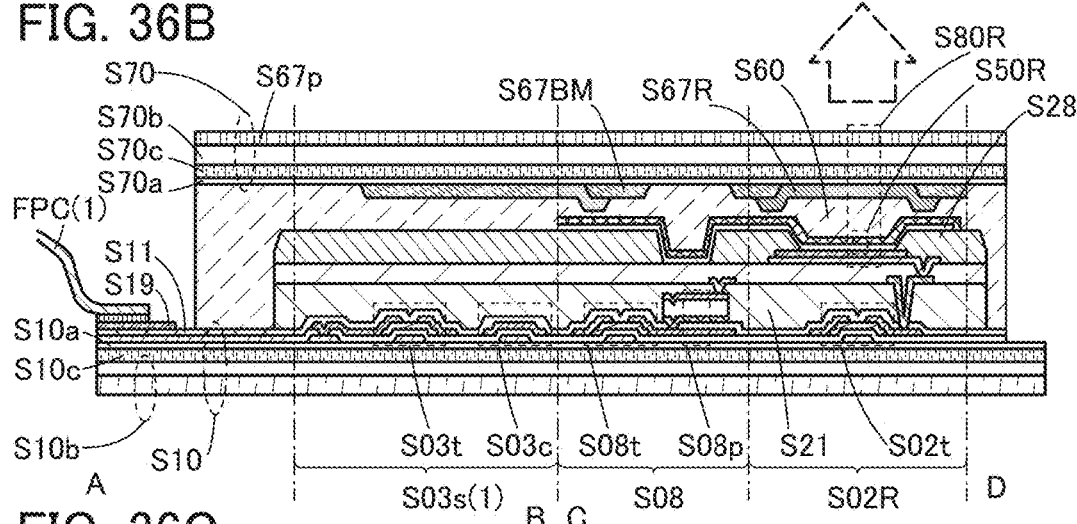

FIG. 36B is a cross-sectional view taken along section line A-B and section line C-D in FIG. 36A.

Figure 36C:
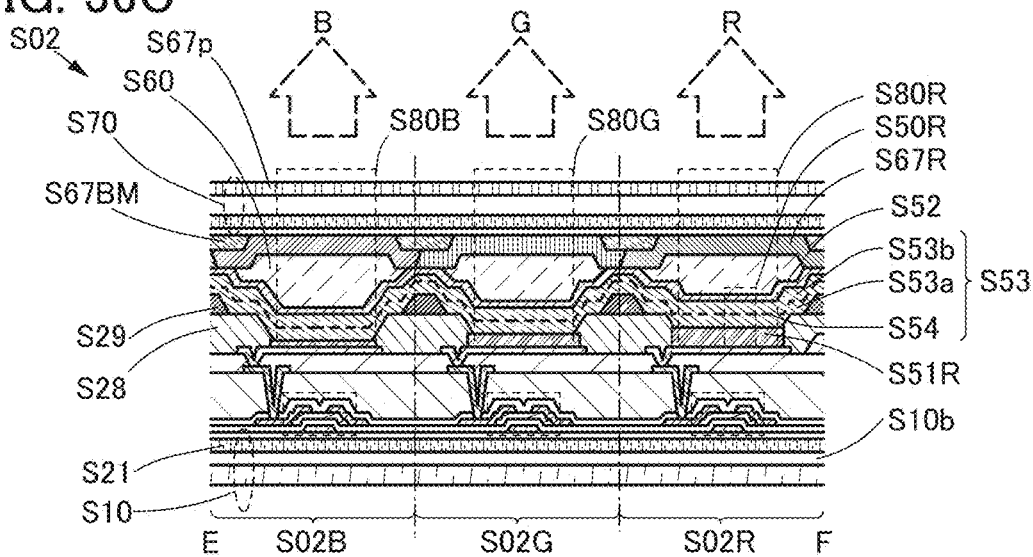

FIG. 36C is a cross-sectional view taken along section line E-F in FIG. 36A.

<Top View>

An input/output device S00 illustrated in this embodiment includes a display area S01 (see FIG. 36A).

The display area S01 includes a plurality of pixels S02 and a plurality of imaging pixels S08. The imaging pixels S08 can sense a touch of a finger or the like on the display area S01. Thus, a touch sensor can be formed using the imaging pixels S08.

Each of the pixels S02 includes a plurality of subpixels (e.g., a subpixel S02R). The subpixel includes a light-emitting element and a pixel circuit that can supply power for driving the light-emitting element.

The pixel circuit is electrically connected to a wiring through which a selection signal can be supplied and a wiring through which an image signal can be supplied.

The input/output device S00 further includes a scan line driver circuit S03g(1) that can supply a selection signal to the pixel S02 and an image signal line driver circuit S03s(1) that can supply an image signal to the pixel S02.

The imaging pixel S08 includes a photoelectric conversion element and an imaging pixel circuit that drives the photoelectric conversion element.

The imaging pixel circuit is electrically connected to a wiring through which a control signal can be supplied and a wiring through which a power supply potential can be supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The input/output device S00 includes an imaging pixel driver circuit S03g(2) that can supply a control signal to the imaging pixel S08 and an imaging signal line driver circuit S03s(2) that reads an imaging signal.

<Cross-Sectional View>

The input/output device S00 includes a substrate S10 and a counter substrate S70 facing the substrate S10 (see FIG. 36B).

The substrate S10 is a stacked body including a flexible substrate S10b, a barrier film S10a that prevents diffusion of an unintentional impurity to the light-emitting element, and an adhesive layer S10c that bonds the substrate S10b to the barrier film S10a.

The counter substrate S70 is a stacked body including a flexible substrate S70b, a barrier film S70a that prevents diffusion of an unintentional impurity to the light-emitting element, and an adhesive layer S70c that bonds the substrate S70b to the barrier film S70a (see FIG. 36B).

A sealant S60 bonds the counter substrate S70 to the substrate S10. The sealant S60 has a refractive index higher than that of air serves as an optical adhesive layer. The pixel circuit and the light-emitting element (e.g., a first light-emitting element S50R) are provided between the substrate S10 and the counter substrate S70.

<Pixel Structure>

The pixel S02 includes a subpixel S02R, a subpixel S02G, and a subpixel S02B (see FIG. 36C). The subpixel S02R includes a light-emitting module S80R. The subpixel S02G includes a light-emitting module S80G. The subpixel S02B includes a light-emitting module S80B.

For example, the subpixel S02R includes the first light-emitting element S50R and a pixel circuit including a transistor S02t that can supply power to the first light-emitting element S50R (see FIG. 36B). Furthermore, the light-emitting module S80R includes the first light-emitting element S50R and an optical element (e.g., a coloring layer S67R).

The light-emitting element S50R includes a first lower electrode S51R, an upper electrode S52, and a layer S53 containing a light-emitting organic compound between the lower electrode S51R and the upper electrode S52 (see FIG. 36C).

The layer S53 containing a light-emitting organic compound includes a light-emitting unit S53a, a light-emitting unit S53b, and an intermediate layer S54 between the light-emitting units S53a and S53b.

The light-emitting module S80R includes the first coloring layer S67R on the counter substrate S70. The coloring layer transmits light of a specific wavelength and is, for example, a layer that selectively transmits light of red, green, or blue. Alternatively, a region that transmits light emitted from the light-emitting element as it is may be provided.

The light-emitting module S80R, for example, includes the sealant S60 that is in contact with the first light-emitting element S50R and the first coloring layer S67R.

The first coloring layer S67R overlaps the first light-emitting element S50R. Accordingly, part of light emitted from the light-emitting element S50R passes through the sealant S60 serving as an optical adhesive layer and through the first coloring layer S67R and is emitted to the outside of the light-emitting module S80R as indicated by arrows in FIGS. 36B and 36C.

<Display Panel Structure>

The input/output device S00 includes a light-blocking layer S67BM on the counter substrate S70. The light-blocking layer S67BM is provided to surround the coloring layer (e.g., the first coloring layer S67R).

The input/output device S00 includes an anti-reflective layer S67p overlapping the display area S01. As the anti-reflective layer S67p, a circular polarizing plate can be used, for example.

The input/output device S00 includes an insulating film S21. The insulating film S21 covers the transistor S02t. Note that the insulating film S21 can be used as a layer for flattening unevenness caused by the pixel circuit. An insulating film on which a layer that can prevent diffusion of an impurity to the transistor S02t and the like is stacked can be used as the insulating film S21.

The input/output device S00 includes the light-emitting element (e.g., the first light-emitting element S50R) over the insulating film S21.

The input/output device S00 includes, over the insulating film S21, a partition S28 that overlaps an end portion of the first lower electrode S51R (see FIG. 36C). In addition, a spacer S29 that controls the distance between the substrate S10 and the counter substrate S70 is provided on the partition S28.

<Structure of Image Signal Line Driver Circuit>

The image signal line driver circuit S03s(1) includes a transistor S03t and a capacitor S03c. Note that the driver circuit can be formed through the same steps and over the same substrate as the pixel circuit.

<Imaging Pixel Structure>

The imaging pixel S08 includes a photoelectric conversion element S08p and an imaging pixel circuit for sensing light received by the photoelectric conversion element S08p. The imaging pixel circuit includes a transistor S08t.

For example, a PIN photodiode can be used as the photoelectric conversion element S08p.

<Other Structures>

The input/output device S00 includes a wiring S11 through which a signal can be supplied. The wiring S11 is provided with a terminal S19. Note that an FPC(1) through which a signal such as an image signal or a synchronization signal can be supplied is electrically connected to the terminal S19.

Note that a printed wiring board (PWB) may be attached to the FPC(1).

This embodiment can be combined with any of the other embodiments in this specification as appropriate.

(Embodiment 12)

In this embodiment, a structure of a foldable touch panel in which a touch sensor (a contact sensor device) as an input mechanism is provided to overlap with a display unit is described with reference to FIGS. 37A and 37B and FIG. 38.

Figure 37A:
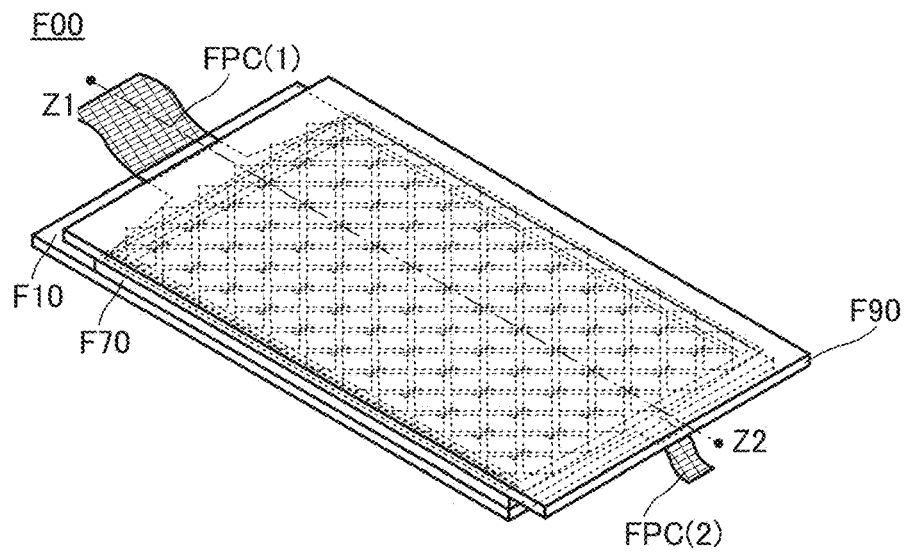
FIGS. 37A and 37B illustrate a structure of a flexible input/output device that can be manufactured using a manufacturing apparatus of one embodiment.

FIG. 37A is a schematic perspective view of a touch panel F00 described as an example in this embodiment. Note that FIGS. 37A and 37B illustrate only main components for simplicity. FIG. 37B is a developed view of the schematic perspective view of the touch panel F00.

Figure 38:
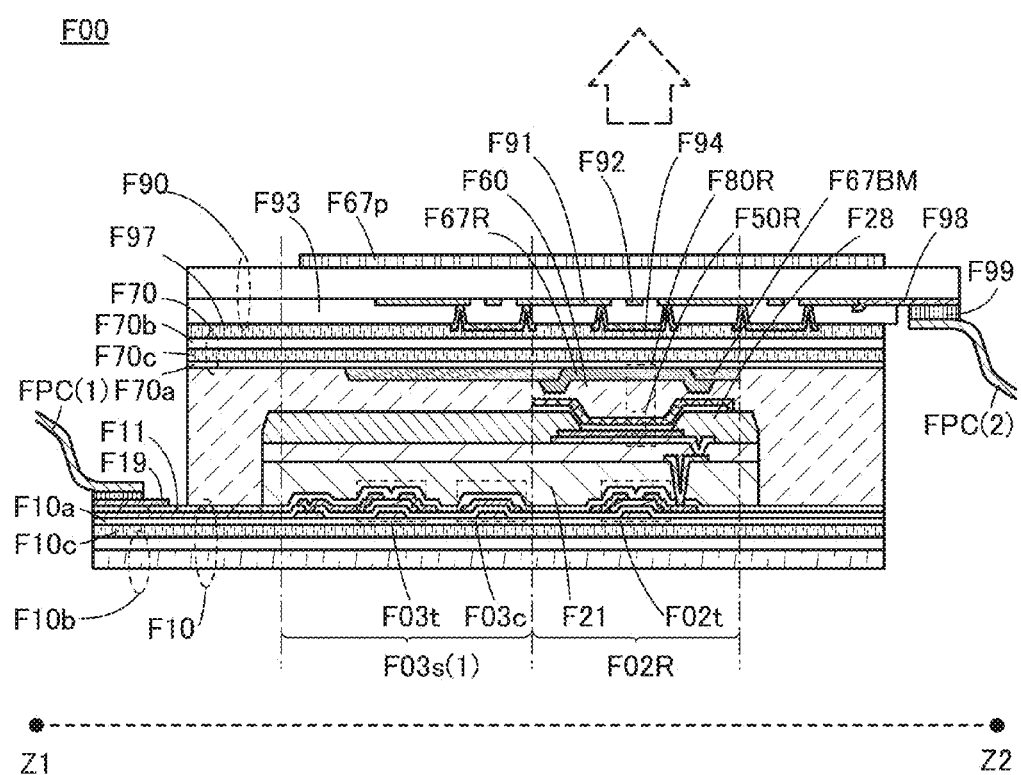
FIG. 38 illustrates a structure of a flexible input/output device that can be manufactured using a manufacturing apparatus of one embodiment.

FIG. 38 is a cross-sectional view of the touch panel F00 taken along line Z1-Z2 in FIG. 37A.

Figure 37B:
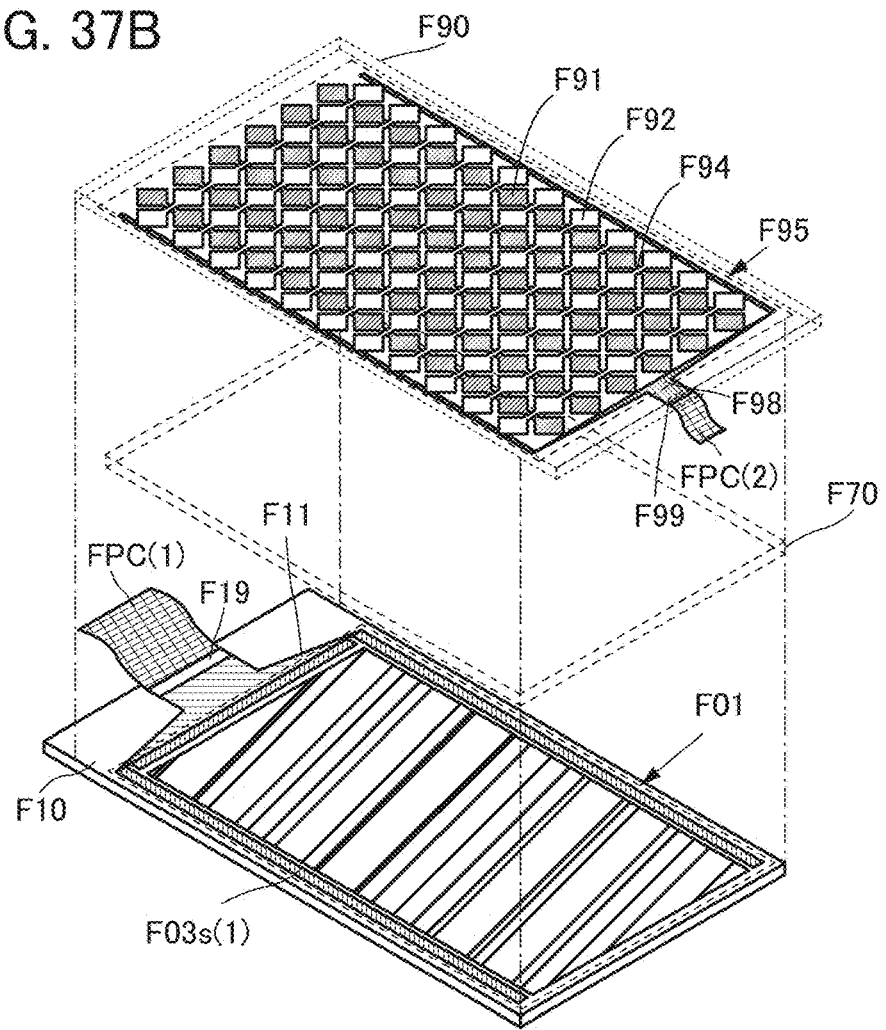

The touch panel F00 includes a display unit F01 and a touch sensor F95 (see FIG. 37B). Furthermore, the touch panel F00 includes a substrate F10, a substrate F70, and a substrate F90. Note that the substrate F10, the substrate F70, and the substrate F90 each have flexibility.

The display unit F01 includes the substrate F10, and over the substrate F10, a plurality of pixels and a plurality of wirings F11 through which signals are supplied to the pixels. The plurality of wirings F11 are led to a peripheral portion of the substrate F10, and some of the plurality of wirings F11 form a terminal F19. The terminal F19 is electrically connected to an FPC (1).

<Touch Sensor>

The substrate F90 includes the touch sensor F95 and a plurality of wirings F98 electrically connected to the touch sensor F95. The plurality of wirings F98 are led to the periphery of the substrate F90, and some of the wirings F98 form part of a terminal for electrical connection to an FPC (2). Note that in FIG. 37B, electrodes, wirings, and the like of the touch sensor F95 that are provided on the back side of the substrate F90 (the side opposite to the viewer side) are indicated by solid lines for clarity.

A capacitive touch sensor is preferably used. Examples of the capacitive touch sensor are a surface capacitive touch sensor and a projected capacitive touch sensor. Examples of the projected capacitive touch sensor are a self-capacitive touch sensor and a mutual capacitive touch sensor, which differ mainly in the driving method. Examples of the projected capacitive touch sensor are a self-capacitive touch sensor and a mutual capacitive touch sensor, which differ mainly in the driving method. The use of a mutual capacitive touch sensor is preferable because multiple points can be sensed simultaneously.

An example of using a projected capacitive touch sensor is described below with reference to FIG. 37B. Note that a variety of sensors that can sense the closeness or the contact of a sensing target such as a finger can be used.

The projected capacitive touch sensor F95 includes electrodes F91 and electrodes F92. The electrodes F91 are electrically connected to any of the plurality of wirings F98, and the electrodes F92 are electrically connected to any of the other wirings F98.

The electrode F92 is in the form of a series of quadrangles arranged in one direction as illustrated in FIGS. 37A and 37B. Each of the electrodes F91 is in the form of a quadrangle. A wiring F94 electrically connects two electrodes F91 arranged in a direction intersecting with the direction in which the electrode F92 extends. The intersecting area of the electrode F92 and the wiring F94 is preferably as small as possible. Such a structure allows a reduction in the area of a region where the electrodes are not provided, so that unevenness in transmittance can be reduced. As a result, unevenness in luminance of light from the touch sensor F95 can be reduced.

Note that the shapes of the electrodes F91 and the electrodes F92 are not limited to the above-mentioned shapes and can be any of a variety of shapes. For example, the plurality of electrodes F91 may be provided so that space between the electrodes F91 are reduced as much as possible, and a plurality of electrodes F92 may be provided with an insulating layer sandwiched between the electrodes F91 and the electrodes F92 and may be spaced apart from each other to form a region not overlapping with the electrodes F91. In that case, a dummy electrode electrically insulated from the electrodes F92 is preferably provided between two adjacent electrodes F92, in which case the area of regions having different transmittances can be reduced.

The structure of the touch sensor F95 is described with reference to FIG. 38.

The touch sensor F95 includes the substrate F90, the electrodes F91 and the electrodes F92 provided in a staggered arrangement on the substrate F90, an insulating layer F93 covering the electrodes F91 and the electrodes F92, and the wiring F94 that electrically connects the adjacent electrodes F91 to each other.

An adhesive layer F97 bonds the substrate F90 to the substrate F70 so that the touch sensor F95 overlaps with the display unit F01

The electrodes F91 and the electrodes F92 are formed using a light-transmitting conductive material. As a light-transmitting conductive material, a conductive oxide such as indium oxide, indium tin oxide, indium zinc oxide, zinc oxide, or zinc oxide to which gallium is added can be used.

The electrodes F91 and the electrodes F92 may be formed by depositing a light-transmitting conductive material on the substrate F90 by a sputtering method and then removing an unnecessary portion by any of known patterning techniques such as photolithography.

The insulating layer F93 covers the electrodes F91 and the electrodes F92. Examples of a material for the insulating layer F93 are a resin such as acrylic or epoxy resin, a resin having a siloxane bond, and an inorganic insulating material such as silicon oxide, silicon oxynitride, or aluminum oxide.

Furthermore, openings reaching the electrodes F91 are formed in the insulating layer F93, and the wiring F94 electrically connects the adjacent electrodes F91. The wiring F94 is preferably formed using a light-transmitting conductive material, in which case the aperture ratio of the touch panel can be increased. Moreover, the wiring F94 is preferably formed using a material that has higher conductivity than those of the electrodes F91 and the electrodes F92.

One electrode F92 extends in one direction, and a plurality of electrodes F92 are provided in the form of stripes.

The wiring F94 intersects with the electrode F92.

Adjacent electrodes F91 are provided with one electrode F92 provided therebetween and are electrically connected by the wiring F94.

Note that the plurality of electrodes F91 are not necessarily arranged in the direction orthogonal to one electrode F92 and may be arranged to intersect with one electrode F92 at an angle of less than 90 degrees.

One wiring F98 is electrically connected to any of the electrodes F91 and F92. Part of the wiring F98 functions as a terminal. For the wiring F98, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer F93 and the wiring F94 may be provided to protect the touch sensor F95.

Furthermore, a connection layer F99 electrically connects the wiring F98 to the FPC (2).

As the connection layer F99, a known anisotropic conductive film (ACF), a known anisotropic conductive paste (ACP), or the like can be used.

The adhesive layer F97 has a light-transmitting property. For example, a thermosetting resin or an ultraviolet curable resin can be used; specifically, a resin such as acrylic, urethane, epoxy resin, or a resin having a siloxane bond can be used.

<Display Unit>

The display unit F01 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

As the display element, for example, in addition to organic electroluminescent elements, any of a variety of display elements such as display elements (electronic ink) that perform display by an electrophoretic method, an electronic liquid powder method, or the like; MEMS shutter display elements; and optical interference type MEMS display elements can be used. Note that a pixel circuit structure suitable for display elements to be used can be selected from known pixel circuit structures.

The substrate F10 is a stacked body in which a flexible substrate F10b, a barrier film F10a that prevents diffusion of unintentional impurities to light-emitting elements, and an adhesive layer F10c that bonds the barrier film F10a to the substrate F10b are stacked.

The substrate F70 is a stacked body in which a flexible substrate F70b, a barrier film F70a that prevents diffusion of unintentional impurities to the light-emitting elements, and an adhesive layer F70c that bonds the barrier film F70a to the substrate F70b are stacked.

A sealant F60 bonds the substrate F70 to the substrate F10. The sealant F60, also serving as an optical adhesive layer, has a refractive index higher than that of air. The pixel circuits and the light-emitting elements (e.g., a first light-emitting element F50R) are provided between the substrate F10 and the substrate F70.

<<Structure of Pixel>>

A pixel includes a sub-pixel F02R, and the sub-pixel F02R includes a light-emitting module F80R.

The sub-pixel F02R includes the first light-emitting element F50R and the pixel circuit including a transistor F02t that can supply electric power to the first light-emitting element F50R. Furthermore, the light-emitting module F80R includes the first light-emitting element F50R and an optical element (e.g., a first coloring layer F67R).

The first light-emitting element F50R includes a lower electrode, an upper electrode, and a layer containing a light-emitting organic compound between the lower electrode and the upper electrode.

The light-emitting module F80R includes the first coloring layer F67R on the substrate F70. The coloring layer transmits light of a particular wavelength and is, for example, a layer that selectively transmits light of red, green, or blue color. A region that transmits light emitted from the light-emitting element as it is may be provided as well.

The light-emitting module F80R includes the sealant F60 that is in contact with the first light-emitting element F50R and the first coloring layer F67R.

The first coloring layer F67R is positioned in a region overlapping with the first light-emitting element F50R. Accordingly, part of light emitted from the first light-emitting element F50R passes through the sealant F60 that also serves as an optical adhesive layer and through the first coloring layer F67R and is emitted to the outside of the light-emitting module F80R as indicated by an arrow in FIG. 38.

<<Structure of Display Unit>>

The display unit F01 includes a light-blocking layer F67BM on the substrate F70. The light-blocking layer F67BM is provided so as to surround the coloring layer (e.g., the first coloring layer F67R).

The display unit F01 includes an anti-reflective layer F67p positioned in a region overlapping with pixels. As the anti-reflective layer F67p, for example, a circular polarizing plate can be used.

The display unit F01 includes an insulating film F21. The insulating film F21 covers the transistor F02t. Note that the insulating film F21 can be used as a layer for planarizing unevenness caused by the pixel circuits. An insulating film on which a layer that can prevent diffusion of impurities to the transistor F02t and the like is stacked can be used as the insulating film F21.

The display unit F01 includes the light-emitting elements (e.g., the first light-emitting element F50R) over the insulating film F21.

The display unit F01 includes, over the insulating film F21, a partition wall F28 that overlaps with an end portion of the first lower electrode. In addition, a spacer that controls the distance between the substrate F10 and the substrate F70 is provided on the partition wall F28

<<Structure of Image Signal Line Driver Circuit>>

The image signal line driver circuit F03s(1) includes a transistor F03t and a capacitor F03c. Note that the driver circuit can be formed in the same process and over the same substrate as those of the pixel circuits.

<<Other Structures>>

The display unit F01 includes the wirings F11 through which signals can be supplied. The wirings F11 are provided with the terminal F19. Note that the FPC (1) through which a signal such as an image signal or a synchronization signal can be supplied is electrically connected to the terminal F19.

Note that a printed wiring board (PWB) may be attached to the FPC (1).

This embodiment can be combined with any of the other embodiments in this specification as appropriate.

This application is based on Japanese Patent Application serial no. 2013-179700 filed with Japan Patent Office on Aug. 30, 2013, and Japanese Patent Application serial no. 2014-029405 filed with Japan Patent Office on Feb. 19, 2014, the entire contents of which are hereby incorporated by reference.

What is claimed is:

1. A manufacturing apparatus comprising:
a first suction pad;
a second suction pad;
a slit formation portion with a cutter;
a peeling portion with a third suction pad; and
a table,
wherein the first suction pad is configured to transfer a support and a separator in contact with a first surface of the support to the slit formation portion while the first suction pad supports a second surface of the support, and to place the support and the separator at the table,
wherein the second suction pad is configured to transfer the support and the separator between the slit formation portion and the peeling portion while the second suction pad supports the second surface of the support,
wherein a slit which does not pass through the separator is formed at an end portion of the support with the cutter in the slit formation portion, and
wherein the third suction pad is configured to hold the separator, and then to peel the separator from the support.

2. The manufacturing apparatus according to claim 1, wherein the table is configured to rotate in the slit formation portion.

3. The manufacturing apparatus according to claim 1, further comprising a pretreatment portion comprising:
a first pretreatment mechanism which irradiates the first surface of the support with an ultrasonic wave and suctions an atmosphere while blowing compressed air; or
a second pretreatment mechanism which irradiates the first surface of the support with an ultraviolet ray.

4. The manufacturing apparatus according to claim 1, further comprising a pretreatment portion comprising:
a first pretreatment mechanism which irradiates the first surface of the support with an ultrasonic wave and suctions an atmosphere while blowing compressed air; and
a second pretreatment mechanism which irradiates the first surface of the support with an ultraviolet ray.

5. The manufacturing apparatus according to claim 1, further comprising a sheet supply portion comprising:
a tray in which a stacked film including the support and the separator is stored;
a multi-feed prevention mechanism which blows a gas to an end portion of the stacked film picked up by the first suction pad from the tray; and
a multi-feed detection mechanism which detects whether the stacked film picked up by the first transfer mechanism is one.

6. The manufacturing apparatus according to claim 1, further comprising a sheet supply portion comprising:
an unwinding mechanism which unwinds a stacked film including the support and the separator in a rolled state and supplies the stacked film;
a cutting mechanism which cuts the stacked film into a sheet-like stacked film with a predetermined size; and
a tray in which the sheet-like stacked film is stored.

7. A manufacturing apparatus comprising:
a first suction pad;
a second suction pad;
a slit formation portion with a cutter;
a peeling portion with a third suction pad; and
a table,
wherein the first suction pad is configured to transfer a support and a separator in contact with a first surface of the support to the slit formation portion while the first suction pad supports a second surface of the support, and to place the support and the separator at the table,
wherein the second suction pad is configured to transfer the support and the separator between the slit formation portion and the peeling portion while the second suction pad supports the second surface of the support,
wherein a slit which does not pass through the separator is formed at an end portion of the support with the cutter in the slit formation portion, and
wherein the third suction pad is configured to hold and to twist the separator, and then to peel the separator from the support.

8. The manufacturing apparatus according to claim 7, wherein the table is configured to rotate in the slit formation portion.

9. The manufacturing apparatus according to claim 7, further comprising a pretreatment portion comprising:
a first pretreatment mechanism which irradiates the first surface of the support with an ultrasonic wave and suctions an atmosphere while blowing compressed air; or
a second pretreatment mechanism which irradiates the first surface of the support with an ultraviolet ray.

10. The manufacturing apparatus according to claim 7, further comprising a pretreatment portion comprising:
a first pretreatment mechanism which irradiates the first surface of the support with an ultrasonic wave and suctions an atmosphere while blowing compressed air; and
a second pretreatment mechanism which irradiates the first surface of the support with an ultraviolet ray.

11. The manufacturing apparatus according to claim 7, further comprising a sheet supply portion comprising:
a tray in which a stacked film including the support and the separator is stored;
a multi-feed prevention mechanism which blows a gas to an end portion of the stacked film picked up by the first suction pad from the tray; and
a multi-feed detection mechanism which detects whether the stacked film picked up by the first suction pad is one.

12. The manufacturing apparatus according to claim 7, further comprising a sheet supply portion comprising:
- an unwinding mechanism which unwinds a stacked film including the support and the separator in a rolled state and supplies the stacked film;
- a cutting mechanism which cuts the stacked film into a sheet-like stacked film with a predetermined size; and
- a tray in which the sheet-like stacked film is stored.

13. A method for supplying a support comprising the steps of:
- transferring a support and a separator in contact with a first surface of the support to a slit formation portion with a cutter by a first suction pad while the first suction pad supports a second surface of the support, and placing the support and the separator at a table;
- forming a slit which does not pass through the separator on the support by the cutter;
- transferring the support and the separator from the slit formation portion to a peeling portion by a second suction pad while the second suction pad supports the second surface of the support, and
- holding the separator, and then peeling the separator from the support by a third suction pad.

14. The method for supplying the support according to claim 13, wherein the table rotates in the slit formation portion before the step of forming the slit.

15. The method for supplying the support according to claim 13, further comprising the steps of:
- irradiating the first surface of the support with an ultrasonic wave and suctioning an atmosphere while blowing compressed air; or
- irradiating the first surface of the support with an ultraviolet ray.

16. The method for supplying the support according to claim 13, further comprising the steps of:
- irradiating the first surface of the support with an ultrasonic wave and suctioning an atmosphere while blowing compressed air; and
- irradiating the first surface of the support with an ultraviolet ray.

17. A semiconductor device comprising the support supplied by the method for supplying the support according to claim 13.

18. A light emitting device comprising the support supplied by the method for supplying the support according to claim 13.

19. A display device comprising the support supplied by the method for supplying the support according to claim 13.

* * * * *